(12) United States Patent
Seo et al.

(10) Patent No.: US 11,856,773 B2
(45) Date of Patent: Dec. 26, 2023

(54) SEMICONDUCTOR DEVICE

(71) Applicant: Samsung Electronics Co., Ltd., Suwon-si (KR)

(72) Inventors: Yujin Seo, Daejeon (KR); Euntaek Jung, Seongnam-si (KR); Byoungil Lee, Hwaseong-si (KR); Seul Lee, Seoul (KR); Joonhee Lee, Seongnam-si (KR); Changdae Jung, Suwon-si (KR); Bonghyun Choi, Yongin-si (KR); Sejie Takaki, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 17/176,398

(22) Filed: Feb. 16, 2021

(65) Prior Publication Data
US 2021/0375920 A1   Dec. 2, 2021

(30) Foreign Application Priority Data

May 28, 2020   (KR) ........................ 10-2020-0064082

(51) Int. Cl.
| | |
|---|---|
| *H01L 27/11582* | (2017.01) |
| *H10B 43/27* | (2023.01) |
| *H10B 41/10* | (2023.01) |
| *H10B 41/27* | (2023.01) |
| *H10B 41/40* | (2023.01) |
| *H10B 43/10* | (2023.01) |
| *H10B 43/40* | (2023.01) |

(52) U.S. Cl.
CPC ............ *H10B 43/27* (2023.02); *H10B 41/10* (2023.02); *H10B 41/27* (2023.02); *H10B 41/40* (2023.02); *H10B 43/10* (2023.02); *H10B 43/40* (2023.02)

(58) Field of Classification Search
CPC ................................ H10B 43/27; H10B 43/20
See application file for complete search history.

(56) References Cited

U.S. PATENT DOCUMENTS

| | | | |
|---|---|---|---|
| 9,716,099 B2 | 7/2017 | Choi | |
| 10,062,707 B2 | 8/2018 | Lee | |
| 10,283,647 B2 | 5/2019 | Matsuo et al. | |
| 10,490,564 B2 | 11/2019 | Mushiga et al. | |
| 10,510,770 B2 | 12/2019 | Harada et al. | |

(Continued)

*Primary Examiner* — Christopher A Johnson
(74) *Attorney, Agent, or Firm* — Muir Patent Law, PLLC

(57) ABSTRACT

A semiconductor device includes a pattern structure; a stack structure including gate and interlayer insulating layers on the pattern structure; and vertical structures penetrating through the stack structure, contacting the pattern structure. The pattern structure includes a lower pattern layer, an intermediate pattern layer, and an upper pattern layer sequentially stacked, the vertical structures including a vertical memory structure penetrating through the upper pattern and intermediate pattern layers and extending into the lower pattern layer, the intermediate pattern layer including a first portion, a second portion extending from the first portion and having a decreased thickness, and a third portion extending from the first portion, having an increased thickness, and contacting the vertical memory structure. The second portion of the intermediate pattern layer has a side surface that is lowered while forming a surface curved from an upper surface of the first portion and that contacts the upper pattern layer.

20 Claims, 43 Drawing Sheets

(56) References Cited

U.S. PATENT DOCUMENTS

| | | |
|---|---|---|
| 2012/0119287 A1 | 5/2012 | Park et al. |
| 2018/0040742 A1* | 2/2018 | Matsuo .................. H10B 43/35 |
| 2019/0244970 A1 | 8/2019 | Jung et al. |
| 2019/0333922 A1* | 10/2019 | Jung ....................... H10B 41/27 |
| 2019/0333931 A1 | 10/2019 | Jung et al. |
| 2019/0393238 A1 | 12/2019 | Lim et al. |
| 2020/0295033 A1* | 9/2020 | Sakamoto .............. H10B 41/35 |
| 2021/0265380 A1* | 8/2021 | Obu .................. H01L 29/41741 |

* cited by examiner

SEMICONDUCTOR DEVICE

CROSS-REFERENCE TO RELATED APPLICATION(S)

This application claims the benefit under 35 U.S.C. § 119 of Korean Patent Application No. 10-2020-0064082, filed on May 28, 2020, in the Korean Intellectual Property Office, the entire disclosure of which is incorporated herein by reference for all purposes.

BACKGROUND

1. Field

The present inventive concept relates to a semiconductor device.

2. Description of Related Art

As demand for high performance, high speed, and/or multifunctionality of semiconductor devices increases, the degree of integration of semiconductor devices is increasing. To increase the degree of integration of semiconductor devices, a method of disposing gates in a vertical direction has been proposed instead of disposing gates on a two-dimensional plane.

SUMMARY

Example embodiments provide a semiconductor device in which integration may be improved.

Example embodiments provide a semiconductor device in which reliability may be secured.

According to example embodiments, a semiconductor device includes a pattern structure; a stack structure on the pattern structure, the stack structure including gate layers and interlayer insulating layers alternately stacked in a vertical direction; and a plurality of vertical structures penetrating through the stack structure in the vertical direction and in contact with the pattern structure. The pattern structure includes a lower pattern layer, an intermediate pattern layer on the lower pattern layer, and an upper pattern layer on the intermediate pattern layer, the plurality of vertical structures include a vertical memory structure penetrating through the upper pattern layer and the intermediate pattern layer and extending into the lower pattern layer, the intermediate pattern layer includes a first portion, a second portion extending from the first portion and having a decreased thickness, and a third portion extending from the first portion, having an increased thickness and contacting the vertical memory structure, and the second portion of the intermediate pattern layer has a side surface that is lowered while forming a surface curved from an upper surface of the first portion and that contacts the upper pattern layer.

According to example embodiments, a semiconductor device includes a pattern structure; a stack structure on the pattern structure, the stack structure including gate layers and interlayer insulating layers alternately stacked ire a vertical direction; and a plurality of vertical structures penetrating through the stack structure in the vertical direction and in contact with the pattern structure. The pattern structure includes a lower pattern layer; an upper pattern layer on the lower pattern layer; and an intermediate structure and an intermediate pattern layer spaced apart from each other and including different materials, the intermediate structure and the intermediate pattern layer being between the lower pattern layer and the upper pattern layer. The intermediate structure includes a first intermediate layer and a second intermediate layer. The first intermediate layer includes a lower portion between a lower surface of the second intermediate layer and the lower pattern layer; an upper portion between an upper surface of the second intermediate layer and the upper pattern layer; and a side portion between a first side surface of the second intermediate layer and the upper pattern layer. The second intermediate layer includes a material different from a material of the first intermediate layer, and a maximum width of the side portion of the first intermediate layer in a horizontal direction is greater than a thickness of the lower portion of the first intermediate layer in the vertical direction.

According to example embodiments, a semiconductor device includes a pattern structure; an insulating layer on a side surface of the pattern structure; a stack structure on the pattern structure, the stack structure including gate layers and interlayer insulating layers alternately stacked in a vertical direction; separation structures penetrating through the stack structure; and a plurality of vertical structures, penetrating through the stack structure in the vertical direction, and in contact with the pattern structure, between the separation structures. The pattern structure includes a lower pattern layer; an upper pattern layer on the lower pattern layer; and an intermediate structure and an intermediate pattern layer spaced apart from each other and including different materials, the intermediate structure and the intermediate pattern layer being between the lower pattern layer and the upper pattern layer. The intermediate structure has a first side surface contacting the upper pattern layer and a second side surface contacting the insulating layer, and on the intermediate structure, the first side surface and the second side surface have an asymmetrical structure.

BRIEF DESCRIPTION OF DRAWINGS

The above and other aspects, features, and advantages of the present inventive concept will be more clearly understood from the following detailed description, taken in conjunction with the accompanying drawings, in which like numbers refer to like elements throughout. In the drawings.

DETAILED DESCRIPTION

Figure 1:
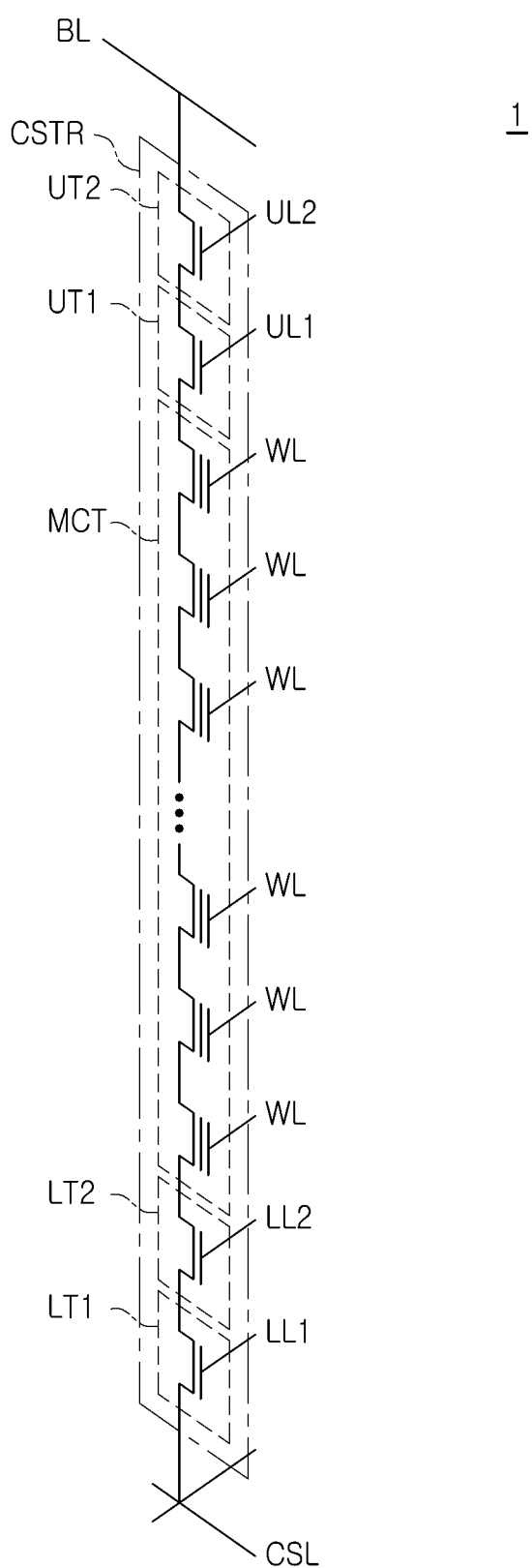
FIG. 1 is a schematic circuit diagram of an example of a semiconductor device, according to an example embodiment.

FIG. 1 is a schematic circuit diagram illustrating an example of a semiconductor device, according to an example embodiment.

Referring to FIG. 1, a semiconductor device 1 according to an example embodiment may include a bit line BL, a common source line CSL, word lines WL, upper gate lines UL1 and UL2, lower gate lines LL1 and LL2, and a cell string CSTR between the bit line BL and the common source line CSL.

The cell string CSTR includes one or a plurality of lower transistors LT1 and LT2 adjacent to the common source line CSL, one or a plurality of upper transistors UT1 and UT2 adjacent to the bit line and a plurality of memory cell transistors MCT disposed between the one or the plurality of lower transistors LT1 and LT2 and the one or the plurality of upper transistors UT1 and UT2.

The one or the plurality of lower transistors LT1 and LT2, the plurality of memory cell transistors MCT, and the one or the plurality of upper transistors UT1 and UT2 may be connected in series.

In an example, the one or the plurality of upper transistors UT1 and UT2 may include a string select transistor, and the one or the plurality of lower transistors LT1 and LT2 may include a ground select transistor.

In an example, the one or the plurality of lower transistors LT1 and LT2 may be provided as a plurality, and the plurality of lower transistors LT1 and LT2 may include a lower erase control transistor LT1 and a ground select transistor LT2 connected in series. The ground select transistor LT2 may be disposed on the lower erase control transistor LT1.

In an example, the one or the plurality of upper transistors UT1 and UT2 may be provided as a plurality, and the plurality of upper transistors UT1 and UT2 may include a string select transistor UT1 and an upper erase control transistor UT2 connected in series. The upper erase control transistor UT2 may be disposed on the string select transistor UT1.

The lower gate lines LL1 and LL2 may include a first lower gate line LL1 and a second lower gate line LL2, and the upper gate lines UL1 and UL2 may include a first upper gate line UL1 and a second upper gate line UL2.

The first lower gate line LL1 may be a gate electrode of the lower erase control transistor LT1, and the second lower gate line LL2 may be a gate electrode of the ground select transistor LT2. The word lines WL may be gate electrodes of the memory cell transistors MCT. The first upper gate line UL1 may be a gate electrode of the string select transistor UT1, and the second upper gate line UL2 may be a gate electrode of the upper erase control transistor UT2.

An erase operation for erasing data stored in the memory cell transistors IDICT may use a Gate Induced Drain Leakage (GIDL) phenomenon occurring in the lower and upper erase control transistors LT1 and UT2. For example, holes generated by a Gate Induced Drain Leakage (GIDL) phenomenon in the lower and upper erase control transistors LT1 and UT2 may be injected into a channel of the memory cell transistors MCT, and the data of the memory cell transistors MCT may be erased by the holes injected into the channel of the cell transistors MCT. For example, holes injected into the channel of the memory cell transistors MCT may enable electrons trapped in a data storage layer of the memory cell transistors MCT to escape to the channel of the memory cell transistors MCT.

Next, an example of a semiconductor device according to an example embodiment will be described with reference to FIGS. 2A to 13.

Figure 2A:
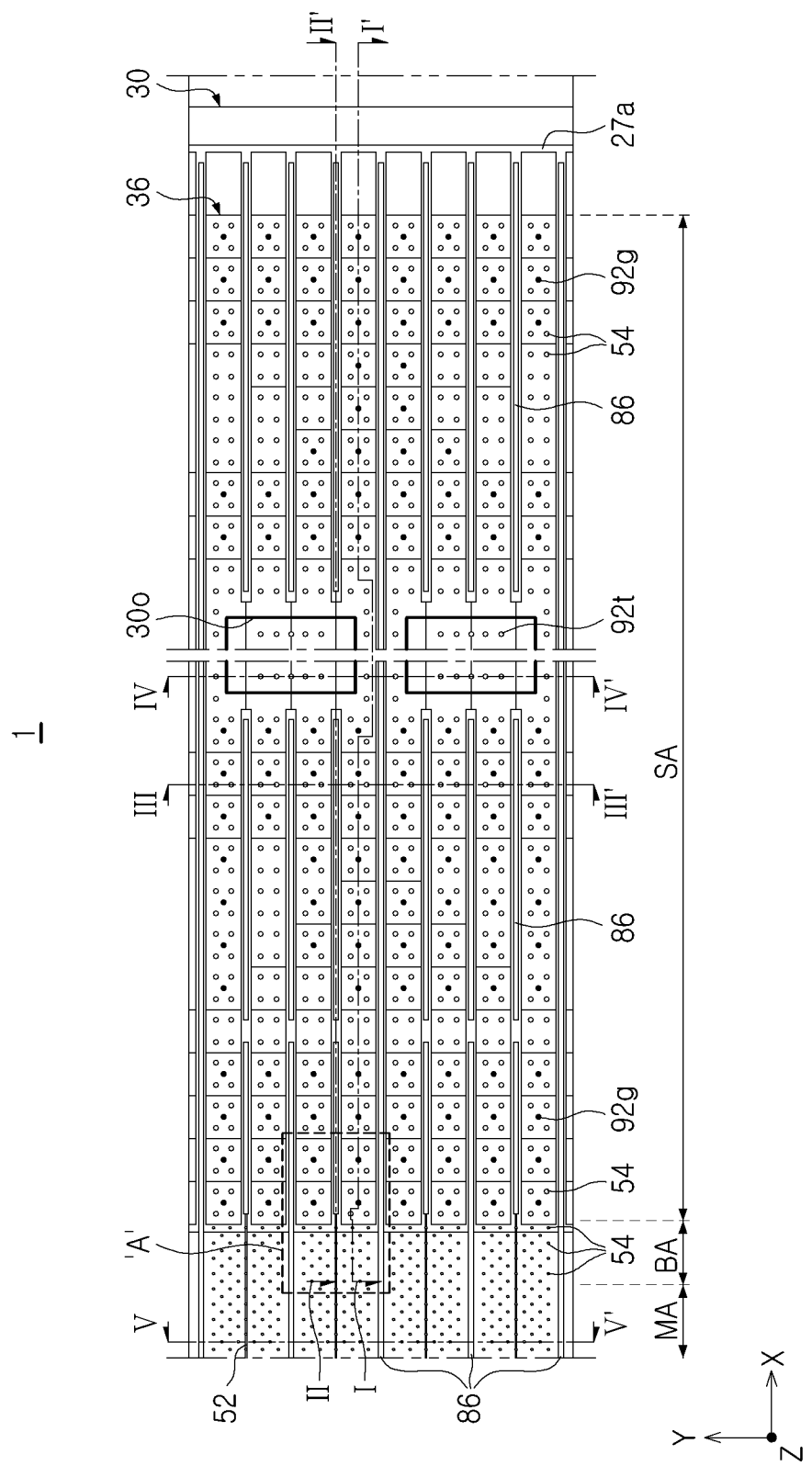
FIGS. 2A-2B, 3-4, 5A-5B, 6, 7A-7C, and 8-13 are diagrams illustrating an example of a semiconductor device, according to an example embodiment.

First, with reference to FIGS. 2A, 2B and 3, a planar structure of a semiconductor device according to an example embodiment will be described. FIG. 2A is a conceptual plan view illustrating an example of a semiconductor device according to an example embodiment, FIG. 2B is a conceptual plan view illustrating some components of FIG. 2A, and FIG. 3 is a partially enlarged view of portion 'A' in FIG. 2A.

Figure 2B:
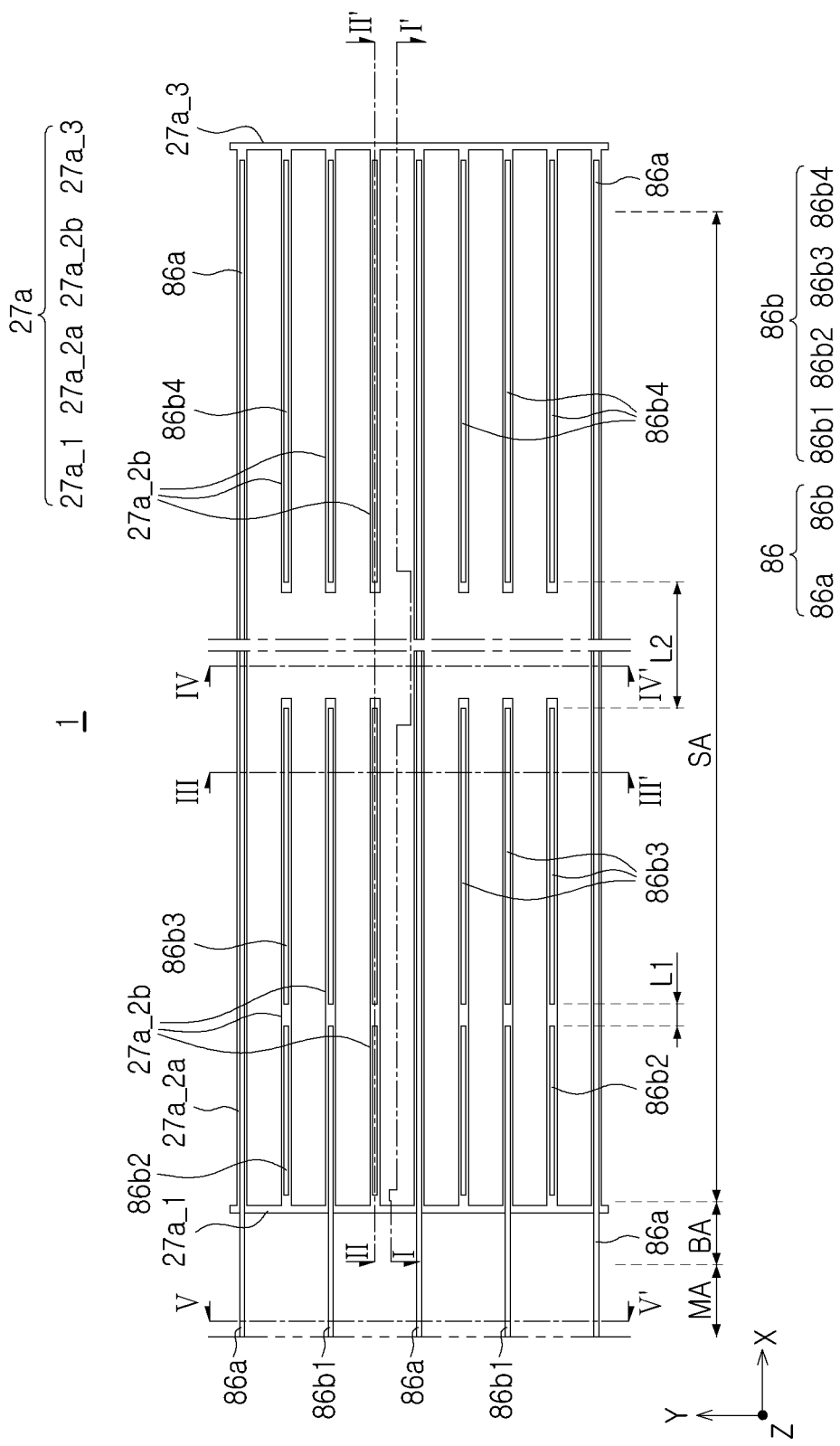
Figure 3:
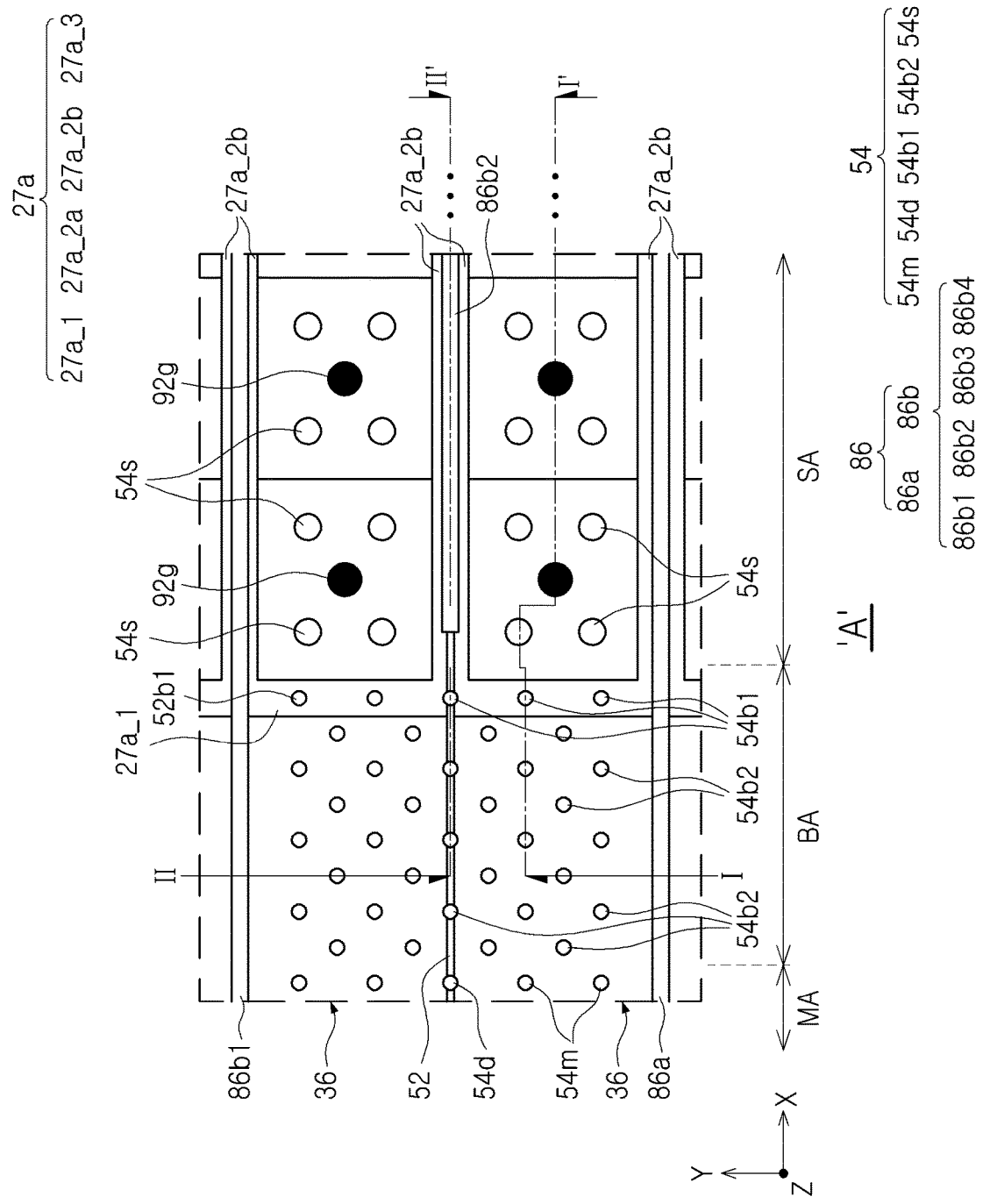

Referring to FIGS. 2A, 2B and 3, the semiconductor device 1 according to an example embodiment may include a pattern structure 30, a stack structure 36, a plurality of separation structures 86, and a plurality of vertical structures 54, gate contact plugs 92g, and peripheral contact plugs 92t.

The semiconductor device 1 according to an example embodiment may further include a memory cell array area MA, a step area SA, and a buffer area BA between the memory cell array area MA and the step area SA.

In an example, the pattern structure 30 may have an opening 30o. The opening 30o may be disposed in the step area SA.

The stack structure 36 may overlap the memory cell array area MA, the buffer area BA, and the step area SA in a vertical direction Z. The pattern structure 30 overlaps the stack structure 36 in the vertical direction Z, and may extend outwardly from an end of the stack structure 36 in a first horizontal direction X.

The plurality of separation structures 86 may include main separation structures 86a and auxiliary separation structures 86b.

Each of the main separation structures 86a may have a linear shape extending in the first horizontal direction X. The main separation structures 86a may traverse the memory cell array area MA, the buffer area BA, and the step area SA, while dividing the stack structure 36 in a second horizontal direction Y, perpendicular to the first horizontal direction X.

The auxiliary separation structures 86b may be disposed between a pair of the main separation structures 86a adjacent to each other. Hereinafter, the auxiliary separation structures 86b between the pair of main separation structures 86a adjacent to each other will be mainly described.

The auxiliary separation structures 86b may include a first auxiliary separation structure 86b1, second auxiliary separation structures 86b2, third auxiliary separation structures 86b3, and fourth auxiliary separation structures 86b4.

The first auxiliary separation structure 86b1 may extend into a portion of the step area SA while traversing the memory cell array area MA and the buffer area BA.

The semiconductor device 1 according to an example embodiment may further include insulating patterns 52 traversing the memory cell array area MA and the buffer area BA, on both sides of the first auxiliary separation structure 86b1.

The second auxiliary separation structures 86b2 may have ends in contact with ends of the insulating patterns 52, on both sides of the first auxiliary separation structures 86b1.

The third auxiliary separation structures 86b3 may be disposed in the step area SA, and may have first end portions facing the first and second auxiliary separation structures 86b1 and 86b2, and second end portions facing the opening 30o.

The fourth auxiliary separation structures 86b4 may include a portion disposed in the step area SA and a portion extending from the step area SA.

The fourth auxiliary separation structures 86b4 may have third end portions facing the opening 30o and disposed in the step area SA, and fourth end portions outside of the step area SA.

Throughout the specification, terms such as "first". "second", and "third" may be used to distinguish one component from other components, and may be substituted for other terms within the scope of the present inventive concept. For example, the first auxiliary separation structure 86b1 may be referred to as a second auxiliary separation structure, and the second auxiliary separation structure 86b2 may be referred to as a first auxiliary separation structure.

The pattern structure 30 may include a first upper pattern portion 27a. The first upper pattern portion 27a may include a first line portion 27a_1 extending in the second horizontal direction Y, and a plurality of second line portions 27a_2a and 27a_2b extending from the first line portion 27a_1 in the first horizontal direction X.

In an example, the first line portion 27a_1 may be disposed in the buffer area BA.

In an example, the first upper pattern portion 27a may further include a third line portion 27a_3 disposed outside the stack structure 36 and extending in the second horizontal direction Y. The first line portion 27a_1 and the third line portion 27a_3 may be parallel to each other.

In an example, the plurality of second line portions 27a_2a and 27a_2b may extend from the first line portion 27a_1 to the third line portion 27a_3.

In an example, the plurality of second line portions 27a2a and 27a_2b may be parallel to each other.

In an example, the plurality of second line portions 27a_2a and 27a_2b parallel to each other may extend continuously from the first line portion 27a_1 to the third line portion 27a_3, and may include first portions 27a_2a overlapping the main separation structures 86a, and second portions 27a_2b which are disposed between the first line portion 27a_1 and the third line portion 27a_3, have at least one portion which is disconnected, and overlap the auxiliary separation structures 86b.

In an example, the first upper pattern portion 27a may be spaced apart from the opening 30o.

The plurality of separation structures 86 may penetrate through the first upper pattern portion 27a. For example, when viewed in a plan view as illustrated in FIG. 2B, each of the second to fourth auxiliary separation structures 86b2, 86b3, and 86b4 disposed in the step area SA may be surrounded by the plurality of second line portions 27a_2a and 27a_2b of the first upper pattern portion 27a. For example, an entire side surface of any one of the second to fourth auxiliary separation structures 86b2, 86b3, and 86b4 may have a shape surrounded by one of the plurality of second line portions 27a_2a and 27a_2b.

The main separation structures 86a and the first auxiliary separation structures 86b1 may extend in the first horizontal direction X in the memory cell array area MA, and may traverse the first line portion 27a_1 in the buffer area BA, and may extend into the second line portions 27a_2a and 27a_2b.

The plurality of vertical structures 54 may be spaced apart from the plurality of separation structures 86.

The plurality of vertical structures 54 may include vertical memory structures 54m, vertical dummy structures 54d, first vertical buffer structures 54b1, second vertical buffer structures 54b2, and vertical support structures 54s.

The vertical memory structures 54m may be disposed in the memory cell array area MA and spaced apart from the insulating pattern 52.

The vertical dummy structures 54d may be disposed in the memory cell array area MA and contact the insulating pattern 52.

The first vertical buffer structures 54b1 may contact the first upper pattern portion 27a in the buffer area BA.

The second vertical buffer structures 54b2 may be spaced apart from the second upper pattern portion 27a in the buffer area BA.

The vertical support structures 54s may be disposed in the step area SA.

In an example, the vertical memory structures 54m, the vertical dummy structures 54d, the first vertical buffer structures 54b1, and the second vertical buffer structures 54b2 disposed in the memory cell array area MA and the buffer area BA may have substantially the same width or diameter.

In an example, each of the vertical support structures 54s may have a wider width or a greater diameter than each of the vertical memory structures 54m.

In an example, vertical structures 54, disposed in the memory cell array area MA and the buffer area BA, for example, the arrangement density of the vertical memory structures 54m, the vertical dummy structures 54d, the first vertical buffer structures 54b1, and the second vertical buffer structures 54b2, may be higher than that of the vertical support structures 54s disposed in the step area SA.

Figure 4:
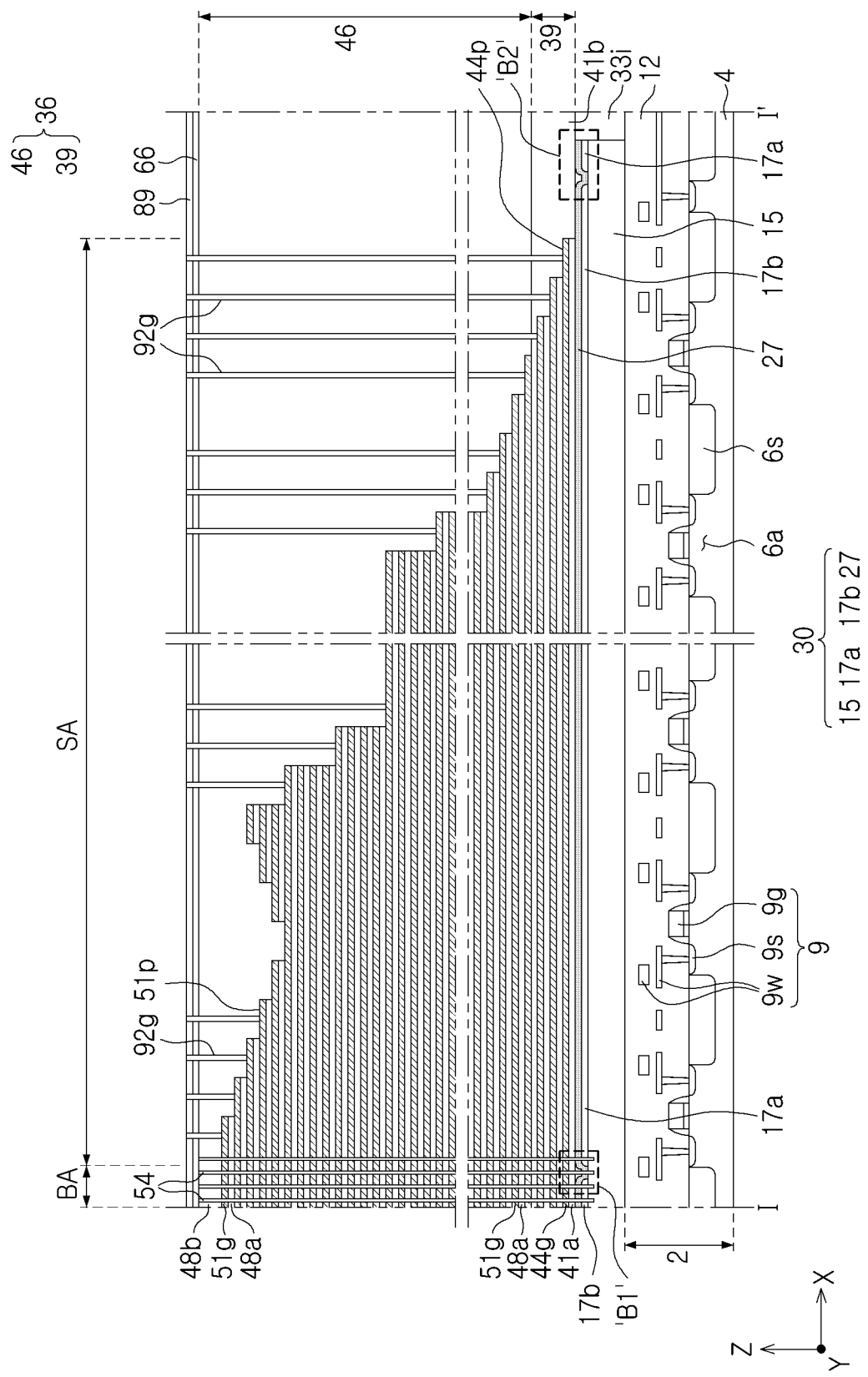

Next, a cross-sectional structure of a region taken along line I-I' in FIG. 2A will be described with reference to FIG. 4. FIG. 4 is a cross-sectional view illustrating a region taken along line I-I' of FIG. 2A.

Referring to FIGS. 2A and 4, the semiconductor device 1 according to an example embodiment may further include a lower structure 2. The lower structure 2 may include a substrate 4 and a peripheral circuit 9 and a lower insulating layer 12 formed on the substrate 4.

The substrate 4 may be a semiconductor substrate. For example, the substrate 4 may be a silicon substrate. The peripheral circuit 9 may be a circuit for operation of a memory cell array of a memory element such as a flash memory or a variable resistance memory. The peripheral circuit 9 may include a peripheral transistor including a peripheral gate 9g and a peripheral source/drain 9s, and a peripheral wiring 9w. The peripheral gate 9g may be formed on an active region 6a defined by an isolation layer 6s formed in the substrate 4. The peripheral source/drain 9s may be formed in the active region 6a on both sides of the peripheral gate 9g. The lower insulating layer 12 may cover the peripheral circuit 9.

The pattern structure 30 illustrated in FIG. 2A and described above may be disposed on the lower structure 2. The pattern structure 30 includes a lower pattern layer 15, an upper pattern layer 27 on the lower pattern layer 15, and an intermediate pattern layer 17b between the lower pattern layer 15 and the upper pattern layer 27.

In an example, the pattern structure 30 may further include an intermediate structure 17a between the lower pattern layer 15 and the upper pattern layer 27.

The intermediate pattern layer 17b and the intermediate structure 17a may include different materials and may be spaced apart from each other. For example, in a first area, the pattern structure 30 may include the lower pattern layer 15, the intermediate structure 17 b, and the upper pattern layer 27 sequentially stacked in the vertical direction Z, and in a second area, the pattern structure 30 may include the lower pattern layer 15, the intermediate structure 17a, and the upper pattern layer 27 sequentially stacked in the vertical direction Z.

Figure 5A:
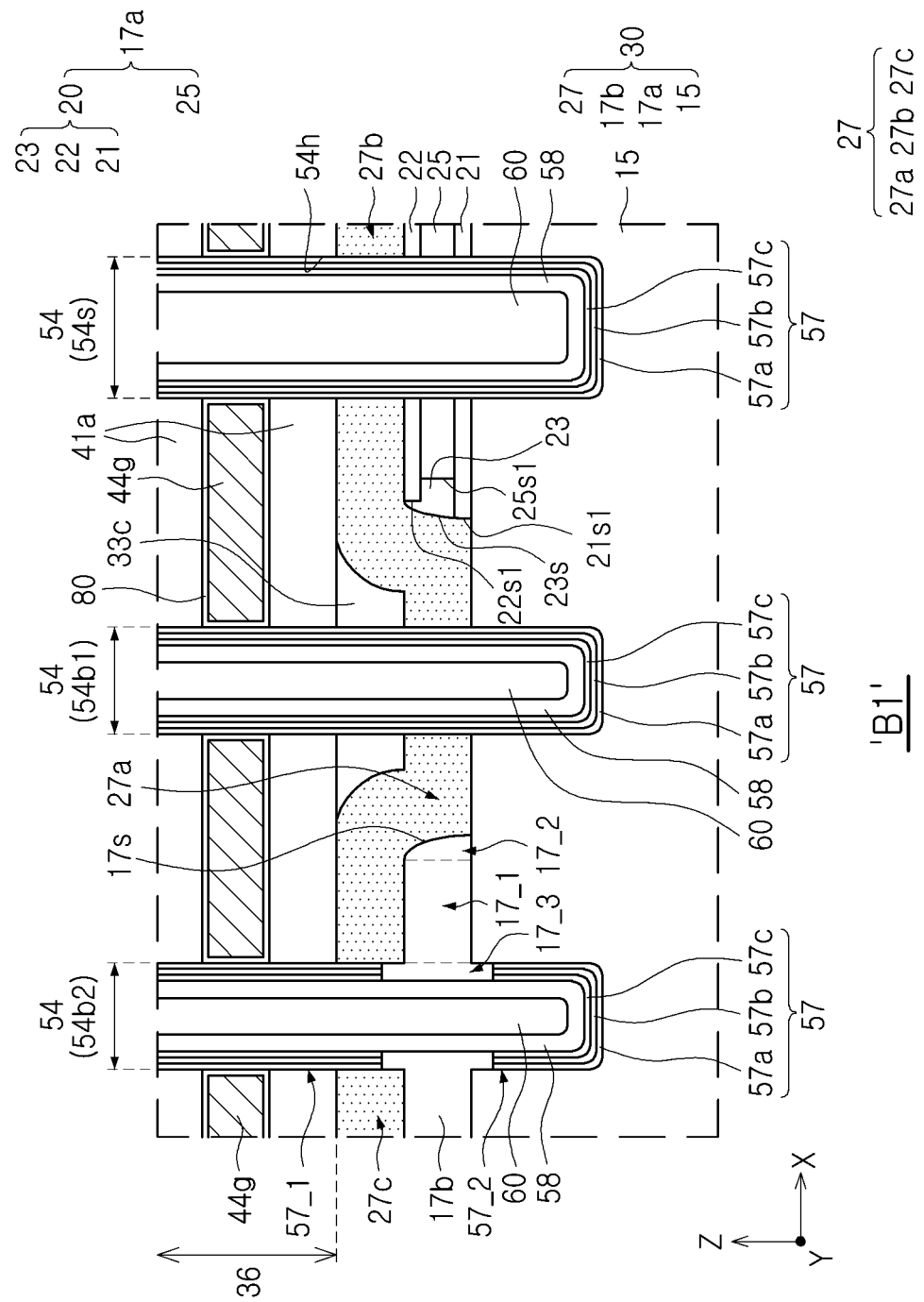
Figure 5B:
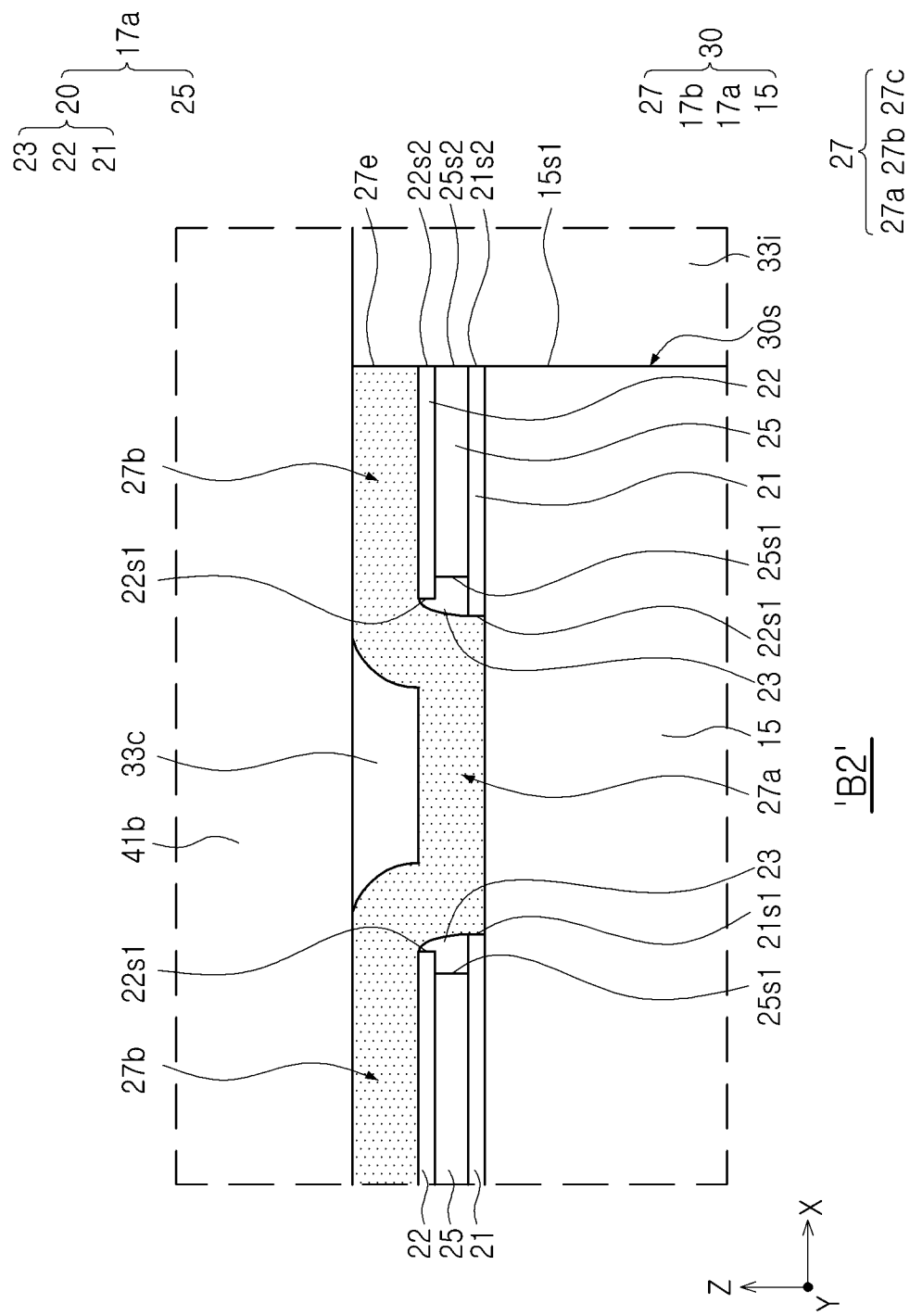

Referring to FIGS. 5A and 5B, the upper pattern layer 27 may include the first upper pattern portion 27a described above with reference to FIGS. 2A, 2B, and 3. In the upper pattern layer 27, the first upper pattern portion 27a may be a portion in contact with the lower pattern layer 15. In the upper pattern layer 27, a portion in contact with the intermediate structure 17a may be referred to as a second upper pattern portion 27b, and a portion in contact with the intermediate pattern layer 17b may be referred to as a third upper pattern portion 27c.

The semiconductor device 1 according to an example embodiment may further include an intermediate insulating layer 33i on an outer side surface 30s of the pattern structure 30, and a capping insulating layer 33c covering a recessed portion of an upper surface of the pattern structure 30. For example, the capping insulating layer 33c may overlap the first upper pattern portion 27a in the vertical direction Z, and may contact an upper surface of the first upper pattern portion 27a.

The stack structure 36 illustrated in FIGS. 2A and 3 and described above may be disposed on the pattern structure 30.

The stack structure 36 may include a lower stack structure 39 and an upper stack structure 46 on the lower stack structure 39.

The lower stack structure 39 may include first lower interlayer insulating layers 41a and lower horizontal layers 442 alternately and repeatedly stacked in the vertical direction Z. The lower horizontal layers 44g may include lower pads 44p arranged in a staircase shape in the step area SA. The lower stack structure 39 may further include a second lower interlayer insulating layer 41b covering the first lower interlayer insulating layers 41a and the lower horizontal layers 44g. The second lower interlayer insulating layer 41b may have a substantially flat upper surface.

The upper stack structure 46 may include first upper interlayer insulating layers 48a and upper horizontal layers 51g alternately repeatedly stacked in the vertical direction Z. The upper horizontal layers 51g may include upper pads 51p arranged in a staircase shape in the step area SA. The upper stack structure 46 may further include a second upper interlayer insulating layer 48b covering the first upper interlayer insulating layers 48a and the upper horizontal layers 51g. The second upper interlayer insulating layer 48h may have a substantially flat upper surface.

Within the step area SA, the lower and upper pads 44p and 51p may be defined as portions of the horizontal layers of which upper surfaces are not covered by other horizontal layers, among the horizontal layers 44g and 51g. For example, among the lower and upper pads 44p and 51p, any one pad may be defined as a portion of one horizontal layer, and an upper surface of a pad of one horizontal layer may not be covered by another horizontal layer.

In example embodiments, the technical idea of the present inventive concept is not limited to the staircase shape in which the lower and upper pads 44p and 51p are arranged in the drawing, and may include a stepped shape that may be variously modified.

In example embodiments, the stack structure 36 is not limited to including the lower stack structure 39 and the upper stack structure 46, and may be variously modified. For example, in the stack structure 36, the lower stack structure 39 may be omitted. In another example, the stack structure 36 may further include another upper stack structure that is disposed on the upper stack structure 46 and has a structure substantially similar to the upper stack structure 46.

The plurality of vertical structures 54 illustrated in FIGS. 2A and 3 and described above may penetrate through the stack structure 36 and may contact the pattern structure 30.

The semiconductor device 1 according to an example embodiment may further include a first upper insulating layer 66 and a second upper insulating layer 89 sequentially stacked on the stack structure 36 and the plurality of vertical structures 54.

At least some of the lower and upper horizontal layers 44g and 51g may be the word lines WL, the upper gate lines UL1 and UL2 and the lower gate lines LL1 and LL2 described in FIG. 1.

At least some of the gate contact plugs 92g illustrated in FIG. 2A and described above may be disposed on pads of horizontal layers which may be the word lines WL, the upper gate lines UL1 and UL2 and the lower gate lines LL1 and LL2, among the lower and upper horizontal layers 44g and 51g. A portion of the gate contact plugs 92g may be disposed on a pad of a dummy horizontal layer among the lower and upper horizontal layers 44g and 51g.

Next, examples of the pattern structure 30, the stack structure 36, and the plurality of vertical structures 54 will be described with reference to FIGS. 5A and 5B.

FIG. 5A is an enlarged partial cross-sectional view of a portion indicated by 'B1' in FIG. 4, and FIG. 5B is an enlarged partial cross-sectional view of a portion indicated by 'B2' in FIG. 4.

Referring to FIGS. 4, 5A and 5B, in the pattern structure 30, a thickness of the lower pattern layer 15 may be greater than that of each of the upper pattern layer 27, the intermediate pattern layer 17b, and the intermediate structure 17a.

The intermediate pattern layer 17b may include a first portion 17_1, a second portion 17_2 extending from the first portion 17_1 and decreasing in thickness, and a third portion 17_3 that extends from the first portion 17_1, increases in thickness, and contacts the vertical memory structures 54m and the second vertical buffer structures 54b2. The second portion 17_2 of the intermediate pattern layer 17b includes a side surface 17s that is lowered while forming a surface curved from the upper surface of the first portion 17_1 and contacts the upper pattern layer 27.

In an example, the first portion 17_1 of the intermediate pattern layer 17b may have a substantially uniform thickness. As used herein, thickness may refer to the thickness or height measured in a direction perpendicular to a top surface of the substrate 4 (e.g., the vertical direction Z).

In an example, a maximum width of the second portion 17_2 of the intermediate pattern layer 17b in a horizontal direction may be greater than a thickness of the data storage layer 57b facing the gate layers 44g and 51g in the horizontal direction.

In an example, the maximum width of the second portion 17_2 of the intermediate pattern layer 17b in the horizontal direction may be greater than the thickness of the data storage structure 57 facing the gate layers 44g and 51g in the horizontal direction.

In an example, the maximum width of the second portion 17_2 of the intermediate pattern layer 17b in the horizontal direction may be greater than a thickness of the channel layer 58 facing the gate layers 44g and 51g in the horizontal direction.

The intermediate structure 17a may include a first intermediate layer 20 and a second intermediate layer 25. The first intermediate layer 20 may include a lower layer 21, an upper layer 22, and a spacer layer 23.

In an example, the second intermediate layer 25 may be formed of a material having etch selectivity with the lower layer 21, the upper layer 22 and the spacer layer 23. For example, the lower layer 21, the upper layer 22, and the spacer layer 23 may be formed of a silicon oxide or a silicon oxide-based insulating material, and the second intermediate layer 25 may be formed of a silicon nitride or a silicon nitride-based insulating material. In another example, the second intermediate layer 25 may be formed of silicon.

In an example, the lower and upper layers 21 and 22 may be a harder material than that of the spacer layer 23. For example, the lower and upper layers 21 and 22 may be formed of silicon oxide formed at a higher temperature than the spacer layer 23. The upper layer 22 may be formed of a harder material than the lower layer 21.

The second intermediate layer 25 may be disposed on the lower layer 21, contacting the lower layer 21. The upper layer 22 may be disposed on the second intermediate layer 25, contacting the second intermediate layer 25. The lower layer 21 may have a first side surface 21s1 facing the upper pattern layer 27 or in contact with the upper pattern layer 27, and a second side surface 21s2 not facing the upper pattern layer 27. The second intermediate layer 25 may have a first side surface 25s1 facing the upper pattern layer 27 and a second side surface 25s2 not facing the upper pattern layer 27. The upper layer 22 may have a first side surface 22s1 facing the upper pattern layer 27 and a second side surface 22s2 not facing the upper pattern layer 27. The spacer layer 23 may have a first side surface 23s in contact with the upper pattern layer 27. The intermediate structure 17a may have the first side surface 23s of the spacer layer 23 and the first side surface 21s1 of the lower layer 21 in contact with the upper pattern layer 27.

Accordingly, the first intermediate layer 20 may include a lower portion between the lower surface of the second intermediate layer 25 and the lower pattern layer 15, an upper portion between the upper surface of the second intermediate layer 25 and the upper pattern layer 27, and a side portion between the first side surface 25s1 of the second intermediate layer 25 and the upper pattern layer 27. The lower layer 21 may include the lower portion of the first intermediate layer 20, and the upper layer 22 may include the upper portion of the second intermediate layer 25, and the spacer layer 23 may include the side portion of the second intermediate layer 25. In an example, a maximum width of the second portion of the first intermediate layer 20 in the horizontal direction is greater than a thickness of the data storage layer 57b facing the gate layers 44g, in the horizontal direction. In an example, the maximum width of the side portion of the first intermediate layer 20 in the horizontal direction is greater than a thickness of the channel layer 58 facing the gate layers 44g, in the horizontal direction.

In an example, at least a portion of the first side surface 23s of the spacer layer 23 may be inclined to reduce the thickness of the intermediate structure 17a.

In an example, the second side surface 21s2 of the lower layer 21, the second side surface 25s2 of the second intermediate layer 25, the second side surface 22s2 of the upper layer 22, the outer side 15s1 of the lower pattern layer 15, and an outer end portion 27e of the second upper pattern portion 27b of the upper pattern layer 27 may be substantially vertically aligned.

In an example, the second side surface 21s2 of the lower layer 21, the second side surface 25s2 of the second intermediate layer 25, the second side surface 22s2 of the upper layer 22, and an outer side 15s1 of the lower pattern layer 15 may be defined as the outer side surface 30s of the pattern structure 30.

In the intermediate structure 17a, side surfaces 22s1 and 23s1 contacting the upper pattern layer 27 may be defined as first side surfaces, and side surfaces 21s2, 25s2, and 22s2 that do not contact the upper pattern layer 27 may be defined as second side surfaces. In the intermediate structure 17a, the second side surfaces 21s2, 25s2, and 22s2 may contact the intermediate insulating layer 33i.

In the intermediate structure 17a, the first side surfaces 22s1 and 23s1 may be lowered while forming a surface curved from the upper surface of the intermediate structure 17a, and the second side surfaces 21s2, 25s2, and 22s2 may be lowered more steeply than the first side surfaces 22s1 and 23s1 from the upper surface of the intermediate structure 17a.

In an example, the lower layer 21 and the upper layer 22 may have substantially the same thickness. In an example, a maximum width of the spacer layer 23 of the first intermediate layer 20 in the horizontal direction is greater than a thickness of the lower layer 21 of the first intermediate layer 20 in the vertical direction.

In an example, the thickness of the second intermediate layer 25 may be greater than the thickness of each of the lower layer 21 and the upper layer 22.

In another example, the thickness of the second intermediate layer 25 may be substantially the same as the thickness of each of the lower layer 21 and the upper layer 22.

In an example, the stack structure 36 may further include a dielectric layer 80 which covers the bottom and upper surfaces of the respective lower and upper horizontal layers 44g and 51g and which is interposed between the respective lower and upper horizontal layers 44g and 51g and the plurality of vertical structures 54.

In another example, the dielectric layer 80 may be deformed to cover the side surface and bottom surfaces of the plurality of respective vertical structures 54, and may include portions interposed between the lower and upper horizontal layers 44g and 51g and the plurality of respective vertical structures 54.

In an example, the dielectric layer 80 may include a high-k dielectric.

The lower pattern layer 15 may include an at least partially doped silicon layer. For example, the lower pattern layer 15 may include a polysilicon layer of which at least a portion has N-type conductivity.

The intermediate pattern layer 17b and the upper pattern layer 27 may include a silicon layer. For example, at least one of the intermediate pattern layer 17b and the upper pattern layer 27 may include a doped silicon layer. For example, at least one of the intermediate pattern layer 17b and the upper pattern layer 27 may include a polysilicon layer having N-type conductivity. For example, the intermediate pattern layer 17b and the upper pattern layer 27 may be respectively formed of a polysilicon layer having N-type conductivity.

As described above, the upper pattern layer 27 may include the first upper pattern portion 27a contacting the lower pattern layer, the second upper pattern portion 27b contacting the intermediate structure 17a, and the third upper pattern portion 27c contacting the intermediate pattern layer 17b.

Upper surfaces of the second and third upper pattern portions 27b and 27c may be positioned at substantially the same height level. The upper surface of the first upper pattern portion 27a may be located on a lower level than the upper surface of the second and third upper pattern portions 27b and 27c.

Each of the plurality of vertical structures 54 includes a core region 60, a channel layer 58 covering a side surface and a bottom surface of the core region 60, and a data storage structure 57 covering an outer surface and a bottom surface of the channel layer 58.

The channel layer 58 may be formed of a semiconductor material layer. For example, the channel layer 58 may be formed of a silicon layer.

The core region 60 may include silicon oxide or a low-k dielectric. The core region 60 may include silicon oxide in which voids are formed, or low-k dielectric in which voids are formed.

The data storage structure 57 may include a first dielectric layer 57a, a second dielectric layer 57c, and a data storage layer 57b between the first dielectric layer 57a and the second dielectric layer 57c. The second dielectric layer 57c may contact the channel layer 58, and the data storage layer 57b may be spaced apart from the channel layer 58. The first dielectric layer 57a may include silicon oxide or silicon oxide doped with impurities. The second dielectric layer 57c may include at least one of silicon oxide and high-k dielectric. The data storage layer 57b may include regions capable of storing information in a semiconductor device such as a flash memory device. For example, the data storage layer 57b may include a material capable of trapping charge, for example, silicon nitride.

Among the plurality of vertical structures 54, the data storage layer 57b of each of the vertical memory structures 54m may store information by trapping charges, for example electrons, and the data storage layers 57b of other vertical structures, for example, the vertical dummy structures 54d, the first and second vertical buffer structures 54b1 and 54b2, and the vertical support structures 54s may be dummy layers that do not store information in a semiconductor device such as a flash memory element.

The vertical memory structures 54m and the second vertical buffer structures 54b2 may have substantially the same cross-sectional structure and substantially the same width.

The vertical memory structures 54m and the second vertical buffer structures 54b2 penetrate through the stack structure 36, the third upper pattern portion 27c of the upper pattern layer 27, and the intermediate pattern layer 17b sequentially, and may extend into the lower pattern layer 15. The vertical memory structures 54m and the second vertical buffer structures 54b2 may be spaced apart from the intermediate structure 17a.

The intermediate pattern layer 17b may penetrate through the data storage structure 57 of each of the vertical memory structures 54m and the second vertical buffer structures 54b2 and may contact the channel layer 58. In the vertical memory structures 54m and the second vertical buffer structures 54b2, the data storage structure 57 may be separated into a lower data storage structure 57_2 and an upper data storage structure 57_1 by the intermediate pattern layer 17b. For example, the third portion 17_3 may contact upper surfaces of the lower data storage structure 57_2 and lower surfaces of the upper data storage structure 57_1, separating the lower data storage structure 57_2 and the upper data storage structure 57_1 from one another.

In an example, the intermediate pattern layer 17b may be spaced apart from the core region 60.

In an example, the intermediate pattern layer 17b penetrates through the data storage structure 57 of each of the vertical memory structures 54m and may extend upward and downward from a portion in contact with the channel layer 58 to a length less than the thickness of the upper pattern layer 27. For example, an upper surface of the third portion 17_3 of the intermediate pattern layer 17b may be at a lower vertical level than an upper surface of the third upper pattern portion 27c.

The first vertical buffer structures 54b1 may sequentially penetrate through the stack structure 36, the capping insulating layer 33c, and the first upper pattern portion 27a of the upper pattern layer 27 and may extend into the lower pattern layer 15. The first vertical buffer structures 54b1 may be spaced apart from the intermediate structure 17a and the intermediate pattern layer 17b.

The vertical support structures 54s sequentially penetrate through the stack structure 36, the second upper pattern portion 27b of the upper pattern layer 27, and the intermediate structure 17a, and may extend into the lower pattern layer 15. The vertical support structures 54s may be spaced apart from the intermediate pattern layer 17b.

In each of the vertical memory structures 54m and the second vertical buffer structures 54b2, the data storage structure 57 may be divided in a vertical direction Z by the intermediate pattern layer 17b in contact with the channel layer 58.

In each of the first vertical buffer structures 54b1 and the vertical support structures 54s, the data storage structure 57 is not separated from the outer surface of the channel layer 58, but is continuously formed in the vertical direction Z to cover the bottom surface of the channel layer 58.

Figure 6:
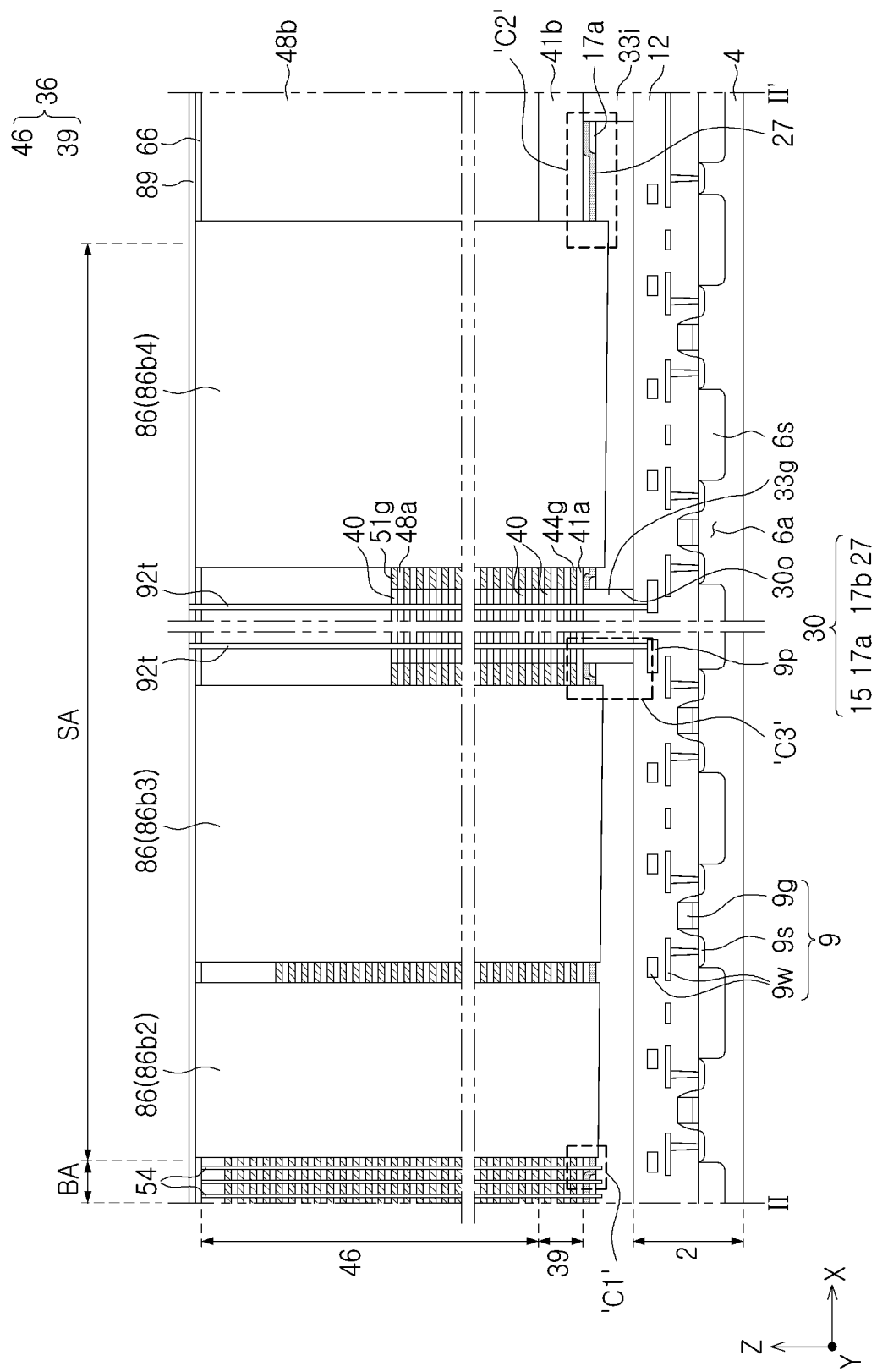

Next, a cross-sectional structure of the region taken along line II-II' of FIG. 2A will be described with reference to FIG. 6. FIG. 6 is a cross-sectional view illustrating the region taken along line II-II' of FIG. 2A. In this case, a description overlapping with the contents described with reference to FIG. 4 will be omitted.

Referring to FIG. 6, the semiconductor device 1 according to an example embodiment may further include a gap-fill insulating layer 33g filling the opening 30o of the pattern structure 30 illustrated in FIG. 2A and described above. The gap-fill insulating layer 33g may be formed of the same material as the intermediate insulating layer 33i and the capping insulating layer 33c, for example, silicon oxide.

The stack structure 36 may further include insulating layers 40 positioned on the same height level as the horizontal layers 44g and 51g in an area overlapping the gap-fill insulating layer 33g in the opening 30o.

In an example, the opening 30o of the pattern structure 30 may be formed in a position not overlapping the upper stack structure 46 of the stack structure 36. In this case, the insulating layers 40 may be disposed on the same height level as the lower horizontal layers 44g.

In an example, the opening 30o of the pattern structure 30 may include an opening formed in a position overlapping the upper stack structure 46, and an opening formed in a position of the stack structure 36 not overlapping the upper stack structure 46.

The peripheral contact plug 92t illustrated in FIG. 2A and described above extends in the vertical direction Z while contacting a peripheral pad 9p of the peripheral wiring 9w, penetrates through the gap-fill insulating layer 33g in the opening 30o of the pattern structure 30 and the insulating layers 40 of the stack structure 36, and extends upward to penetrate through the first and second upper insulating layers 66 and 89.

The plurality of separation structures 86 illustrated in FIGS. 2A, 2B and 3 and described above penetrate through the first upper insulating layer 66 and the stack structure 36 in turn and may be extended into the pattern structure 30. As described above in connection with FIGS. 2A and 2B, the plurality of separation structures 86 may include the main separation structures 86a and the auxiliary separation structures 86B.

A portion of each of the main separation structures 86a and the first auxiliary separation structure 86B1 may extend into the lower pattern layer 15 while penetrating through the first upper pattern portion 27a of the pattern structure 30, and may be spaced apart from the intermediate structure 17a.

The second, third, and fourth auxiliary separation structures 86b2, 86b3, and 86b4 may extend into the lower pattern layer 15 while penetrating through the first upper pattern portion 27a of the pattern structure 30, and may be spaced apart from the intermediate pattern layer 17b and the intermediate structure 17a.

Figure 7A:
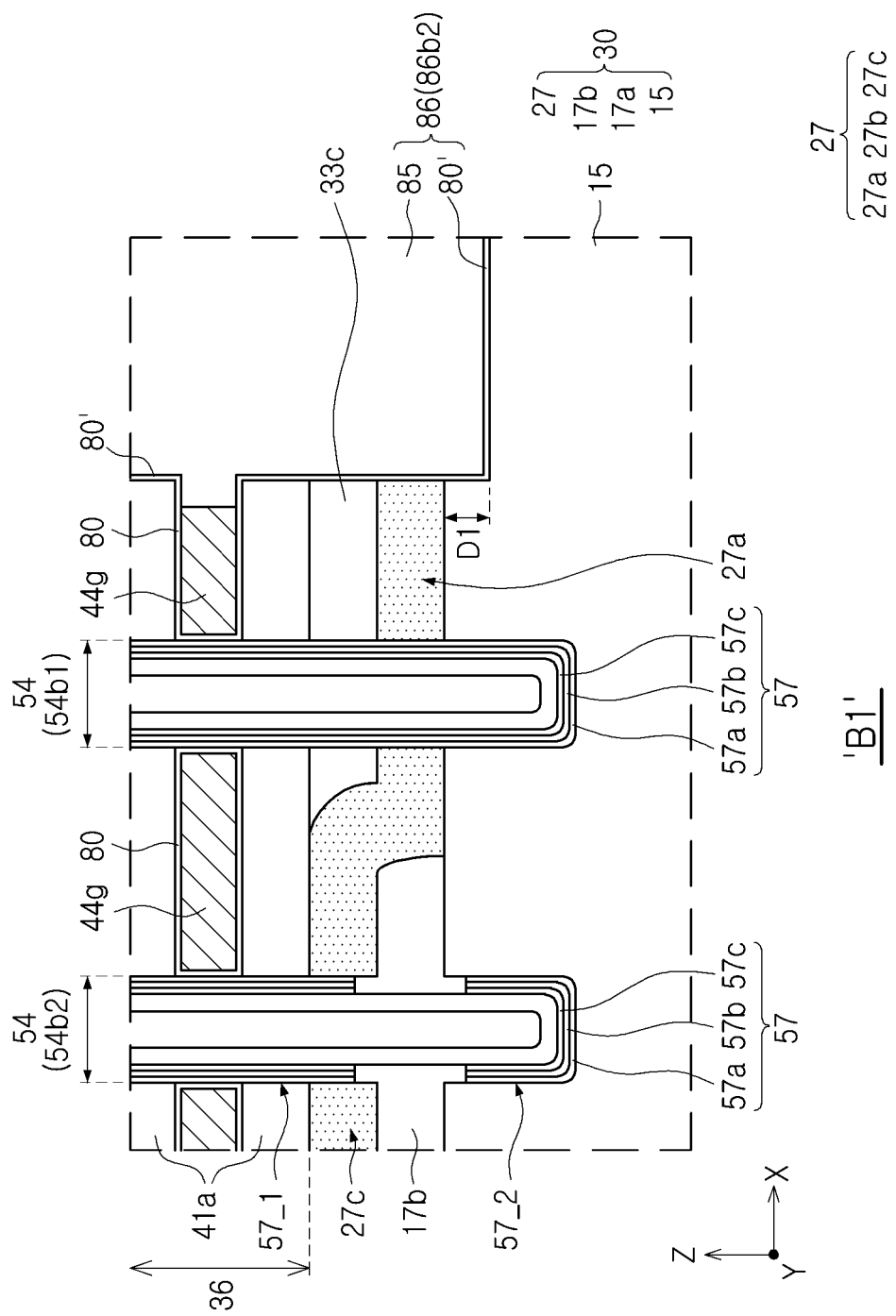

Next, examples of the stack structure 36 and the plurality of separation structures 86 will be described with reference to FIGS. 7A to 7C. FIG. 7A is a partially enlarged cross-sectional view of a portion indicated by 'C1' in FIG. 6, FIG. 7B is a partially enlarged. cross-sectional view of a portion indicated by 'C2' in FIG. 6, and FIG. 7C is a partially enlarged cross-sectional view of a portion indicated by 'C3' in FIG. 6.

Figure 7B:
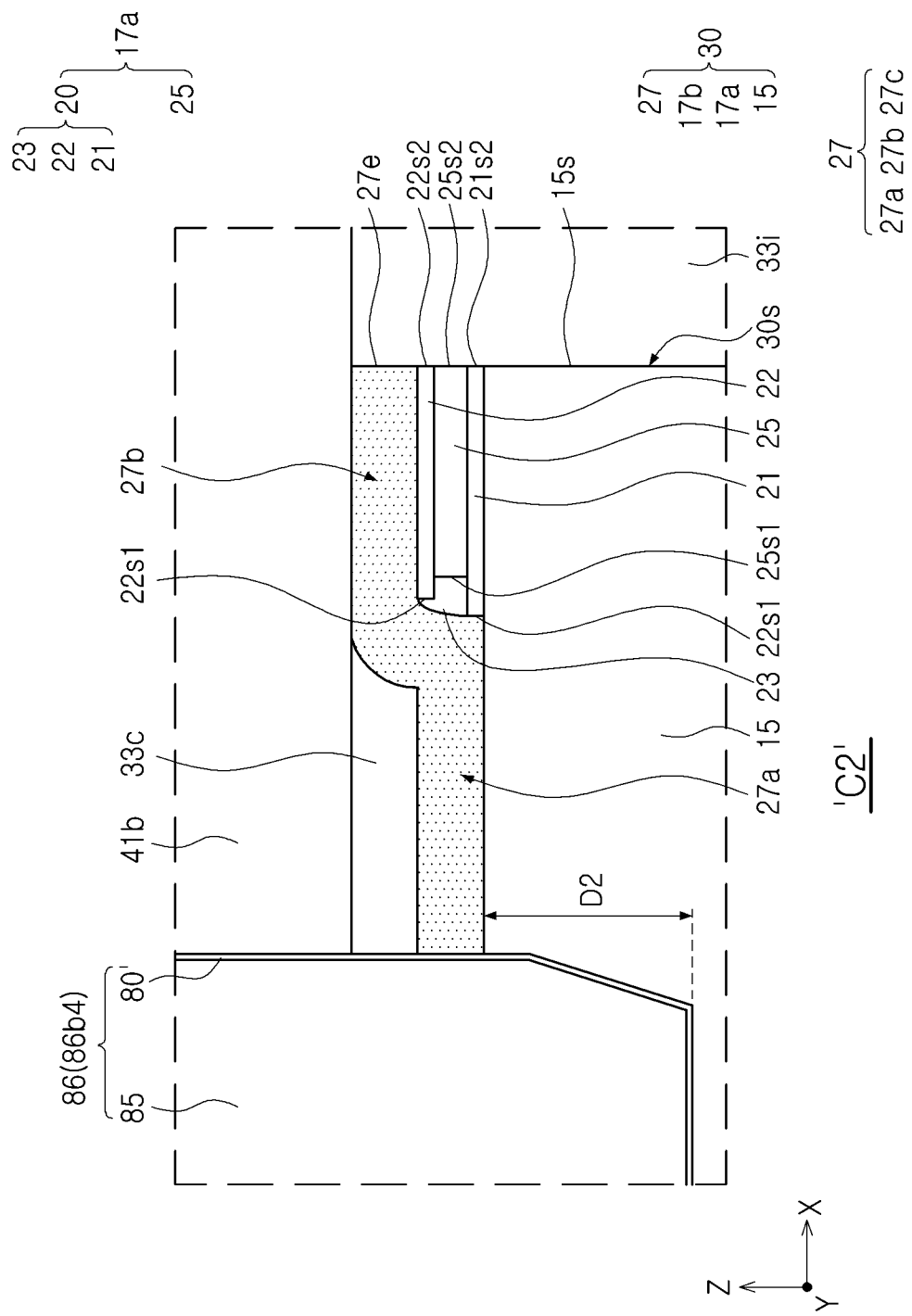
Figure 7C:
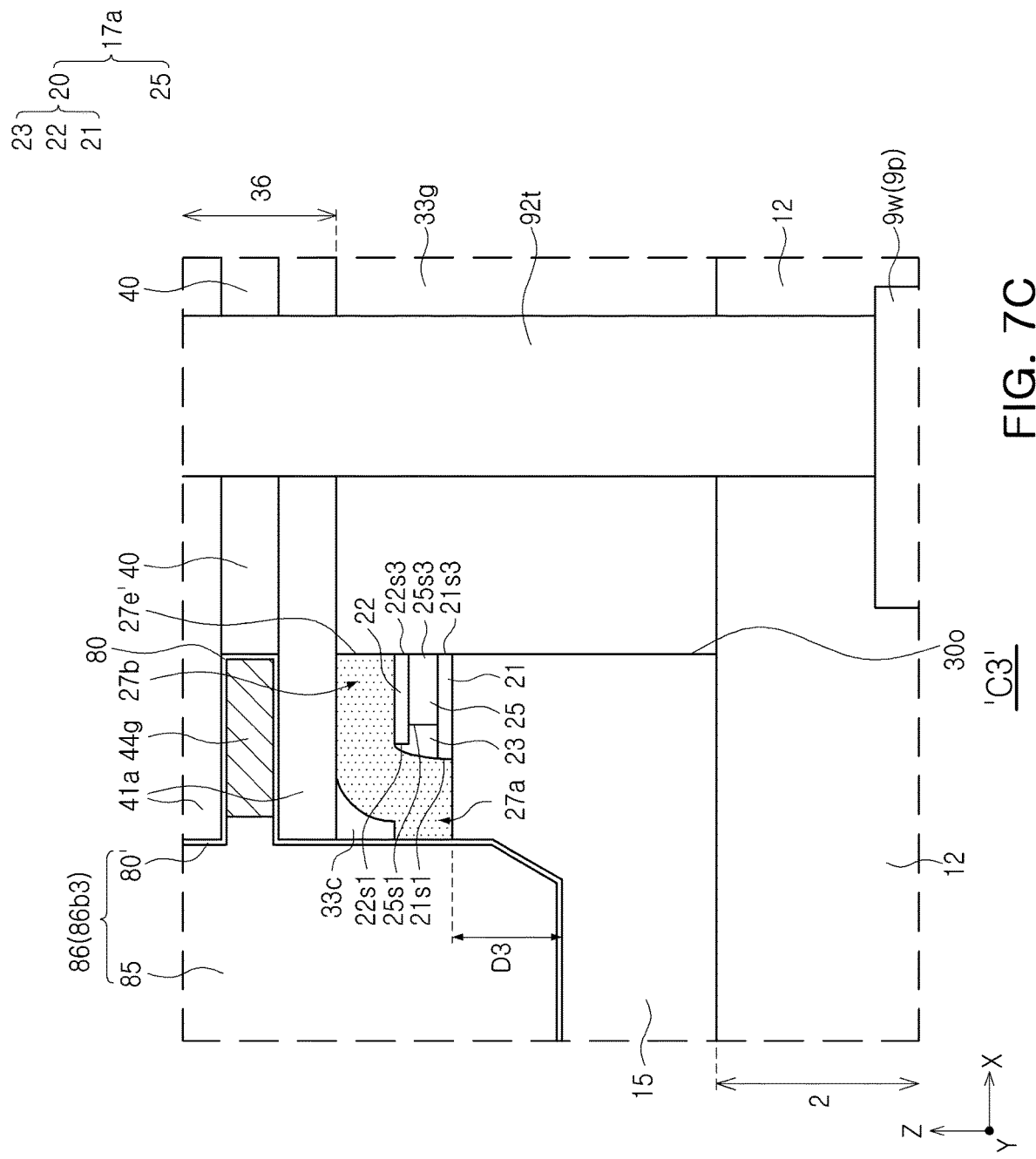

Referring to FIGS. 7A, 7B, and 7C, in an example, as illustrated and described in FIG. 5A, the dielectric layer 80 covers the bottom and upper surfaces of each of the lower and upper horizontal layers 44g and 51g, and may be interposed between each of the lower and upper horizontal layers 44g and 51g and the plurality of vertical structures 54.

In an example, the dielectric layer 80 may further include a dielectric portion 80' extending from a portion covering the bottom and upper surfaces of each of the lower and upper horizontal layers 44g and 51g.

In an example, each of the plurality of separation structures 86 may include a separation pattern 85 and the dielectric portion 80'. The separation pattern 85 penetrates through the stack structure 36 and may extend into the pattern structure 30.

In an example, each of the plurality of separation structures 86 may include an insulating material. For example, the dielectric portion 80' may be formed of a high-k dielectric material, and the separation pattern 85 may include silicon oxide and; or a low-k dielectric material.

In another example, each of the plurality of separation structures 86 may include a conductive insulating material. For example, in each of the plurality of separation structures 86, the separation pattern 85 penetrates through the dielectric portion 80' and may include a conductive material layer that may contact the lower pattern layer 15 and an insulating material layer on the side surface of the conductive material layer. For example, in each of the plurality of separation structures 86, the conductive material layer of the separation pattern 85 may include at least one of doped poly silicon, metal nitride (e.g., TiN or WN), a metal-semiconductor compound (e.g., WSi, TiSi, or the like) and a metal (e.g., W or the like), and may contact the lower pattern layer 15, and the insulating material layer of the separation pattern 85 may include silicon oxide.

In an example, the separation pattern 85 may contact the lower and upper horizontal layers 44g and 51g.

In an example, the dielectric portion 80' may cover the sides of the separation pattern 85 located at a different height level from the lower and upper horizontal layers 44g and 51g, and may cover the bottom surface of the separation pattern 85.

In another example, the dielectric portion 80' may be omitted.

In an example, the separation pattern 85 may include an insulating material.

For example, the separation pattern 85 may include at least one of silicon oxide, silicon oxynitride, and silicon nitride.

In an example, in the plurality of separation structures 86, portions of the plurality of separation structures 86 positioned at the same height level as the lower and upper horizontal layers 44g and 51g may have an increased width while protruding in the direction toward the lower and upper horizontal layers 44g and 51g.

Among the plurality of separation structures 86, separation structures located in the step area SA may be spaced apart from the intermediate structure 17a, and may penetrate through the first upper pattern portion 27a of the upper pattern layer 27, and may be spaced apart from the second upper pattern portion 276 of the upper pattern layer 27.

Among the plurality of separation structures 86, the depth of the bottom surface of the separation structure relatively close to the memory cell array area MA may be shallower than the depth of the bottom surface of the separation structure located outside of the step area SA. For example, when viewed with reference to the upper surface of the lower pattern layer 15, the bottom surface of the second auxiliary separation structure 86b relatively close to the memory cell array area MA is located at a first depth D1 (see FIG. 7A) from the upper surface of the lower pattern layer 15, the bottom surface of the fourth auxiliary separation structure 86b4 close to the outer side surface 30s of the pattern structure 30 is located at a second depth D2 (see FIG. 7B) from the upper surface of the lower pattern layer 15, and the bottom surface of the third auxiliary separation structure 86b3 close to the opening 30o of the pattern structure 30 or the center portion of the step area SA may be located at a third depth D3 (see FIG. 7C) from the upper surface of the lower pattern layer 15.

In an example, the first depth D1 (see FIG. 7A) may be smaller than the second depth D2 (see FIG. 7B). The third depth D3 (see FIG. 7C) may be greater than the first depth D1 (see FIG. 7A) and may be smaller than the second depth D2 (see FIG. 7B).

As illustrated in the partially enlarged cross-sectional view of FIG. 7C, the opening 30o of the pattern structure 30 may be formed to penetrate through the second upper pattern portion 27b of the upper pattern layer 27, the intermediate structure 17a, and the lower pattern layer 15 sequentially. In the intermediate structure 17a, a third side 21s3 of the lower layer 21, a third side 25s3 of the second intermediate layer 25, and a third side 22s3 of the upper layer 22 may contact the gap-fill insulating layer 33g disposed in the opening 30o of the pattern structure 30.

In an example, the gap fill insulating layer 33g may be spaced apart from the first upper pattern portion 27a of the upper pattern layer 27.

Figure 8:
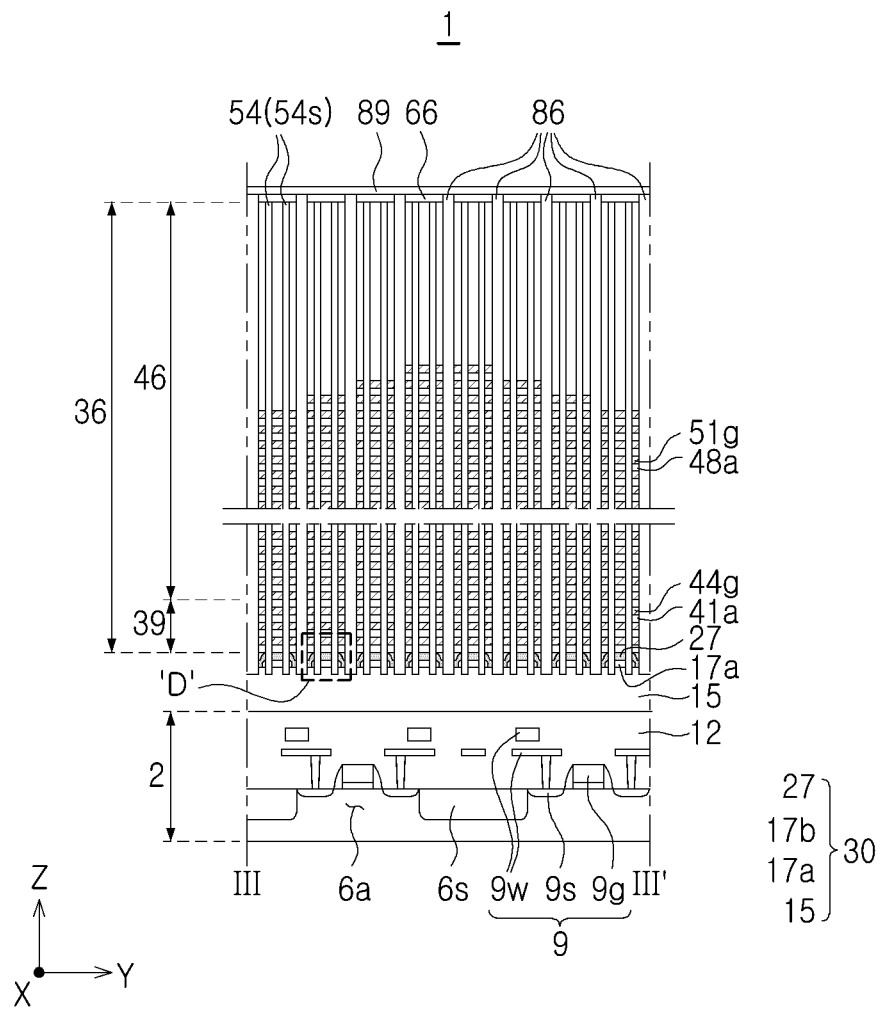

Next, with reference to FIGS. 8 and 9, the cross-sectional structure of the region taken along line III-III' in the step area SA in FIG. 2A will be described. FIG. 8 is a cross-sectional view illustrating a region taken along line of FIG. 2A, and FIG. 9 is a partially enlarged cross-sectional view of a portion indicated by 'D' in FIG. 8.

Figure 9:
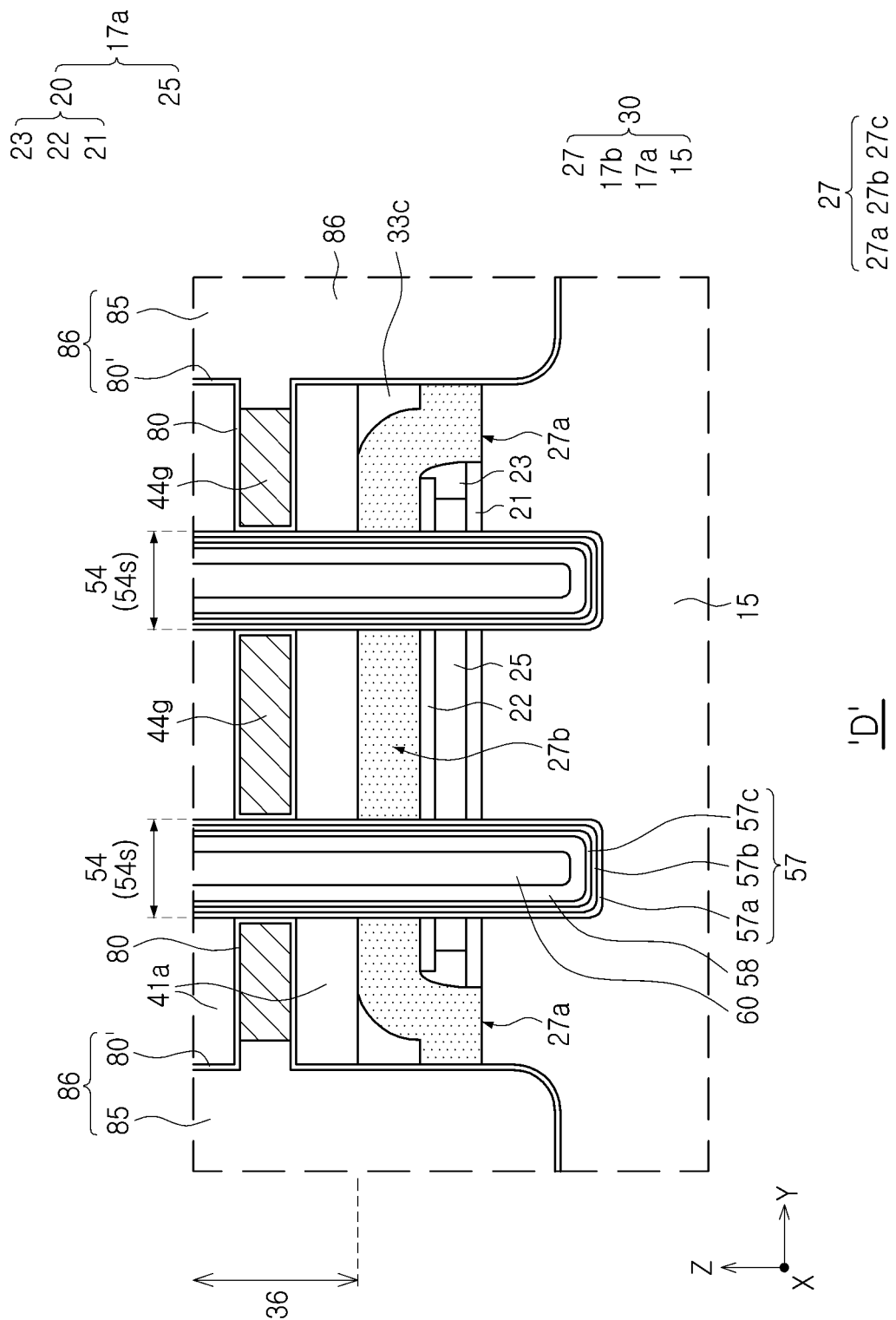

Referring to FIGS. 2A, 8 and 9, in the step area SA, the intermediate structure 17a may be disposed between the separation structures 86 adjacent to each other in the second horizontal direction Y, and may be separated from the separation structures 86 adjacent to each other.

The vertical support structures 54s disposed between the separation structures 86 adjacent to each other in the second horizontal direction Y may penetrate through the second upper pattern portion 27b and the intermediate structure 17a, and may be spaced apart from the first upper pattern portion 27a. Side surfaces of the separation structures 86 adjacent to each other in the second horizontal direction Y may contact the first upper pattern portion 27a, and may be spaced apart from the second upper pattern portion 27b and the intermediate structure 17a.

Figure 10:
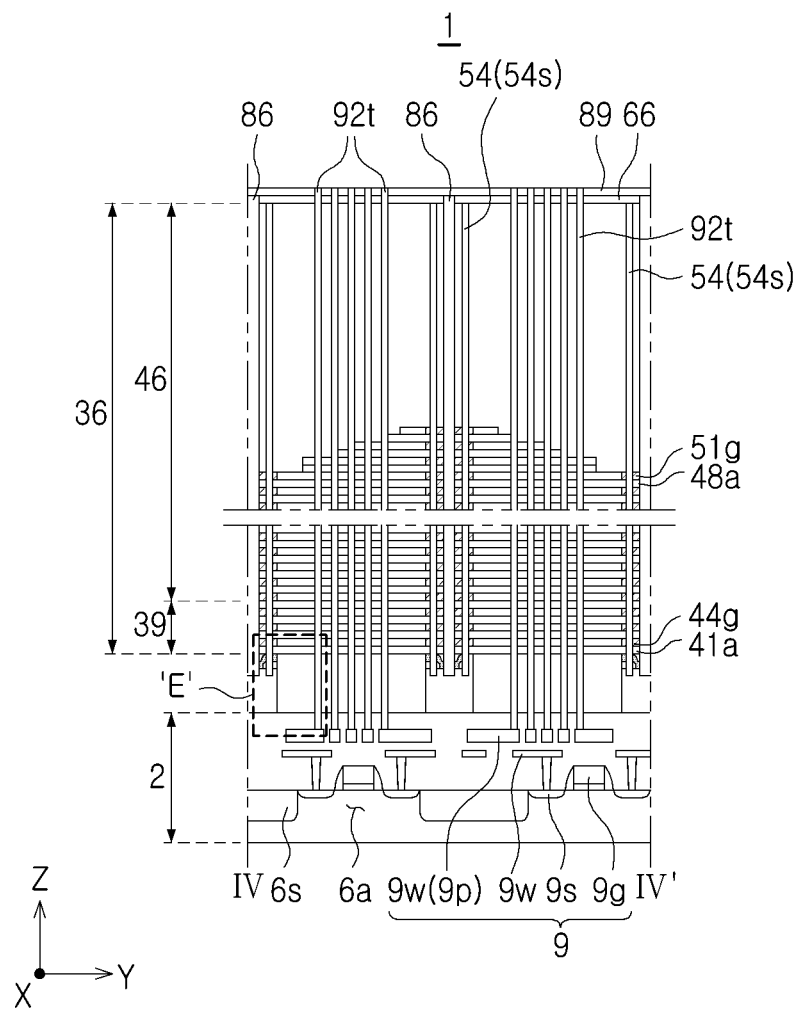

Next, with reference to FIGS. 10 and 11, a cross-sectional structure of a region taken along line in FIG. 2A will be described. FIG. 10 is a cross-sectional view illustrating a region taken along line IV-IV of FIG. 2A, and FIG. 11 is a partially enlarged cross-sectional view of a region indicated by 'E' in FIG. 10.

Figure 11:
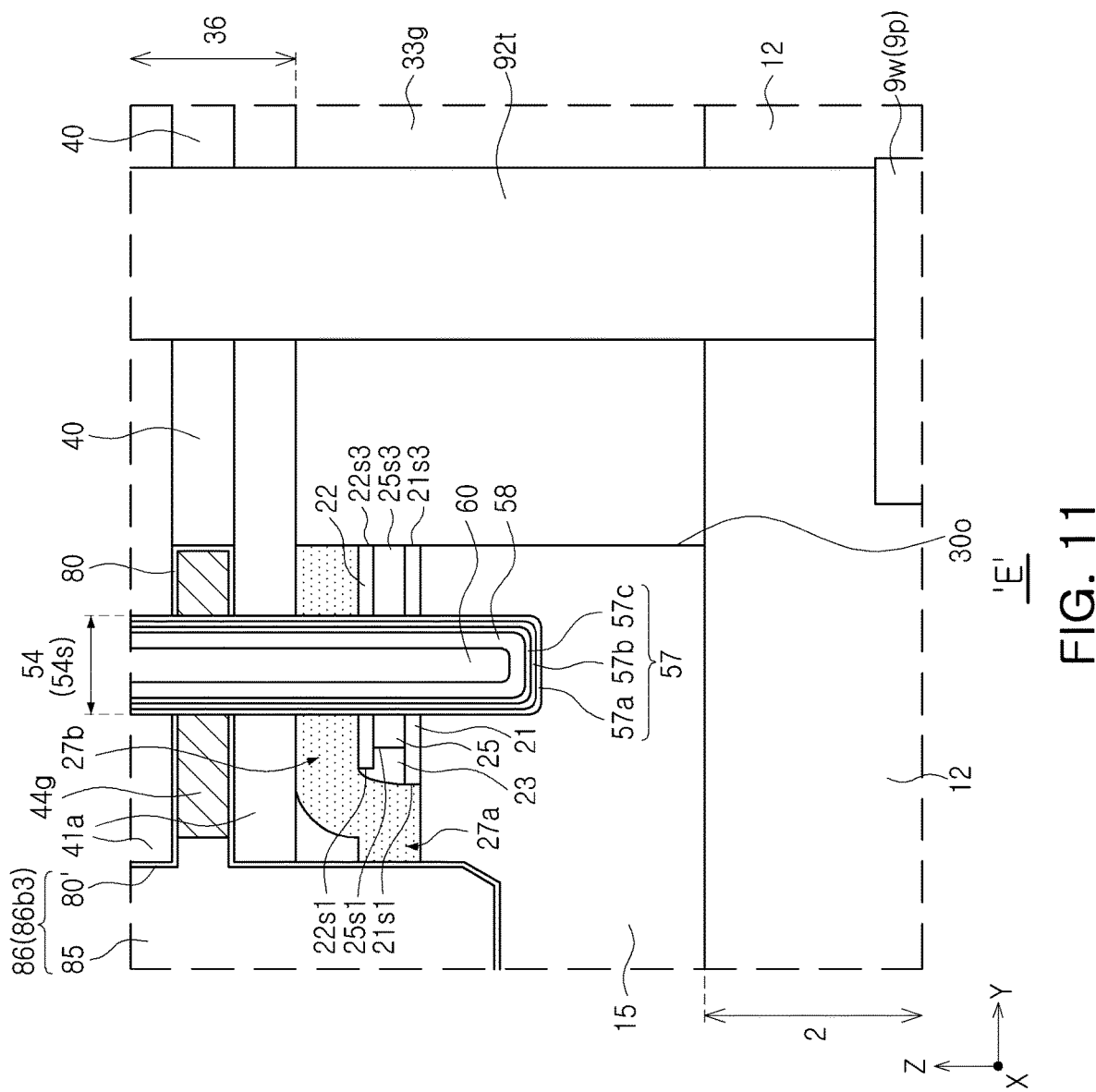

Referring to FIGS. 2A, 10 and 11, as described in FIGS. 6 and 7C, the stack structure 36 may include the insulating layers 40 overlapping the gap-fill insulating layer 33g disposed in the opening 30o of the pattern structure 30.

At least one of the vertical support structures 54s penetrates through the stack structure 36, and may contact the pattern structure 30 between the gap-fill insulating layer 33g and the separation structure 86 adjacent to the gap-fill insulating layer 33g.

At least one of the gap-fill insulating layer 33g and the vertical support structures 54s in contact with the pattern structure 30 between the separation structure 86 adjacent to the gap-fill insulation layer 33g and the gap-fill insulation layer 33g may penetrate through the second upper pattern portion 27b and the intermediate structure 17a in order, and may extend into the lower pattern layer 15, and may be spaced apart from the first upper pattern portion 27a.

Figure 12:
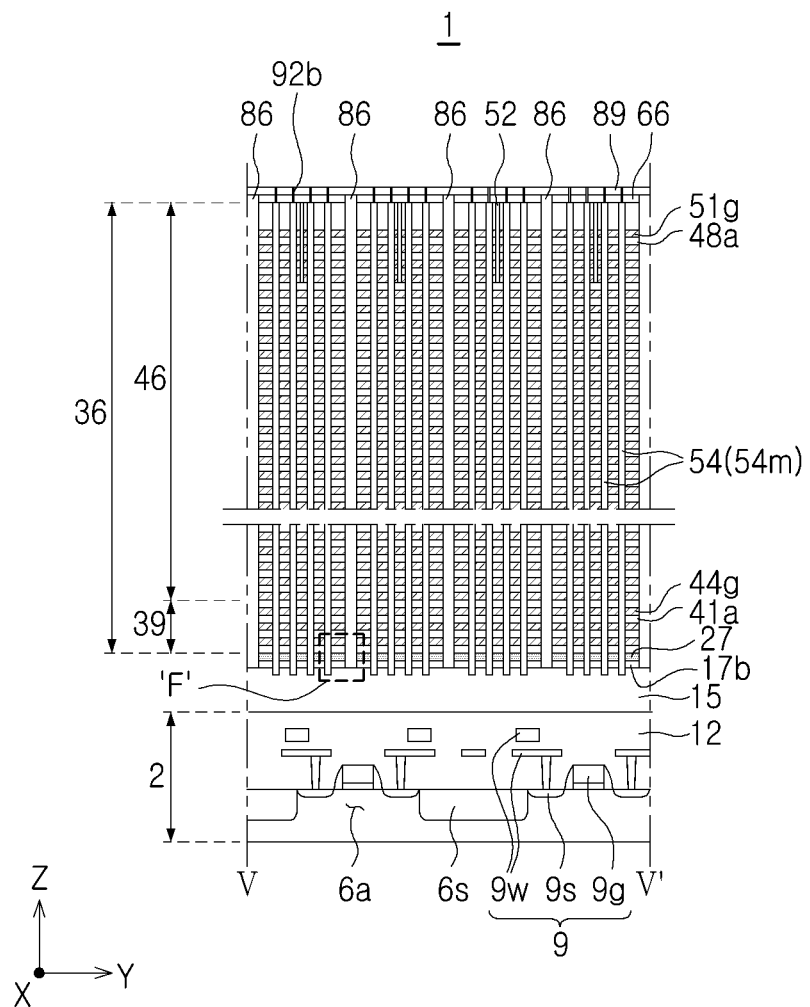

Next, with reference to FIGS. 12 and 13, the cross-sectional structure of the region taken along line V-V' in FIG. 2A will be described. FIG. 12 is a cross-sectional view illustrating a region taken along line V-V' of FIG. 2A, and FIG. 13 is a partially enlarged cross-sectional view of a portion indicated by 'F' in FIG. 12.

Figure 13:
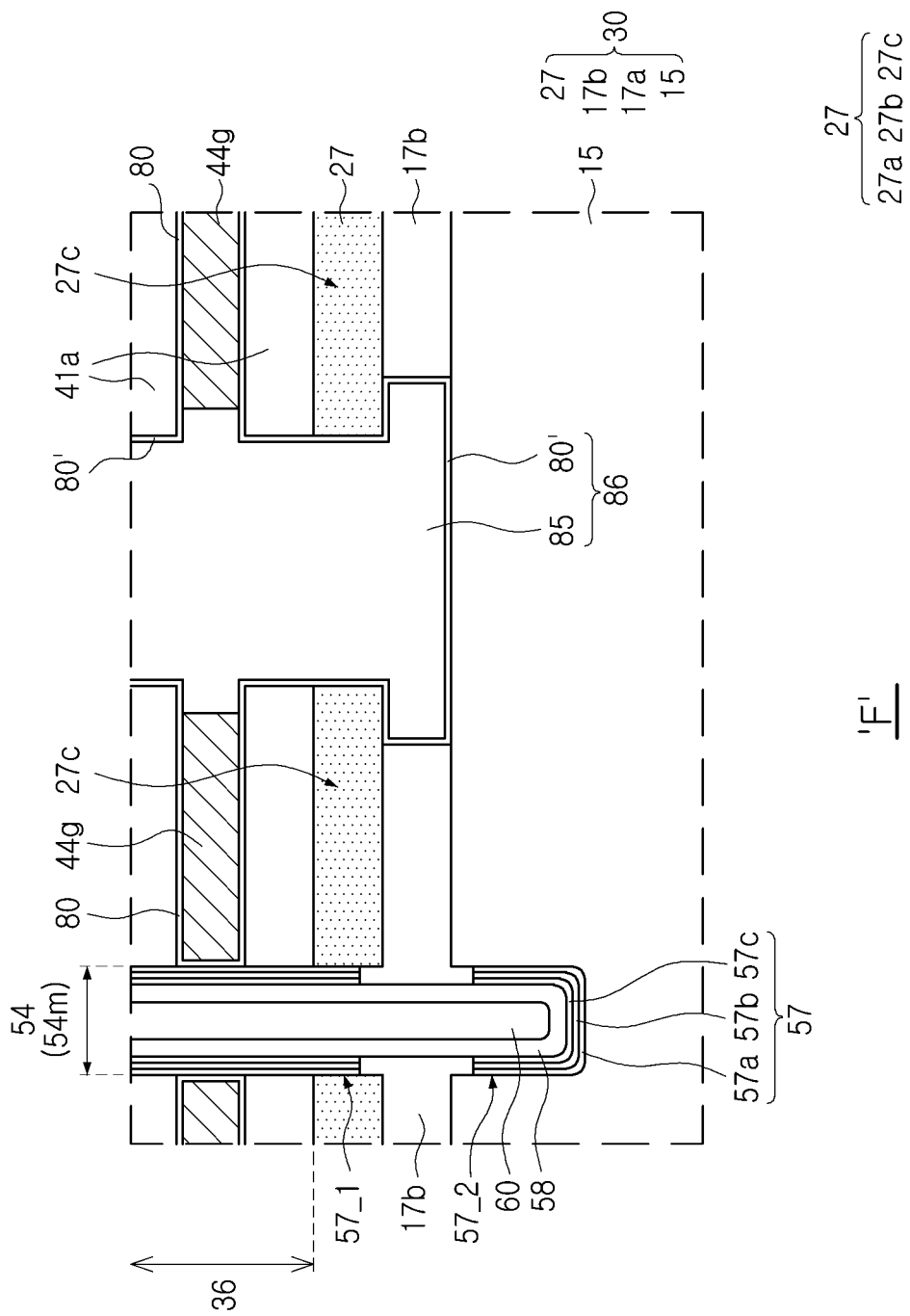

Referring to FIGS. 2A, 12 and 13, the insulating pattern 52 may extend downward from an upper surface of the stack structure 36 and penetrate through a plurality of upper horizontal layers among the upper horizontal layers 51g.

Among the plurality of separation structures 86, a bottom surface of the separation structure located in the memory cell array area MA may be disposed on substantially the same level as the upper surface of the lower pattern layer 15.

In an example, among the plurality of separation structures 86, the bottom surface of the separation structure located in the memory cell array area MA may be located on a higher level than the bottom surface of the separation structure located in the step area SA.

Among the plurality of separation structures 86, the separation structure positioned in the memory cell array area MA and the buffer area BA adjacent to the memory cell array area MA may penetrate through and contact the intermediate pattern layer 17b, may be spaced apart from the intermediate structure 17a (see FIG. 5a), and may be spaced apart from the first upper pattern portion 27a (see FIGS. 2A and 5A).

In an example, among the plurality of separation structures 86, the separation structure positioned in the memory cell array area MA and the buffer area BA adjacent to the memory cell array area MA may protrude in the second horizontal direction Y to have an increased width at the same height level as the intermediate pattern layer 17b.

Figure 14:
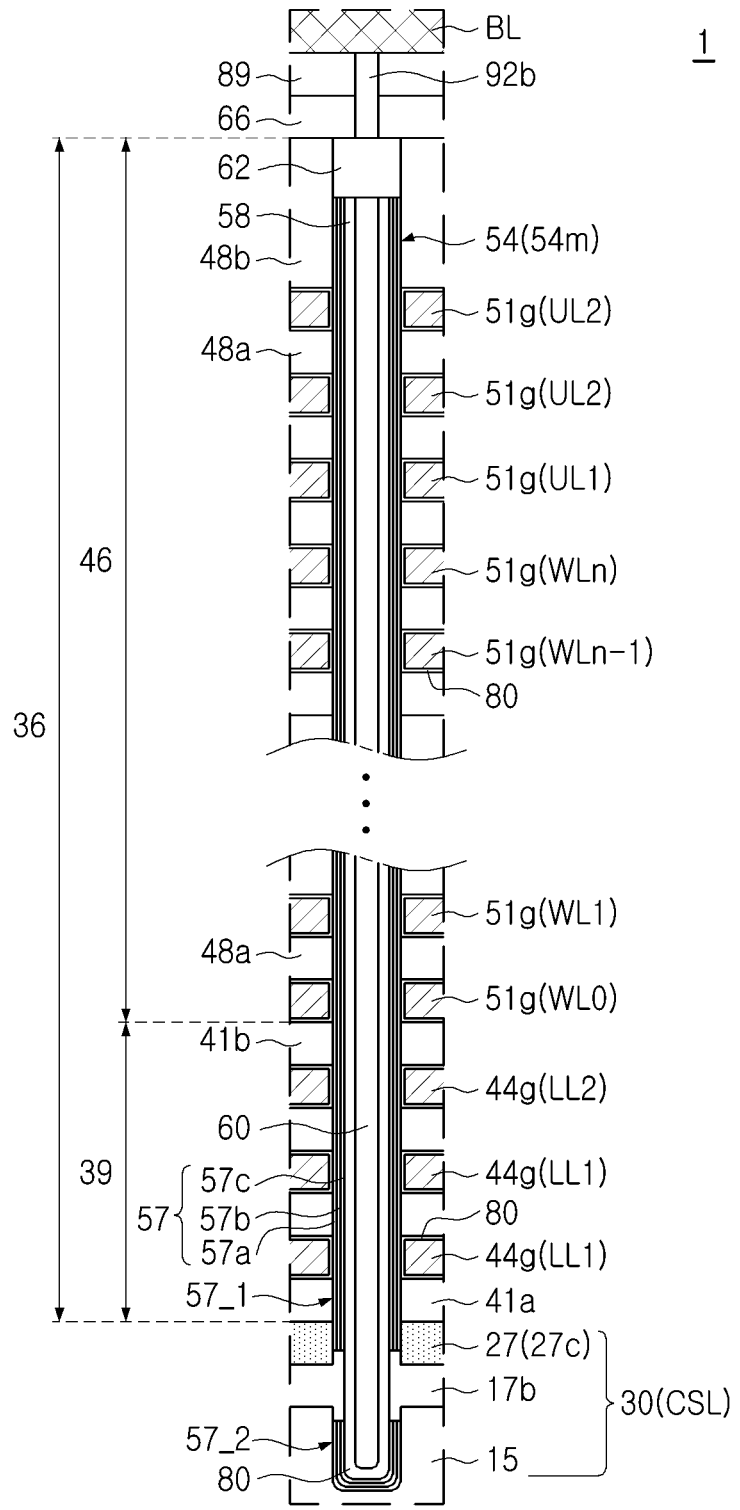
FIG. 14 is a partially enlarged cross-sectional view illustrating a portion of a semiconductor device, according to an example embodiment.

Next, referring to FIG. 14, the stack structure 36, the pattern structure 30, and any one of the vertical memory structures 54m disposed in the memory cell array area MA described with reference to FIGS. 2A to 13 will be described. FIG. 14 is a schematic cross-sectional view mainly illustrating the pattern structure 30, the stack structure 36, and any one of the vertical memory structures 54m in FIGS. 12 and 13.

Referring to FIGS. 2A, 12 and 14, in the stack structure 36, the first and second lower interlayer insulating layers 41a and 41b and the first and second upper interlayer insulating layers 48a and 48b may be referred to as interlayer insulating layers 41a, 41b, 48a, and 48b, and the lower horizontal layers 44g and the upper horizontal layers 51g may be referred to as horizontal layers or gate layers. For example, the stack structure 36 may include the interlayer insulating layers and the horizontal layers (or gate layers) repeatedly alternately stacked.

Among the gate layers 44g and 51g, at least some positioned at the lower portion may be the lower gate lines LL1 and LL2 described in FIG. 1, and at least some positioned at the upper portion may be the upper gate lines UL1 and UL2 described in FIG. 1.

Among the lower gate lines LL1 and LL2, the first lower gate line LL1 may be singular or plural, and the second lower gate line 112 may be singular or plural. Among the upper gate lines UL1 and UL2, the first upper gate line UL1 may be singular or plural, and the second upper gate line UL2 may be singular or plural.

Among the gate layers 44g and 51g, in the case of gate layers positioned between the lower gate lines LL1 and LL2 and the upper gate lines UL1 and UL2, a "0"-th gate layer WL0 to an "n"-th gate layer WLn may be sequentially stacked. In the gate layers WL0, WL1, . . . , WLn−1, and WLn stacked in this order, at least some thereof may be the word lines WL described in FIG. 1. Among the stacked gate layers WL0, WL1, . . . , WLn−1, and WLn, one or a plurality of gate layers positioned on a lower portion may be a lower dummy gate WL0, and one or a plurality of gate layers positioned on an upper portion may be an upper dummy gate WLn.

The vertical memory structure 54m penetrates through the upper gate lines UL1 and UL2, the stacked gate layers WL0, WL1, . . . , WLn−1, and WLn, and the lower gate lines LL1 and LL2, and may be in contact with the pattern structure 30.

As described above, the vertical memory structure 54m may include the core region 60, the channel layer 58 covering the side surface and the bottom surface of the core region 60, and the data storage structure 57 covering the outer side surface and the bottom surface of the channel layer 58.

The vertical memory structure 54m may further include a pad pattern 62 in contact with the channel layer 58, on the core region 60. The pad pattern 62 may include silicon having N-type conductivity, for example, polysilicon.

In the vertical memory structure 54m, the channel layer 58 may face the upper gate lines UL1 and UL2, and the stacked gate layers WL0, WL1, ..., WLn−1, and WLn, and the lower gate lines LL1 and LL2, and may contact the pattern structure 30.

In the pattern structures 30, the lower pattern layer 15, the intermediate pattern layer 17b, and the upper pattern layer 27 in contact with the vertical memory structure 54m may be the common source line CSL described in FIG. 1. The intermediate pattern layer 17b may contact the channel layer 58.

The bit line BL described in FIG. 1 may be electrically connected to the pad pattern 62 of the vertical memory structure 54m through the bit line contact plug 92b provided on the vertical memory structure 54m. For example, the bit line BL may contact the hit line contact plug 92b, on the hit line contact plug 92b.

In the vertical memory structure 54m, the data storage structure 57 may include a first dielectric layer 57a in contact with the channel layer 58, the second dielectric layer 57c adjacent to the gate layers 44g and 51g, and the data storage layer 57b between the first dielectric layer 57a and the second dielectric layer 57c, as described above.

Among the stacked gate layers WL0, WLn−1, ..., WLn−1, and WLn, regions of the data storage layer 57b positioned between the channel layers 58 and gate layers that may be word lines WL described in FIG. 1 may be defined as "data storage areas" in which information may be stored in a semiconductor device such as a flash memory device.

In example embodiments, the vertical memory structure 54m may include the data storage structure 57 which may be a data storage structure of a flash memory device, but the technical spirit of the present inventive concept is not limited thereto. For example, the vertical memory structure 54m may include a data storage structure of a memory device such as ReRAM, PRAM or the like. For example, the vertical memory structure 54m may include a variable resistance material layer including any one of SiOx, AlOx, MgOx, ZrOx, HfOx, SiNx, WOx, and TiOx, which may store information in ReRAM, or a composite material including at least two or more thereof.

Next, modified examples of the semiconductor device according to an example embodiment will be described with reference to FIGS. 15A to 15D, respectively. FIGS. 15A to 15D are partially enlarged cross-sectional views illustrating examples modified from the partially enlarged cross-sectional view of FIG. 5A. In FIGS. 15A to 15D, the modified portions in the partially enlarged cross-sectional view of FIG. 5A will be mainly described.

Figure 15A:
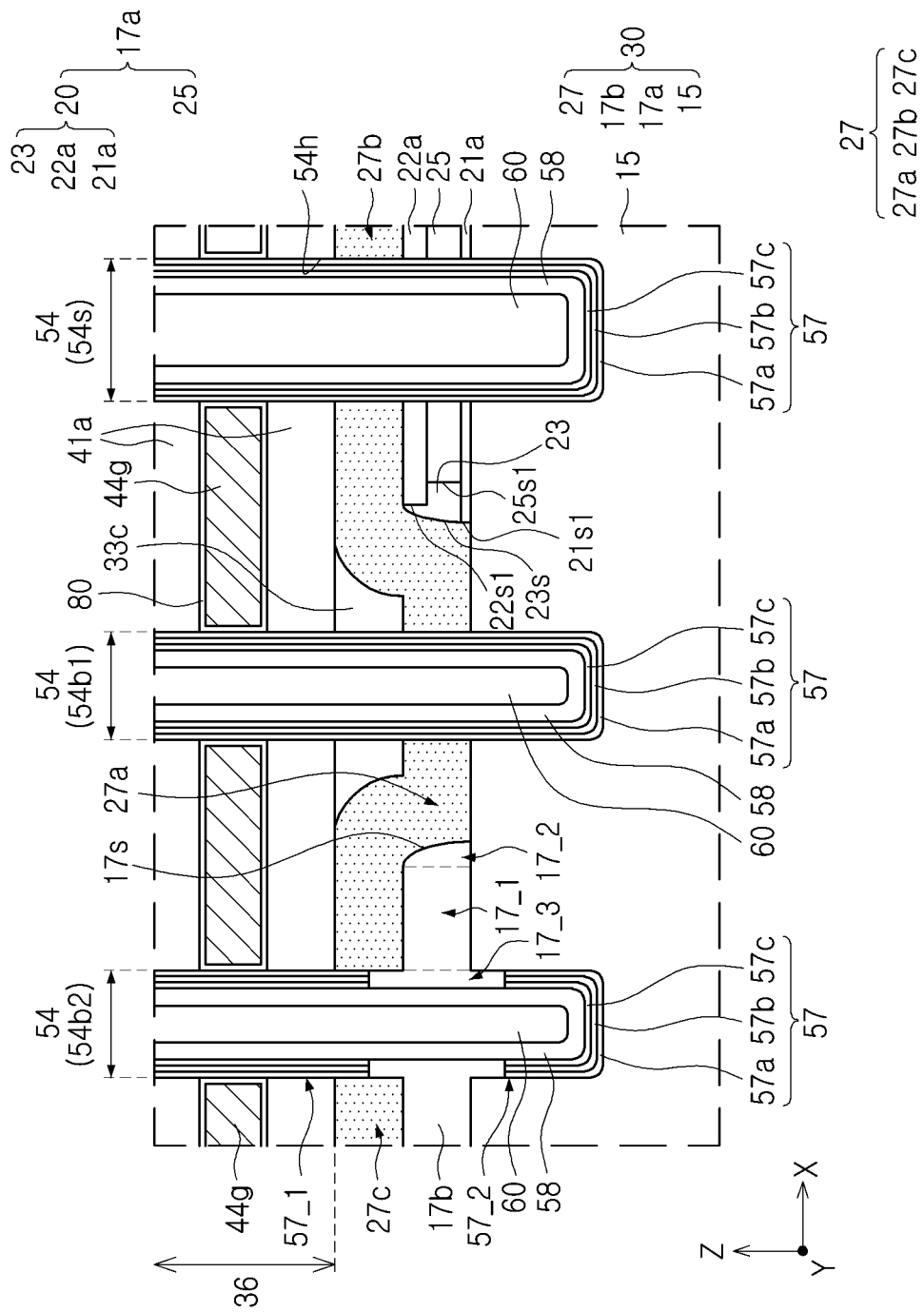
FIG. 15A is a partially enlarged cross-sectional view illustrating a modified example of a semiconductor device, according to an example embodiment.

In a modified example, referring to FIG. 15A, the lower layer 21 and the upper layer 22 having substantially the same thickness as described in FIG. 5A may be replaced with a lower layer 21a and an upper layer 22a having different thicknesses, respectively, as illustrated in FIG. 15A.

In an example, the thickness of the upper layer 22a may be greater than the thickness of the lower layer 21a.

In an example, the thickness of the upper layer 22a may be greater than or equal to about 1.5 times the thickness of the lower layer 21a.

In an example, the thickness of the lower layer 21a may be smaller than the thickness of the second intermediate layer 25.

In an example, the thickness of the second intermediate layer 25 may be substantially the same as the thickness of the upper layer 22a.

In another example, the thickness of the second intermediate layer 25 may be greater than the thickness of the upper layer 22a.

Figure 15B:
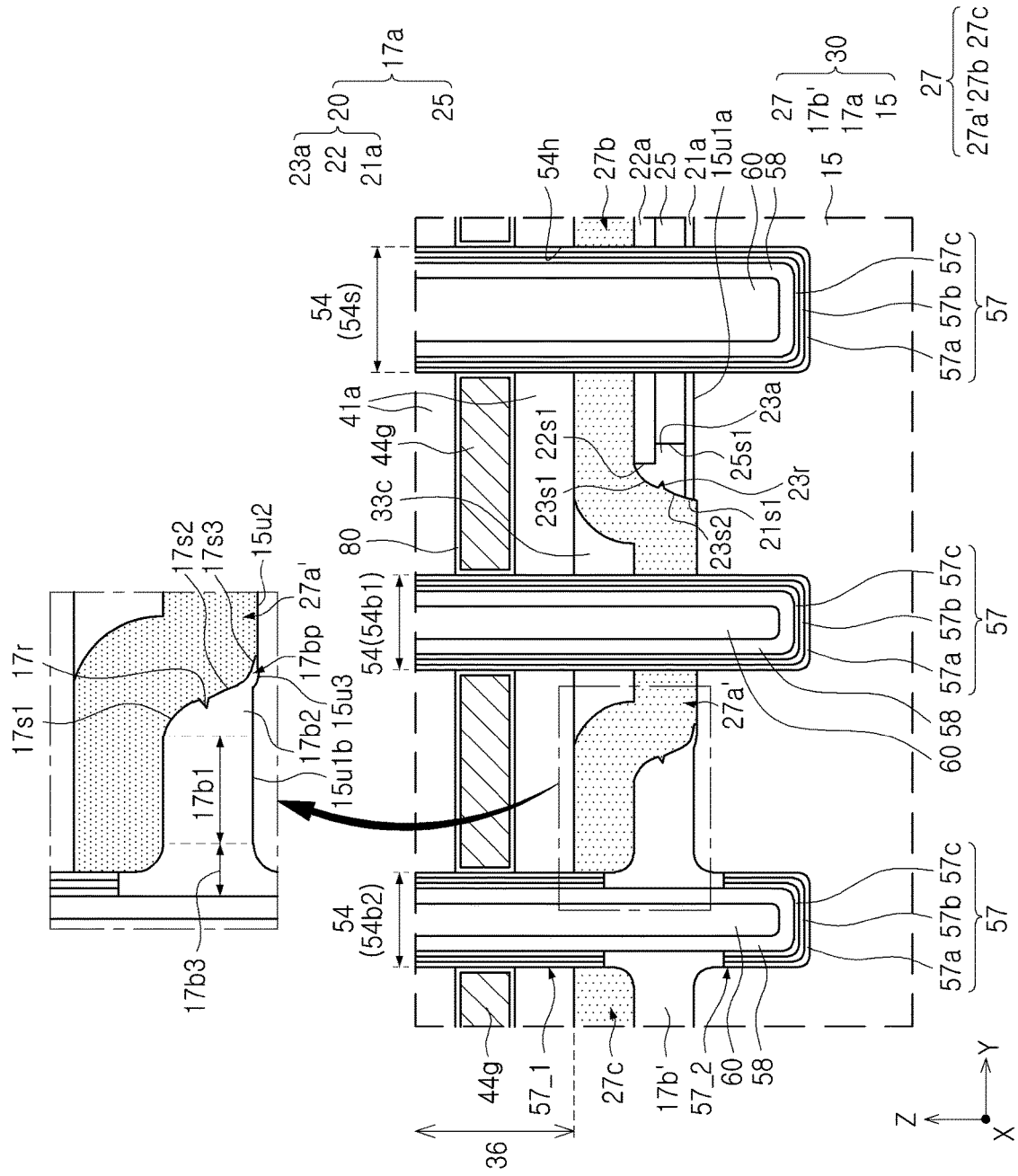
FIG. 15B is a partially enlarged cross-sectional view illustrating a modified example of a semiconductor device, according to an example embodiment.

Referring to FIG. 15B illustrating a modified example, the spacer layer 23 as in FIGS. 5A and 15A may be replaced with a spacer layer 23a as in FIG. 15B. Accordingly, the spacer layer 23a may be in contact with the lower layer 21 and the upper layer 22 as in FIG. 5A, or may contact the lower layer 21a and the upper layer 22a as in FIG. 15A. In this case, the spacer layer 23a contacting the lower layer 21a and the upper layer 22a as in FIG. 15A will be mainly described.

In an example, a first side surface of the spacer layer 23a contacting the upper pattern layer 27 includes an upper side surface 23s1, a lower side surface 23s2, and a recess portion 23r recessed inwardly of the spacer layer 23a, between the upper side surface 23s1 and the lower side surface 23s2.

In an example, the bottom surface of the first upper pattern portion 27a of the upper pattern layer 27 in FIG. 5A or 15A may be located at substantially the same level as the bottom surface of the intermediate structure 17a (see FIG. 15A) and/or the bottom surface of the intermediate pattern layer 17b (see FIG. 15A). The first upper pattern portion 27a of the upper pattern layer 27 in FIG. 5A or 15A may be replaced with a first upper pattern portion 27a' as in FIG. 15B. For example, a bottom surface 15u2 of the first upper pattern portion 27a' may be located on a lower level than a bottom surface 15u1a of the intermediate structure 17a and/or a bottom surface 15u1b of the intermediate pattern layer 17b.

In an example, the intermediate pattern layer 17b as in FIGS. 5A and 15A may be replaced with an intermediate pattern layer 17b' as in FIG. 15B. The intermediate pattern layer 17b' may include a first portion 17b1, a second portion 17b2, and a third portion 17b3.

In the intermediate pattern layer 17b', the first portion 17b1 may be a portion having a substantially uniform thickness, the second portion 17b2 may be a portion of which a thickness decreases while extending in a direction from the first portion 17b1 toward the first upper pattern portion 27a', and the third portion 17b3 may be a portion of which the thickness increases while extending in a direction from the first portion 17b1 toward each of the vertical memory structures 54m and the second vertical buffer structures 54b2. The third portion 17b3 may contact the data storage structure 57 and the channel layer 58 of each of the vertical memory structures 54m and the second vertical buffer structures 54b2.

The first side surface of the second portion 17b2 of the intermediate pattern layer 17b' in contact with the upper pattern layer 27 may include an upper side surface 17s1, a lower side surface 17s2, and a recess portion 17r recessed in the direction toward the inside of the intermediate pattern layer 17b', between the upper side surface 17s1 and the lower side surface 17s2. The upper side surface 17s1 may be lowered while forming a surface curved from the upper surface of the first portion 17b1.

In an example, the intermediate pattern layer 17b' may further include a protruding portion 17bp extending from a lower region of the second portion 17b2 to between the upper pattern layer 27 and the lower pattern layer 15.

The protruding portion 17bp of the intermediate pattern layer 17b' may have a surface 17s3 extending from the lower side surface 17s2 and having a gentler slope than that of the lower side surface 17s2. The lower surface 17s2 of the protruding portion 17bp may extend from the lower side surface 17s2 of the second portion 17b2 to have a gentler slope than that of the lower side surface 17s2 of the second portion 17b2.

In an example, the protruding portion 17*bp* of the intermediate pattern layer 17*b*' may have a bottom surface 15*u*3 disposed on a lower level than the bottom surface 15*u*1*b* of the first and second portions 17*b*1 and 17*b*2. The bottom surface bulb of the first and second portions 17*b*1 and 17*b*2 of the intermediate pattern layer 17*b*' may be disposed at substantially the same level as the bottom surface 15*u*1*a* of the intermediate structure 17*a*.

Figure 15C:
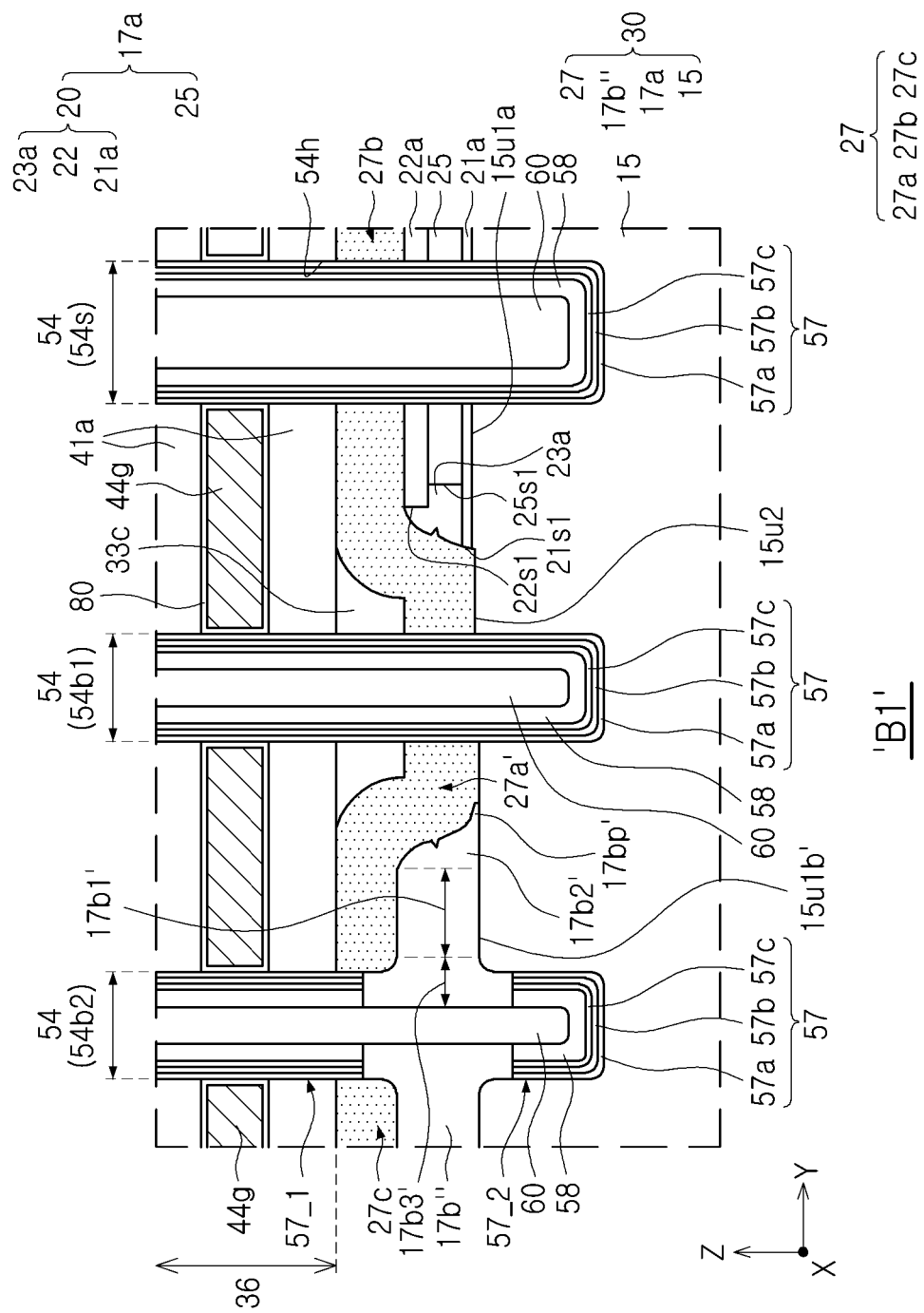
FIG. 15C is a partially enlarged cross-sectional view illustrating a modified example of a semiconductor device, according to an example embodiment.

In a modified example, referring to FIG. 15C, in an example, the intermediate pattern layer (see intermediate pattern layer 17*b* in FIGS. 5A and 15A and intermediate pattern layer 17*b*' in FIG. 15B) spaced apart from the core region 60 as in FIGS. 5A, 15A, and 15B may be replaced with an intermediate pattern layer 17*b*" in contact with the core region 60 as in FIG. 15C.

In an example, the intermediate pattern layer 17*b*" may include a first portion 17*b* 1', a second portion 17*b*2', and a third portion 17*b*3'. In the intermediate pattern layer 17*b*", the first portion 17*b*1' may be a portion having a substantially uniform thickness, the second portion 17*b*2' may be a portion of which a thickness decreases while extending in a direction from the first portion 17*b*1' toward the first upper pattern portion 27*a*' as described in FIG. 15B, and the third portion 17*b*3' may be a portion that penetrates through the data storage structure 57 and the channel layer 58 and contacts the core region 60, while extending in a direction from the first portion 17*b*1' toward the respective vertical memory structures 54*m* and second vertical buffer structures 54*b*2.

In an example, the intermediate pattern layer 17*b*" may further include a protruding portion 17*bp*' extending from the lower region of the second portion 7*b*2' to between the upper pattern layer 27 and the lower pattern layer 15. The protruding portion 17*bp*' may have a surface substantially the same as the surface 17*s* 3 of the protruding portion 17*bp* described in FIG. 15B.

In an example, the thickness of the first portion 17*b*1' of the intermediate pattern layer 17*b*" may be greater than the thickness of the intermediate structure 17*a*.

Figure 15D:
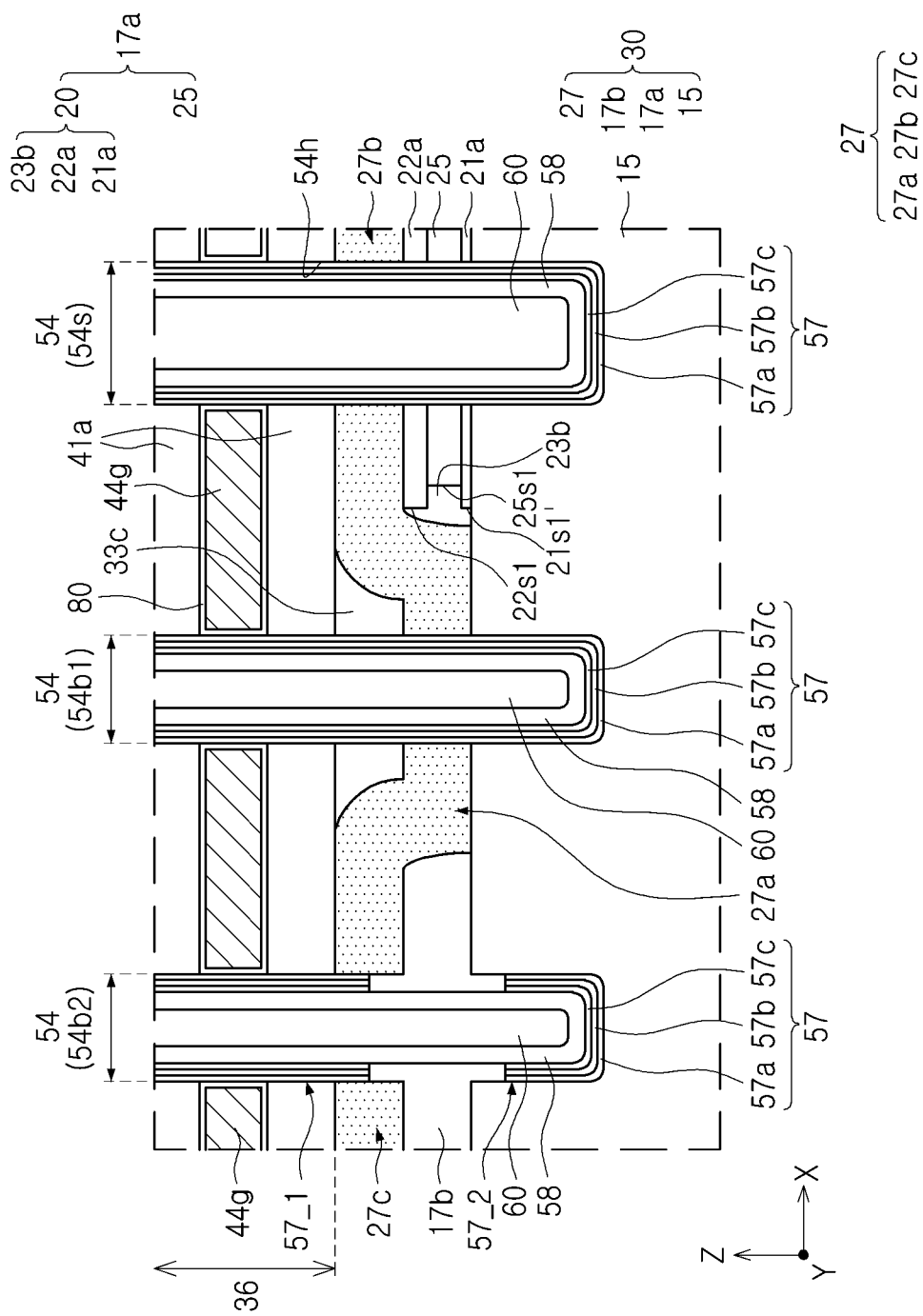
FIG. 15D is a partially enlarged cross-sectional view illustrating a modified example of a semiconductor device, according to an example embodiment.

In a modified example, referring to FIG. 15D, the side surface 21*s* of the lower layer 21 of the intermediate structure 17*a* as in FIGS. 5A, 15A, 15B, and 15C described above may not be aligned with the side surfaces 22*s*1 of the upper layers 22 and 22*a*, and the spacer layer (see spacer layer 23 in FIGS. 5A and 15A and spacer layer 23*a* in FIGS. 15B and 15C) may be spaced apart from the lower pattern layer 15. As such, the lower layer 21 and the spacer layer (see spacer layer 23 in FIGS. 5A and 15A and see spacer layer 23*a* in FIGS. 5B and 15C) as in FIGS. 5A, 15A, 15B and 15C may be replaced with a lower layer 21*a* and a spacer 23*b* of FIG. 13D, respectively. For example, the spacer 23*b* contacts the side surface 21*s*1' of the lower layer 21*a*, the side surface 25*s*1 of the second intermediate layer 25, and the side surface 22*s*1 of the upper layer 22*a* and may be in contact with the lower pattern layer 15. The side surface 21*s*1' of the lower layer 21*a* may be substantially aligned with the side surface 22*s*1 of the upper layer 22*a*.

Figure 16A:
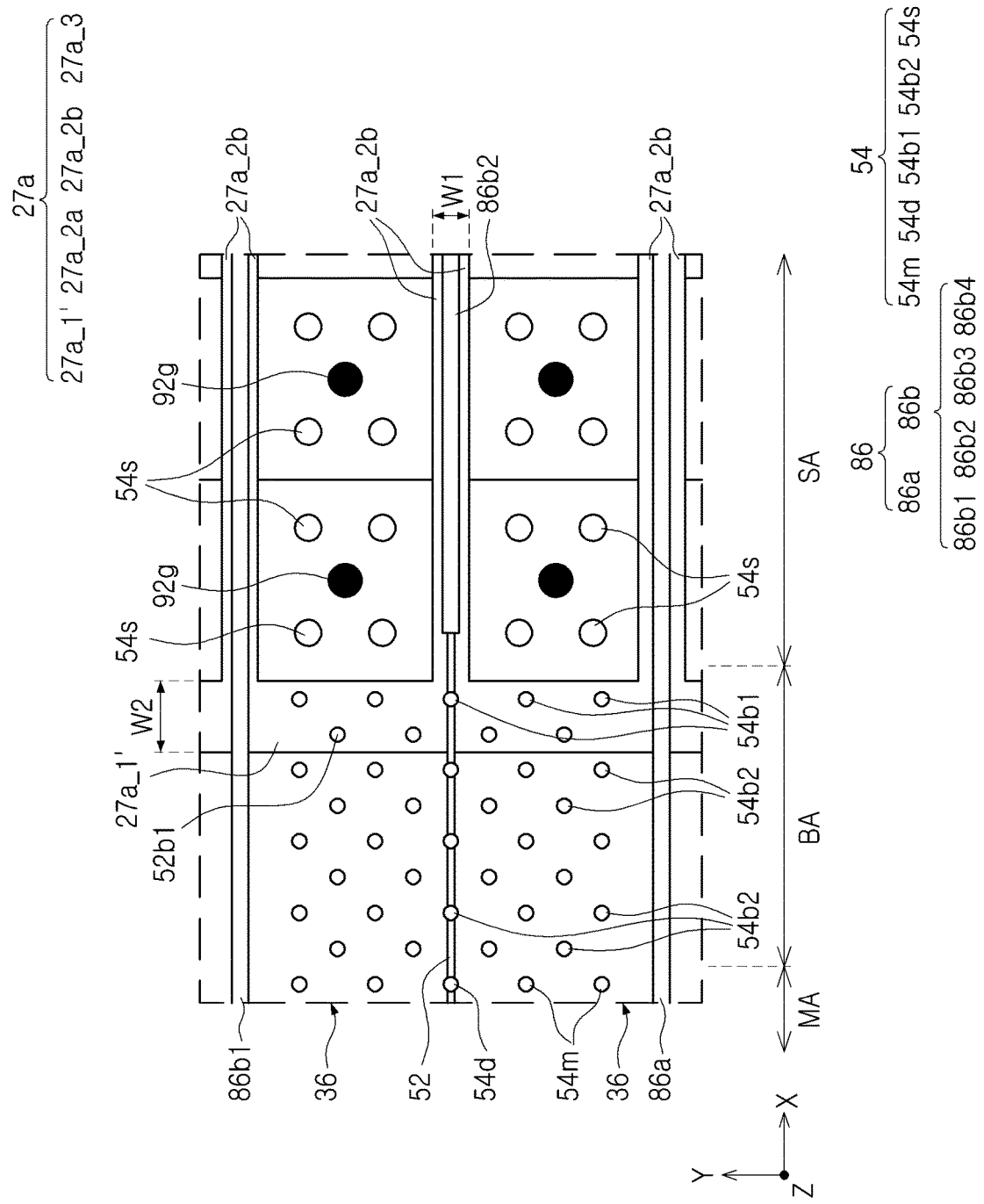
FIG. 16A is a partially enlarged plan view illustrating a modified example of a semiconductor device, according to an example embodiment.
Figure 16B:
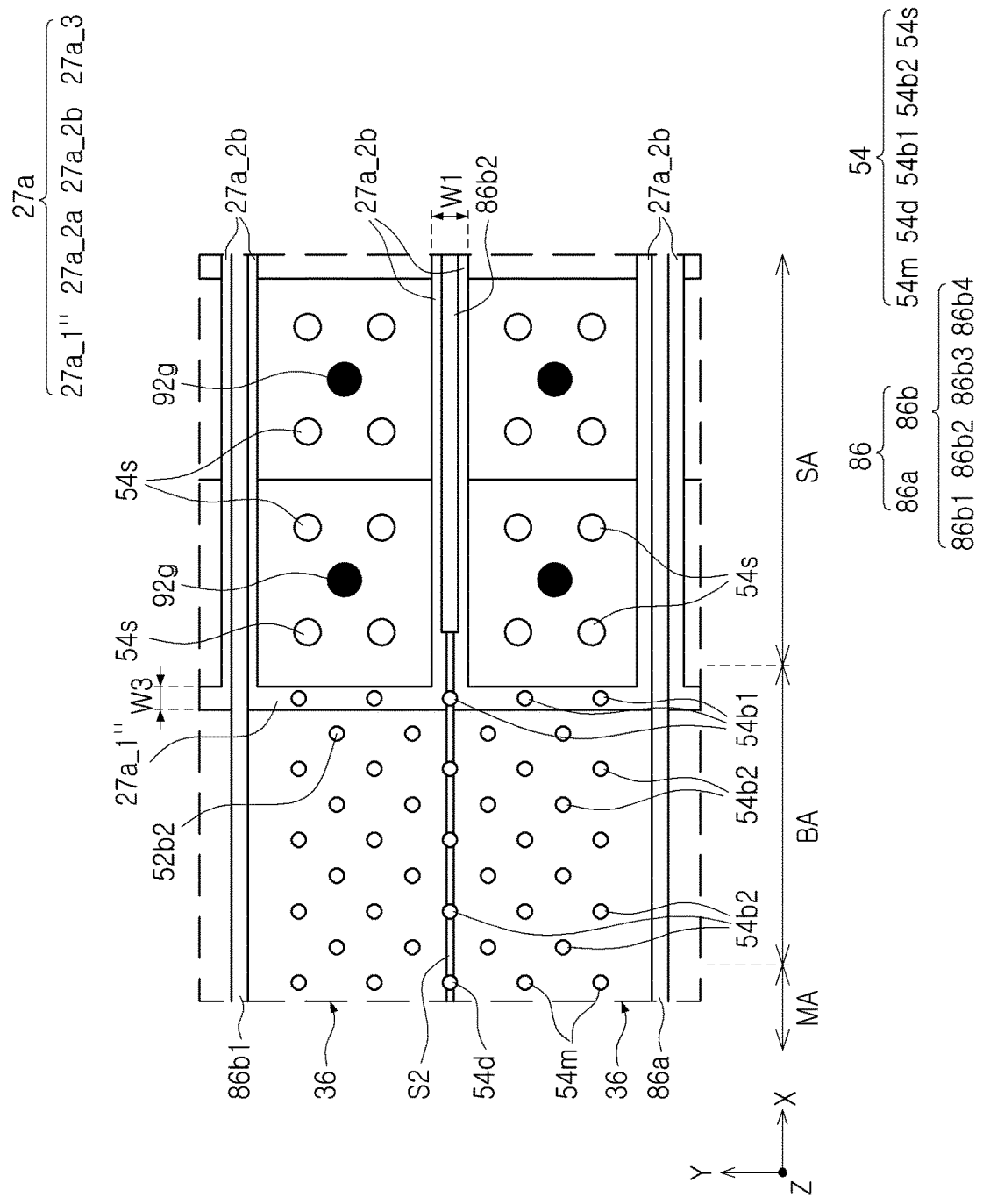
FIG. 16B is a partially enlarged cross-sectional view illustrating a modified example of a semiconductor device, according to an example embodiment.

Next, modified examples of the semiconductor device according to an example embodiment will be described with reference to FIGS. 16A and 16B, respectively. FIGS. 16A and 16B are partially enlarged plan views illustrating an example modified from the partially enlarged plan view of FIG. 3A.

In a modified example, referring to FIG. 16A, the first upper pattern portion 27*a* as described in FIG. 3A may include the first line portion 27*a*_1 extending in the second horizontal direction Y, and the plurality of second line portions 27*a*_2*a* and 27*a*_2*b* extending in the first horizontal direction X from the first line portion 27*a*_1. In FIG. 3A, the width of each of the plurality of second line portions 27*a*_2*a* and 27*a*_2*b* in the second horizontal direction Y may be substantially the same as the width of the first line portion 27*a*_1 in the first horizontal direction X. The first line portion 27*a*_1 as in FIG. 3A may be replaced with a first line portion 27*a*_1' having an increased width W2 as in FIG. 16A. The width W2 of the first line portion 27*a*_1' may be greater than a width W1 of each of the plurality of second line portions 27*a*_2*a* and 27*a*_2*b*.

In a modified example, referring to FIG. 16B, the first line portion 27*a*_1 as in FIG. 3A may be replaced with a first line portion 27*a*_1" having a reduced width W3 as in FIG. 16B. The width W3 of the first line portion 27*a*_1" may be greater than the width W1 of each of the plurality of second line portions 27*a*_2*a* and 27*a*_2*b*.

Figure 17:
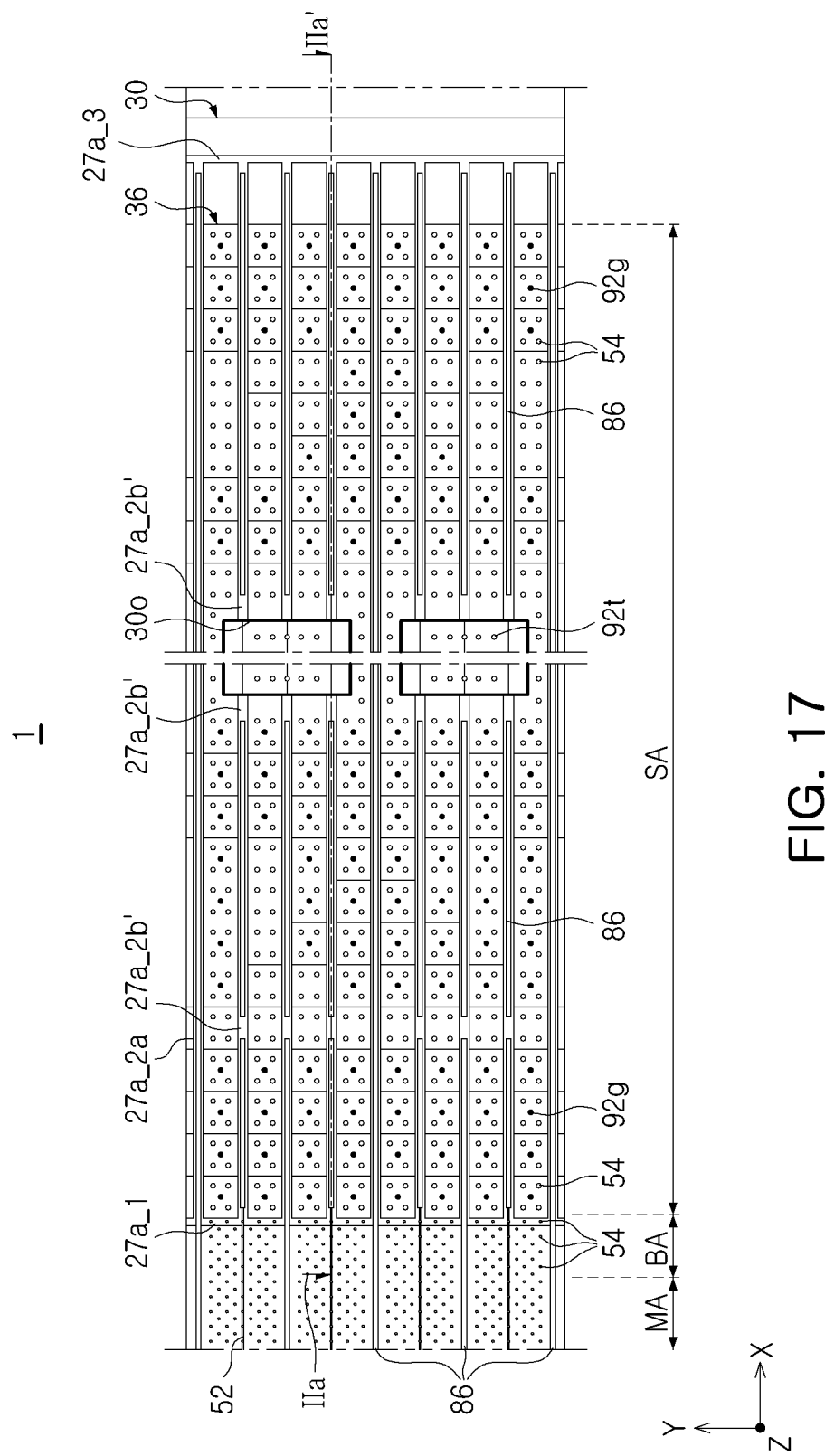
FIGS. 17 and 18A-18B are diagrams illustrating a modified example of a semiconductor device, according to an example embodiment.
Figure 18A:
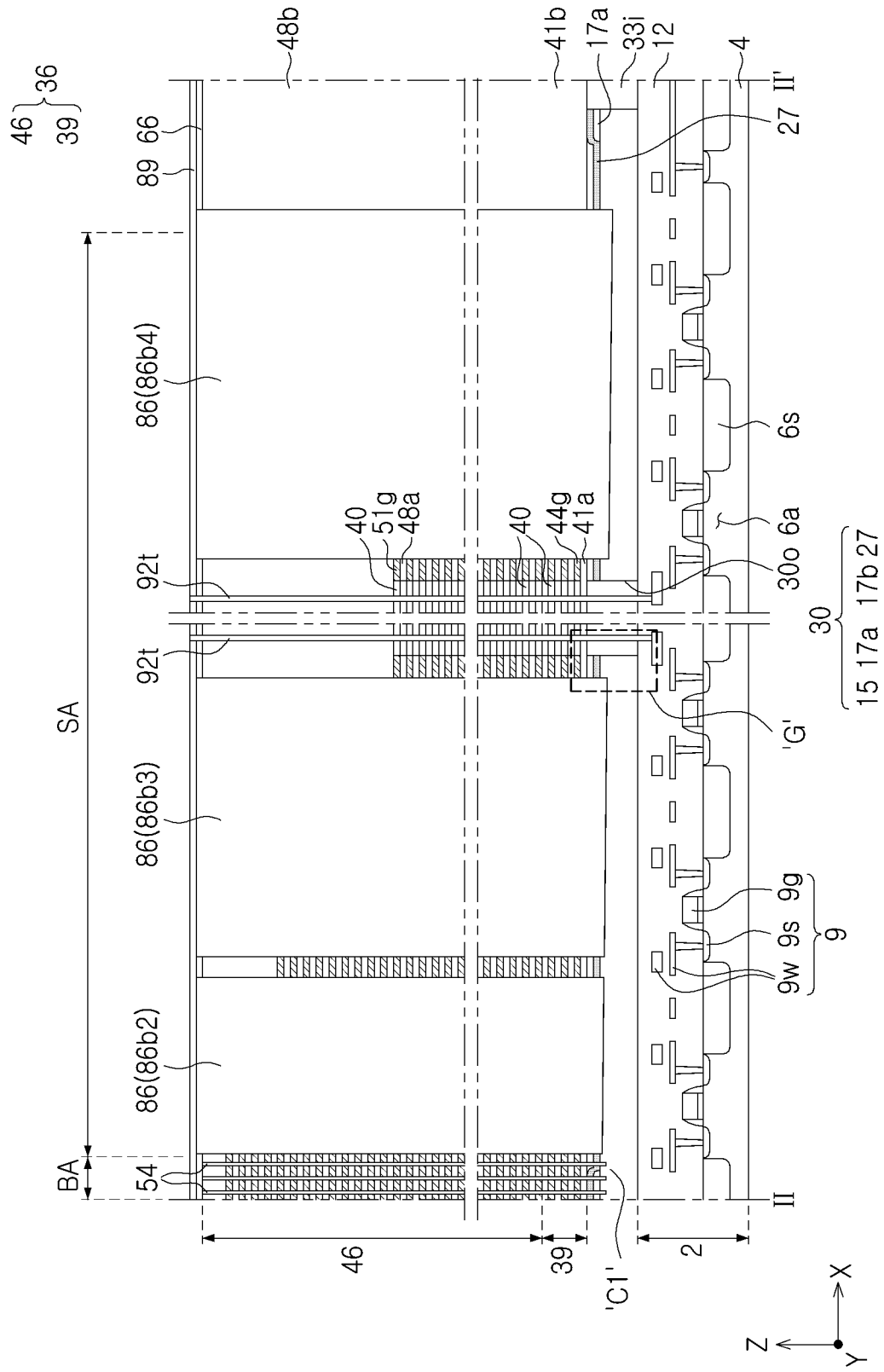

A modified example of a semiconductor device according to an example embodiment will be described with reference to FIGS. 17 to 18B. FIG. 17 is a plan view illustrating a deformed portion in the plan view of FIG. 2A, FIG. 18A is a cross-sectional view illustrating a region taken along line IIa-IIa' of FIG. 17, and FIG. 18B is an enlarged view of a portion indicated by 'G' FIG. ISA.

Figure 18B:
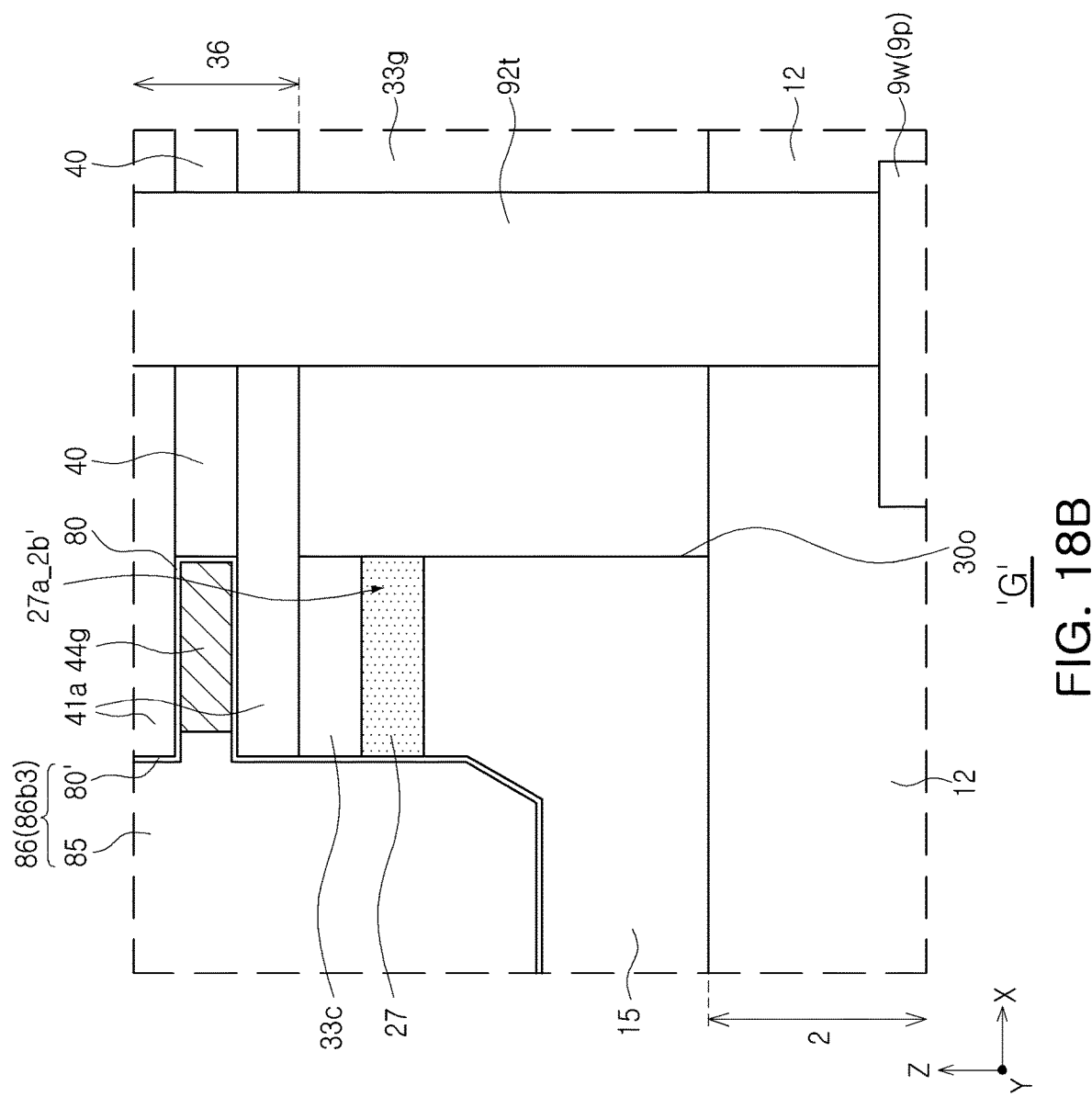

Referring to FIGS. 17 to 18B, as in FIGS. 2A, 2B, 6, and 7C described above, among the plurality of second line portions 27*a*_2*a* and 27*a*_2*b* of the first upper pattern portion 27*a*, the second portions 27*a*_2*b* may be spaced apart from the gap-fill insulating layer 33*g*, and the intermediate structure 17*a* may be disposed between the first upper pattern portion 27*a* and the gap-fill insulating layer 33*g*. FIGS. 2A, 2B, 6, and 7C, the second portions 27*a*_2*b* of the first upper pattern portion 27*a*, which may be spaced apart from the gap-fill insulating layer 33*g*, may be replaced with the second portions 27*a*_2*b*' which may extend to contact the gap-fill insulating layer 33*g*, as in FIGS. 17 to 18B. In this case, the gap-fill insulating layer 33*g* may be described as the opening 30*o* of the pattern structure 30.

Figure 19A:
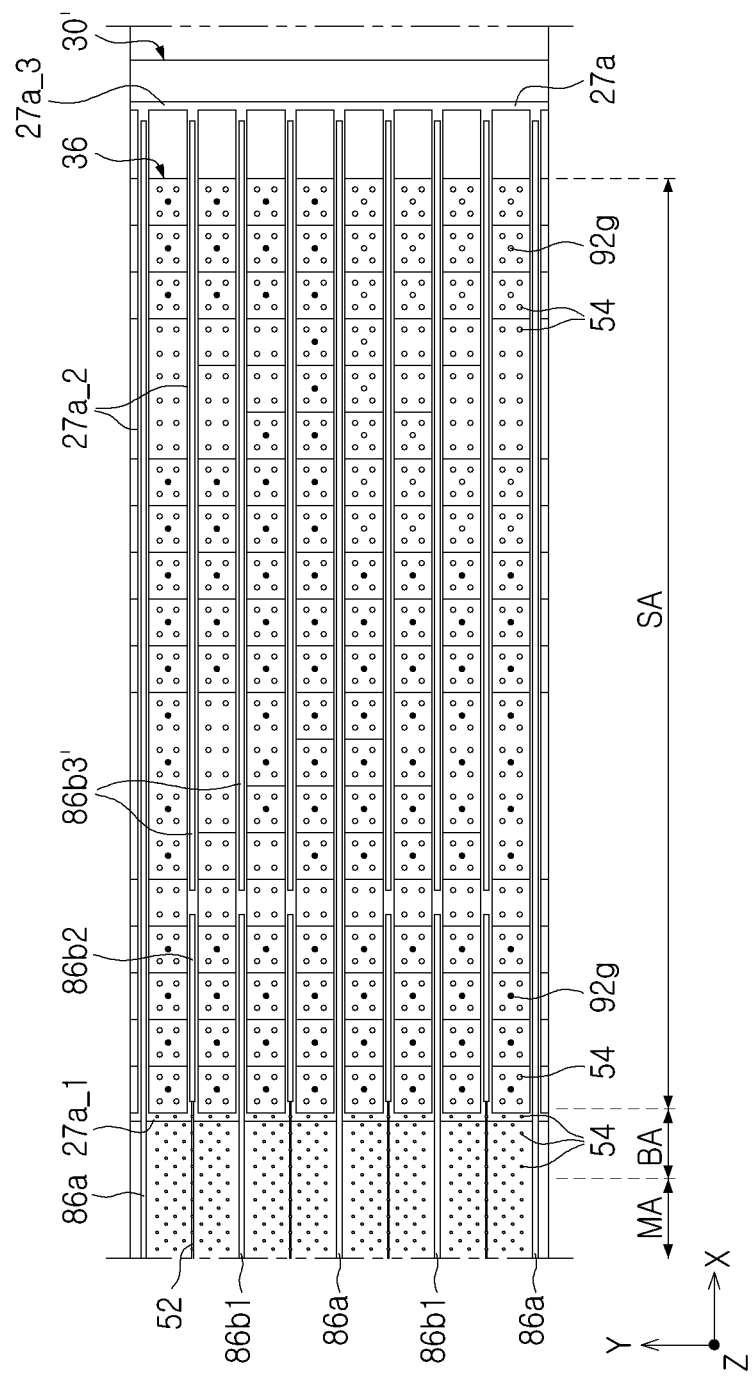
FIGS. 19A and 19B are diagrams illustrating a modified example of a semiconductor device, according to an example embodiment.

Next, a modified example of a semiconductor device according to an example embodiment will be described with reference to FIGS. 19A and 19B. FIG. 19A is a plan view illustrating a modified portion of the plan view of FIG. 2A, and FIG. 19B is a plan view illustrating some components of FIG. 19A.

Figure 19B:
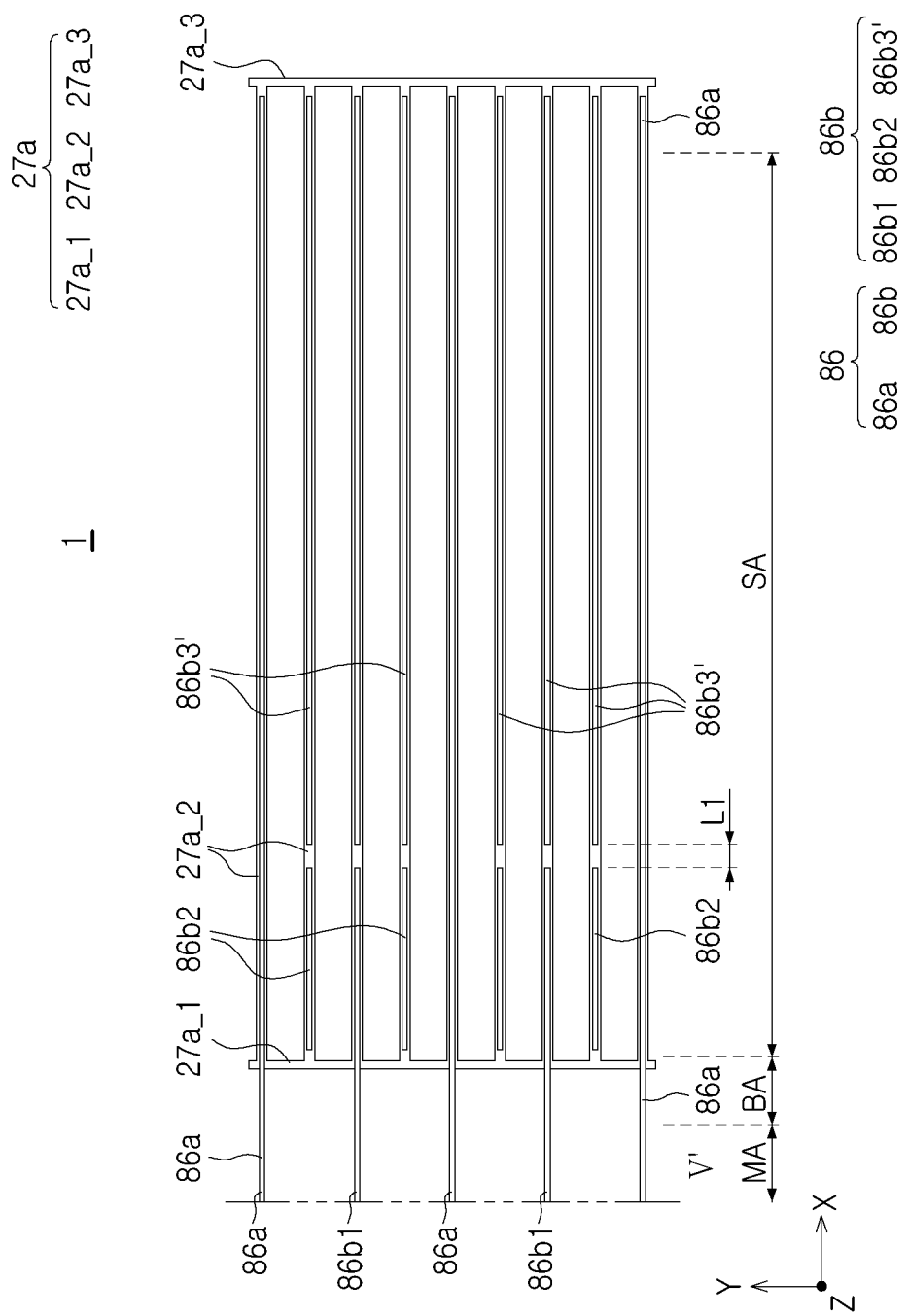

Referring to FIGS. 19A and 19B, the pattern structure 30 including the opening 30*o* as in FIG. 2A may be replaced with a pattern structure 30' as in FIG. 19A not including the opening 30*o*. The second portions 27*a*_2*b* of the first upper pattern portion 27*a* as in FIGS. 2A and 2B may be replaced with line-shaped second portions 27*a*_2 continuously extending from the first line portion 27*a*_1 to the third line portion 27*a*_3 as illustrated in FIGS. 19A and 19B. The third and fourth auxiliary separation structures 86*b*3 and 86*b*4 spaced apart from each other as described in FIGS. 2A and 2B may be replaced by auxiliary separation structures 86*b*3' that are continuously connected.

Figure 23A:
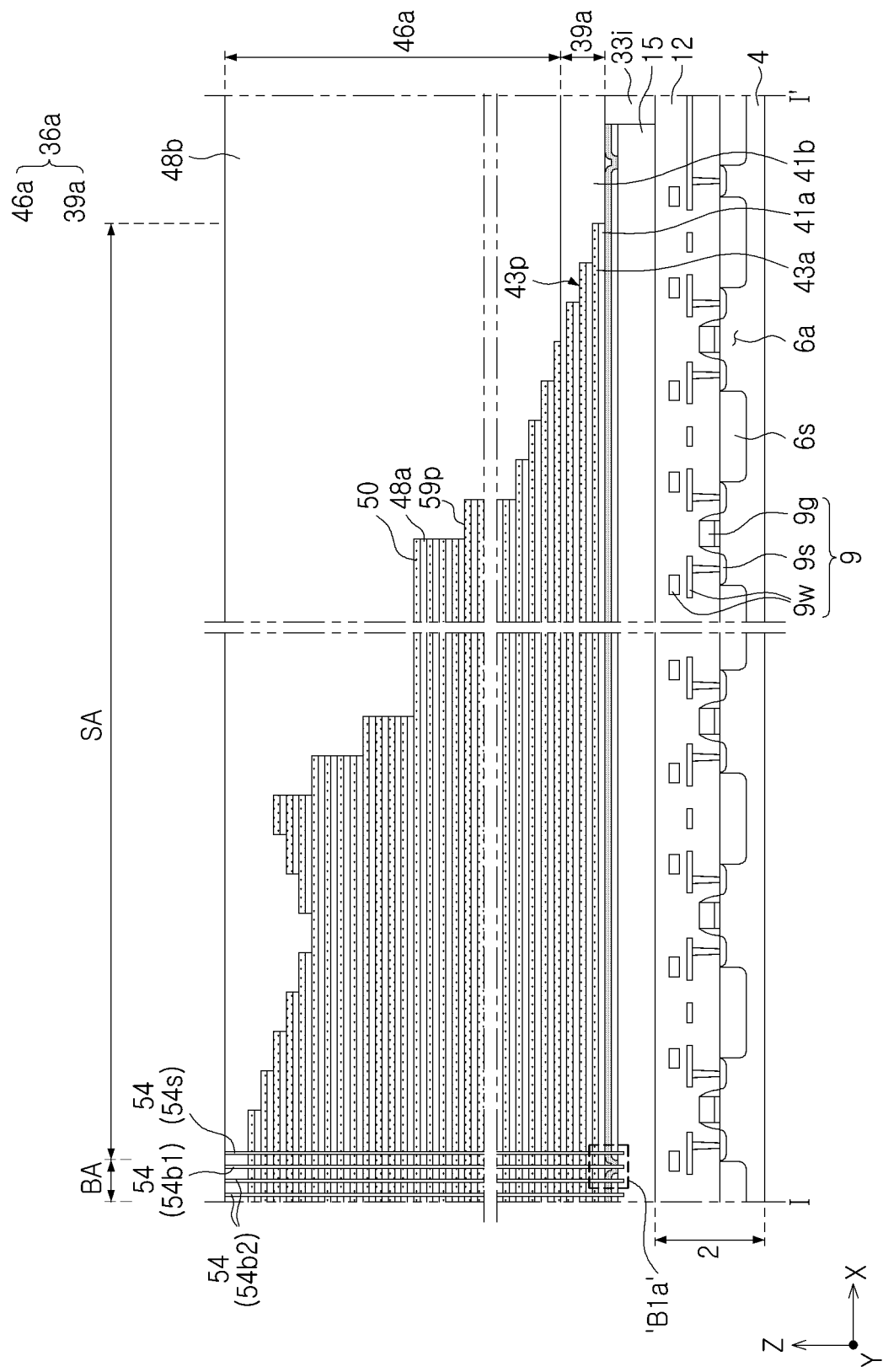
Figure 23B:
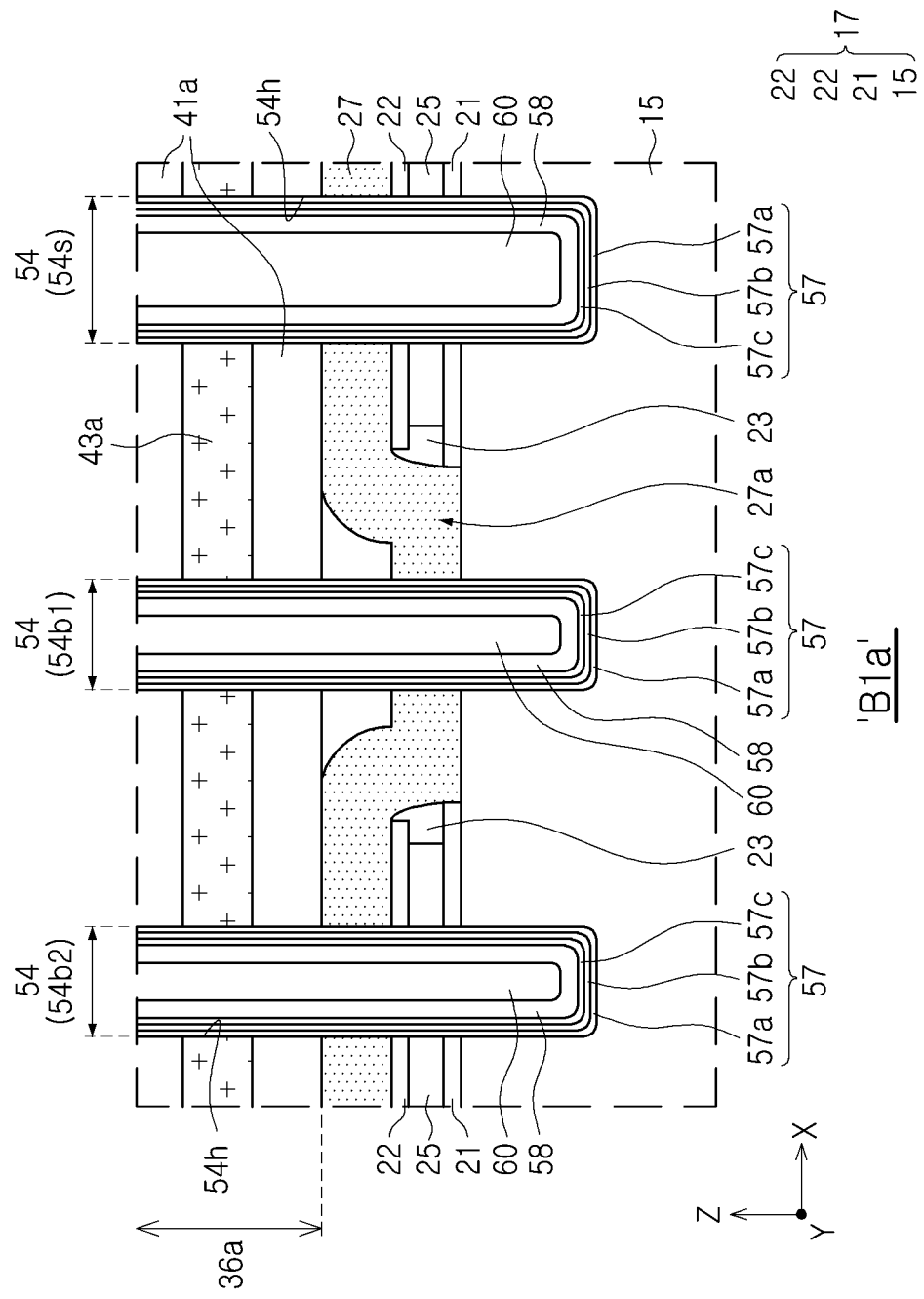
Figure 24A:
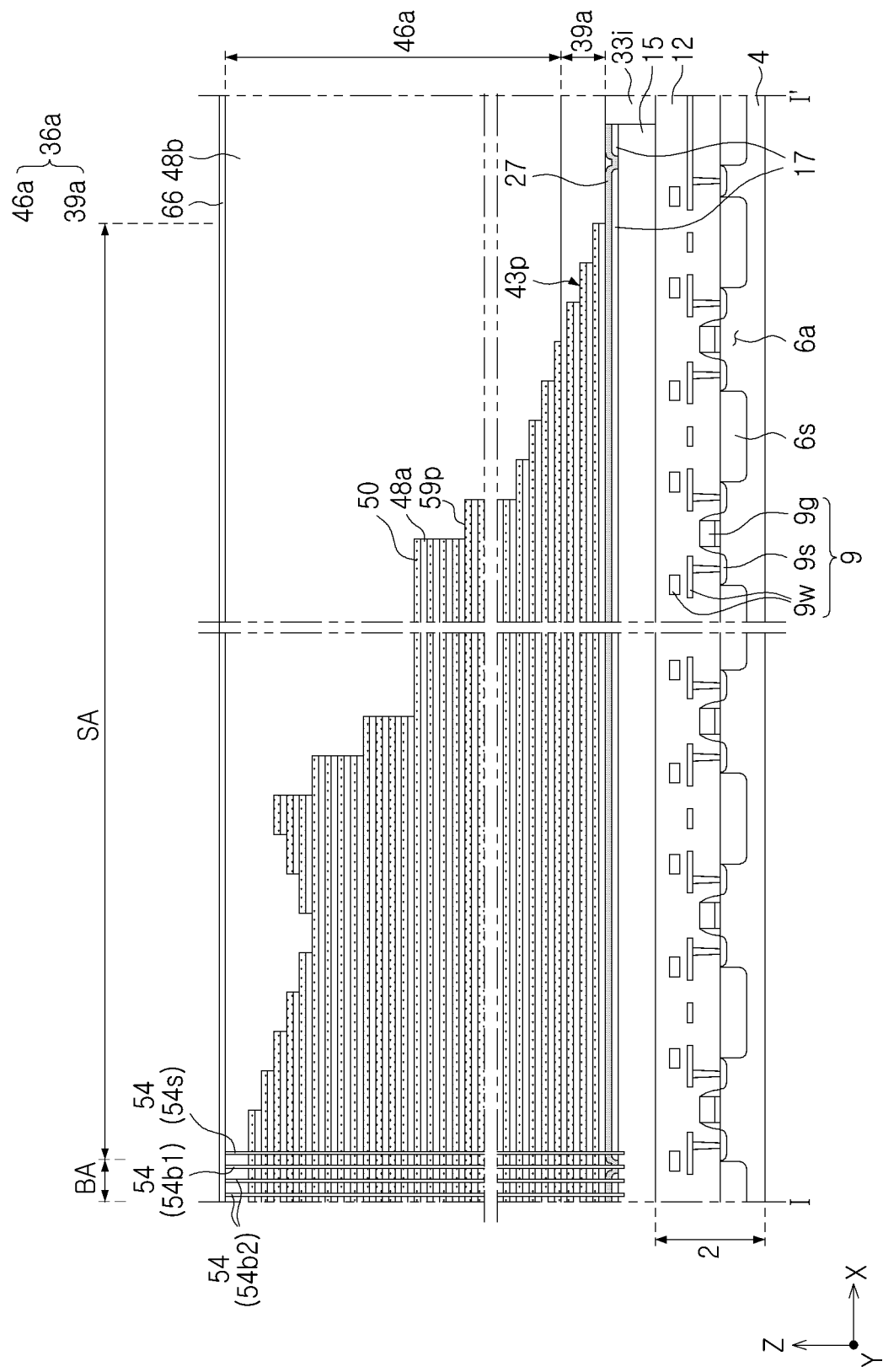
Figure 24B:
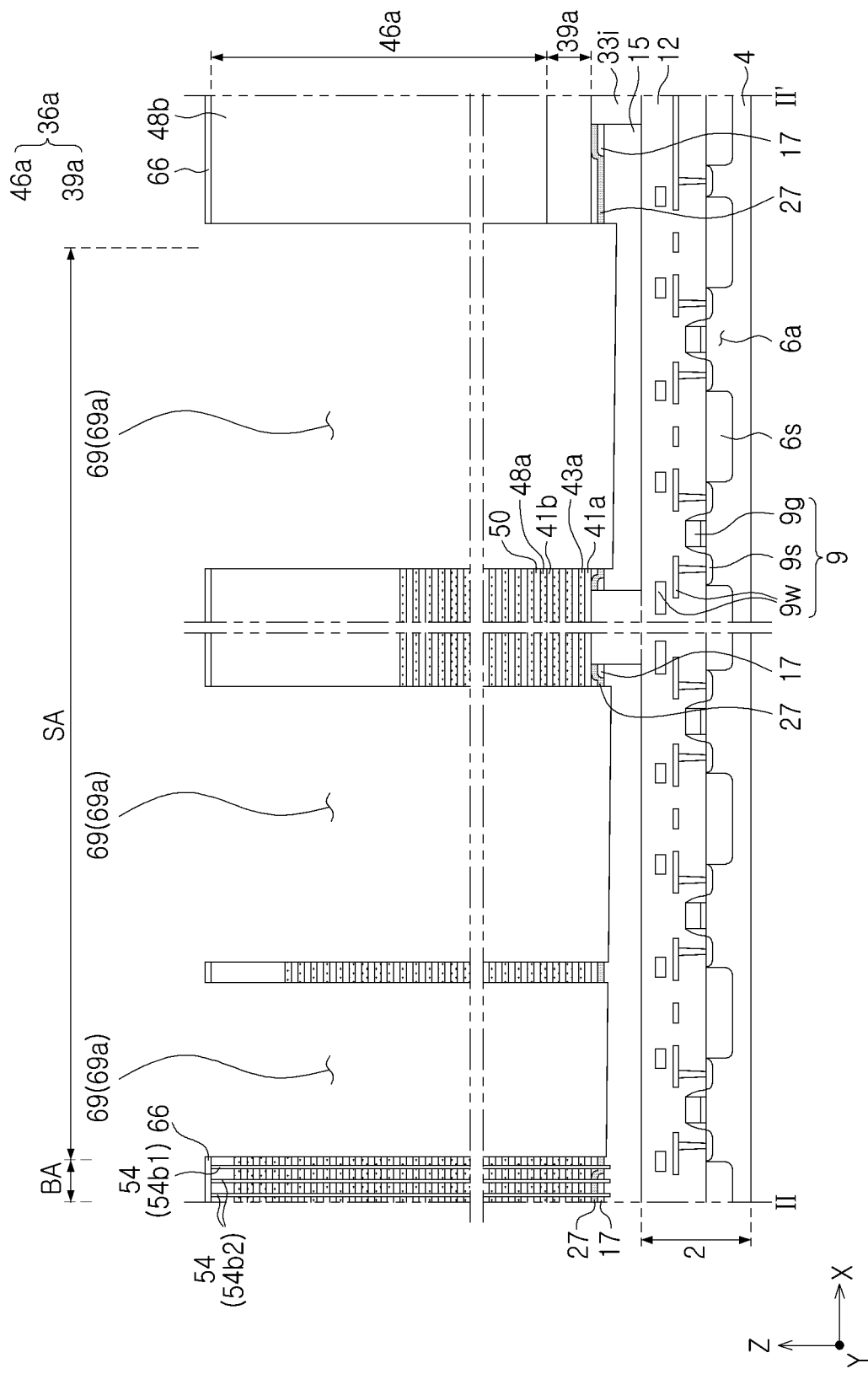

Next, a method of forming a semiconductor device according to an example embodiment will be described with reference to FIGS. 20A to 28. In FIGS. 20A to 28, FIGS. 20, 21, 22A, 23A, and 24A are cross-sectional views illustrating a region taken along line I-I' of FIG. 2A, FIGS. 22B and 24B are cross-sectional views illustrating a region taken along line I-I' of FIG. 2A, FIG. 23B is a partially enlarged cross-sectional view illustrating an enlarged portion of a portion indicated by 'B1*a*' in FIG. 23A, FIG. 24D is a partially enlarged view of a portion indicated by 'Fa' in FIG.

Figure 24C:
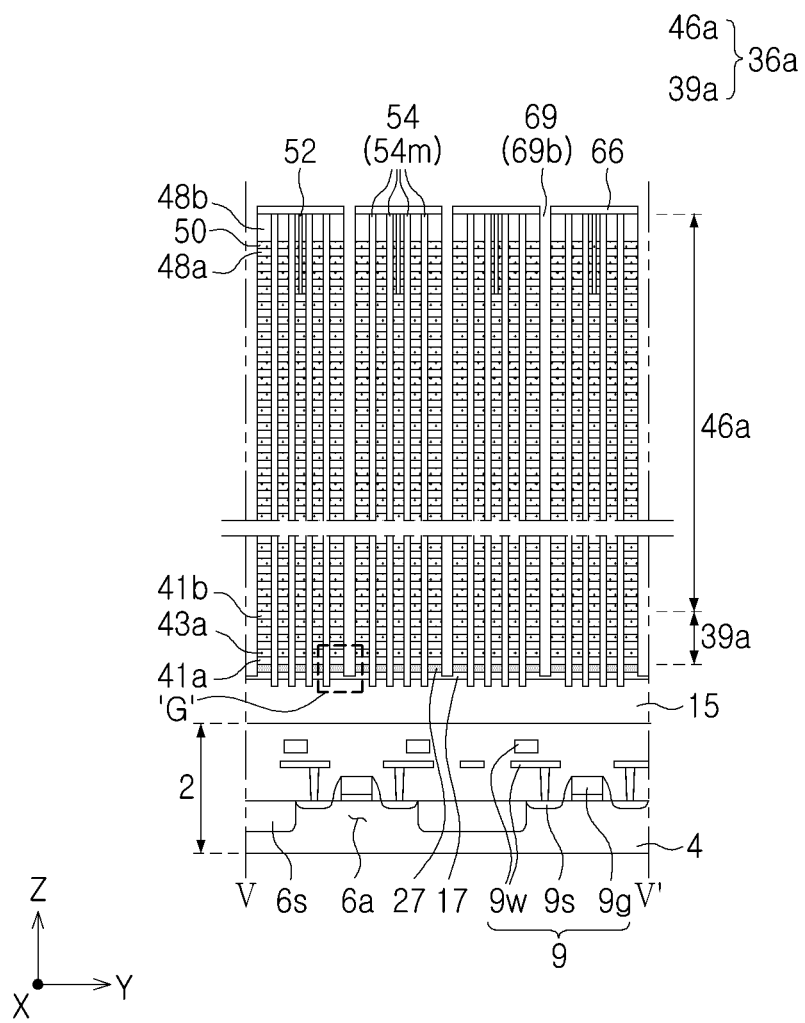
Figure 24D:
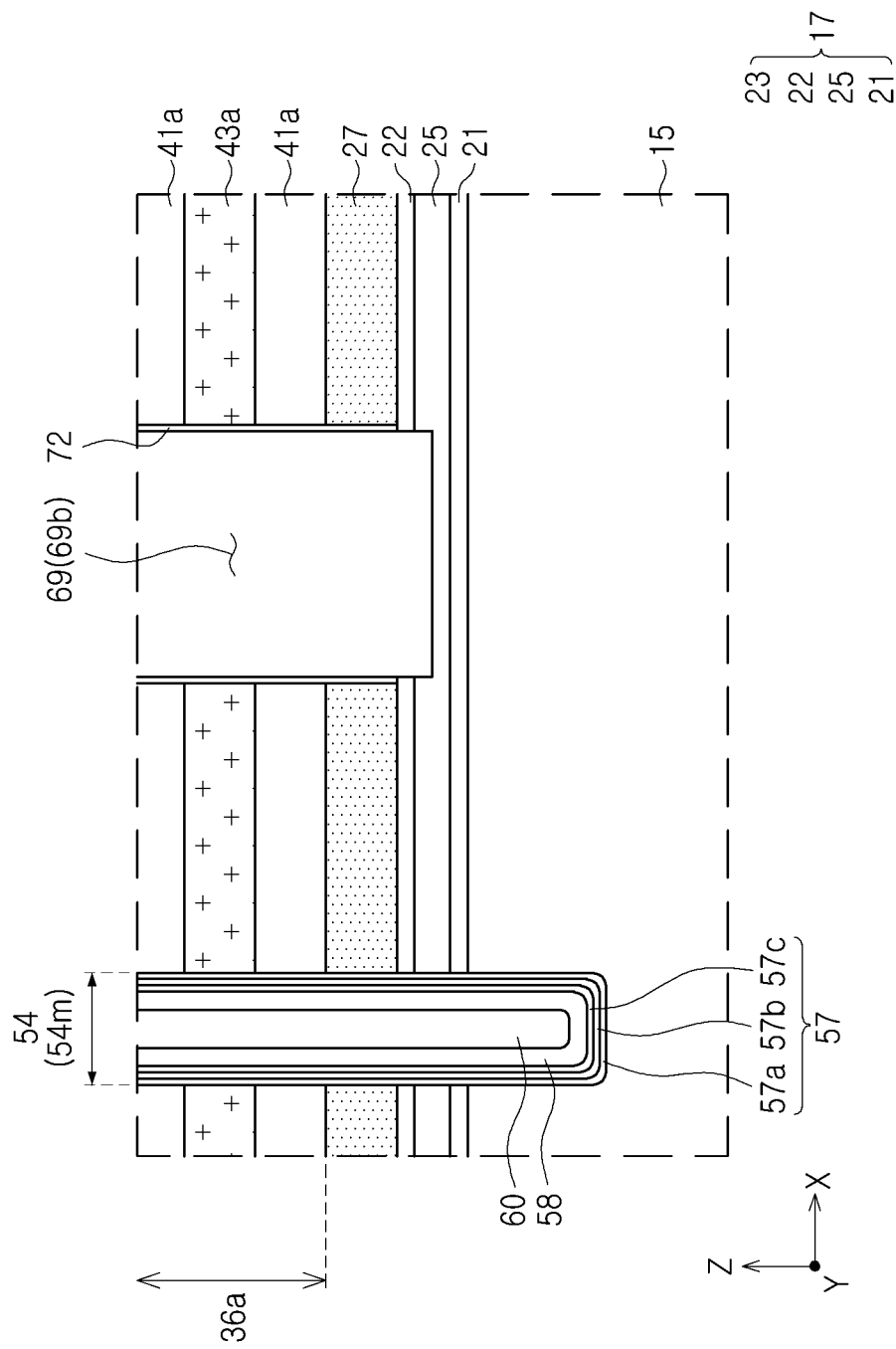

24C, and FIGS. 25 to 28 are partially enlarged views corresponding to the partially enlarged view of FIG. 24C.

Figure 20:
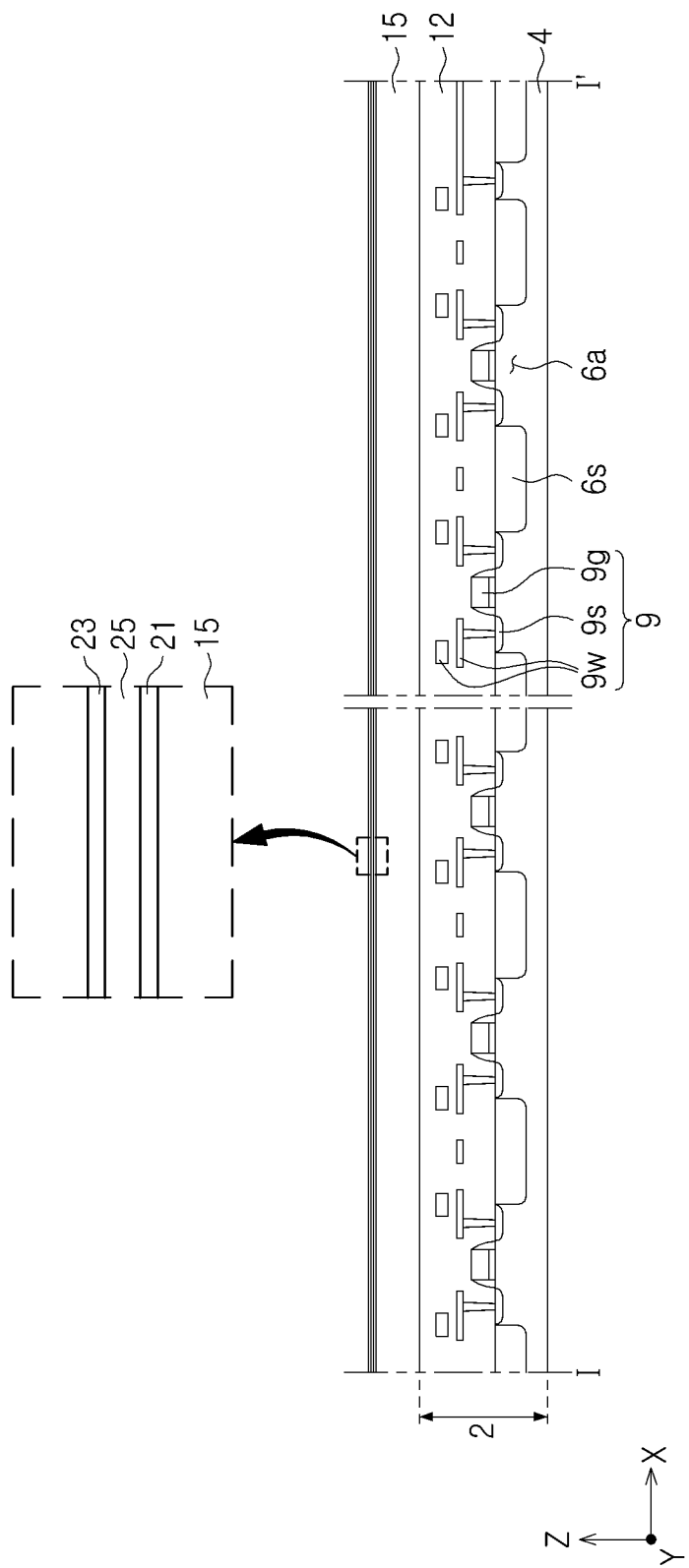
FIGS. 20-21, 22A-22B, 23A-23B, 24A-24D, and 25-28 are diagrams illustrating a method of forming a semiconductor device, according to an example embodiment.

Referring to FIGS. 2A and 20, a lower structure 2 may be formed. Forming the lower structure 2 may include preparing a substrate 4 and forming a peripheral circuit 9 and a lower insulating layer 12 on the substrate 4. The peripheral circuit 9 may include a peripheral gate 9g, a peripheral source/drain 9s, and a peripheral wiring 9w as described in FIG. 4. The lower insulating layer 12 may cover the peripheral circuit 9.

A lower pattern layer 15 may be formed on the lower structure 2. The lower pattern layer 15 may be formed of a silicon layer. For example, the lower pattern layer 15 may be formed of a doped silicon layer. For example, the lower pattern layer 15 may be formed of a polysilicon layer of which at least a portion has N-type conductivity.

A first layer 21, a second layer 25, and a third layer 22 stacked in order on the lower pattern layer 15 may be formed. A lower surface of the second layer 25 may contact an upper surface of the first layer 21, and a lower surface of the third layer 22 may contact an upper surface of the second layer 25.

In an example, the second layer 25 may be formed of a material having etch selectivity with the first layer 21 and the third layer 22. For example, the first layer 21 and the third layer 22 may be formed of a silicon oxide or silicon oxide-based insulating material, and the second layer 25 may be formed of a silicon nitride or a silicon nitride-based insulating material. In another example, the first layer 21 and the third layer 22 may be formed of an insulating material, and the second layer 25 may be formed of silicon.

In an example, the first layer 21, the second layer 25, and the third layer 22 may be formed to have the same thickness as each other.

In another example, the second layer 25 may be thicker than each of the first and third layers 21 and 22.

In another example, the third layer 22 may be thicker than the first layer 21.

Figure 21:
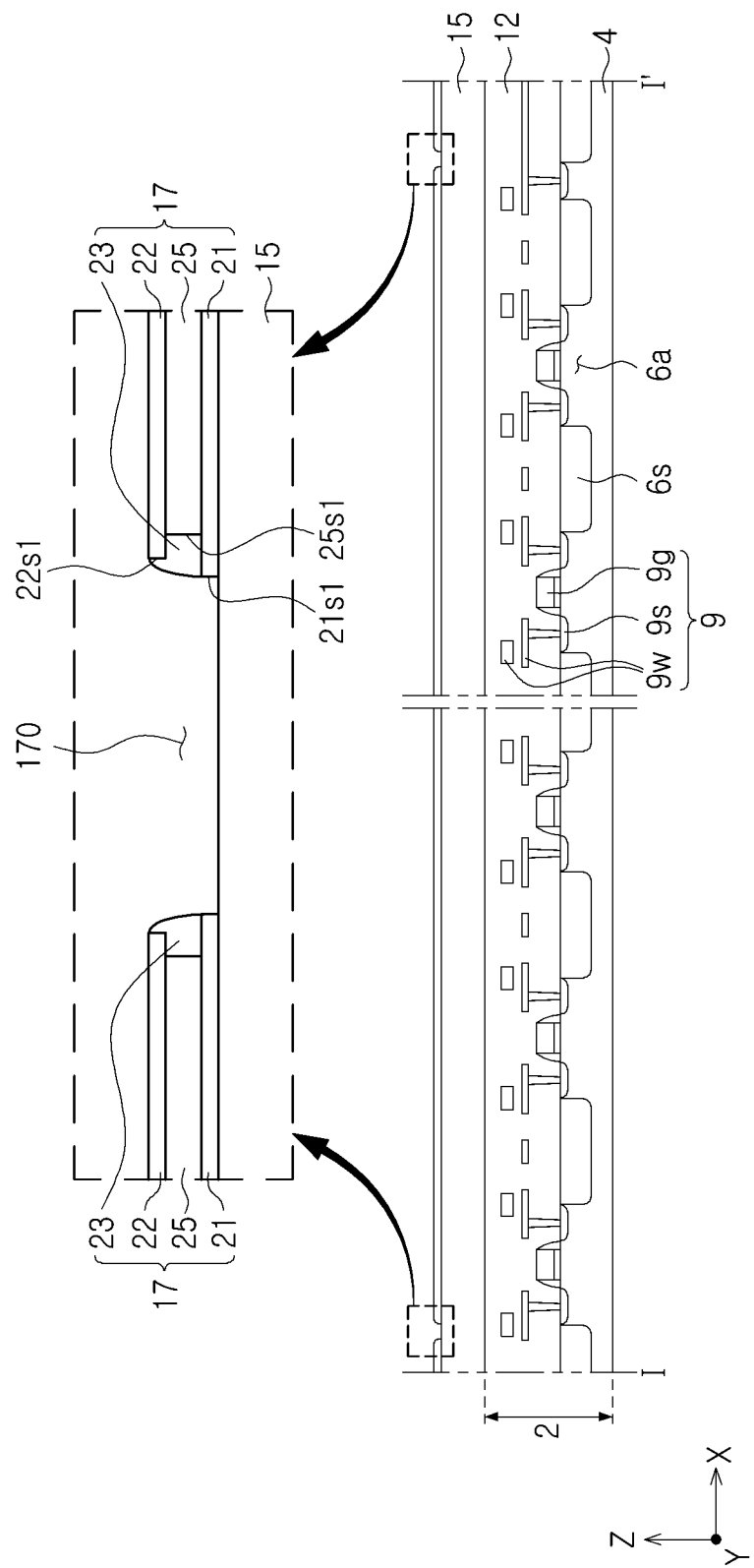

Referring to FIGS. 2A and 21, in some regions, the third layer 22 may be etched to expose the second layer 25. The third layer 22 may have a first side surface 22s formed by exposing the second layer 25.

The first layer 21 may be exposed by isotropically etching the second layer 25.

In an example, the second layer 25 may be etched and recessed from the first side surface 22s1 of the third layer 22. Thus, the second layer 25 may have a first side surface 25s1 which is formed below the lower surface of the third layer 22 while being not vertically aligned with the first side surface 22s1 of the third layer 22.

On the first layer 21, a spacer layer 23 contacting the first side surface 22s1 of the third layer 22 and the first side surface 25s1 of the second layer 25 may be formed.

After forming the spacer layer 23, the first layer 21 may be etched to expose the lower pattern layer 15. The first layer 21 may have a first side surface 21s1.

In an example, the spacer layer 23 may be formed of a material having etch selectivity with the second layer 25. For example, the spacer layer 23 may be formed of silicon oxide or a silicon oxide-based insulating material.

In an example, the first and third layers 21 and 22 may be formed of a harder material than the spacer layer 23. For example, the first and third layers 21 and 22 may be silicon oxide formed at a higher temperature than the spacer layer 23.

In an example, the third layer 22 may be formed of a harder material than that of the first layer 21.

The first, second, and third layers 21, 25, and 22 and the spacer layer 23 may be referred to as a preliminary intermediate pattern 17. Accordingly, the preliminary intermediate pattern 17 may have an intermediate opening 17o exposing the lower pattern layer 15.

Figure 22A:
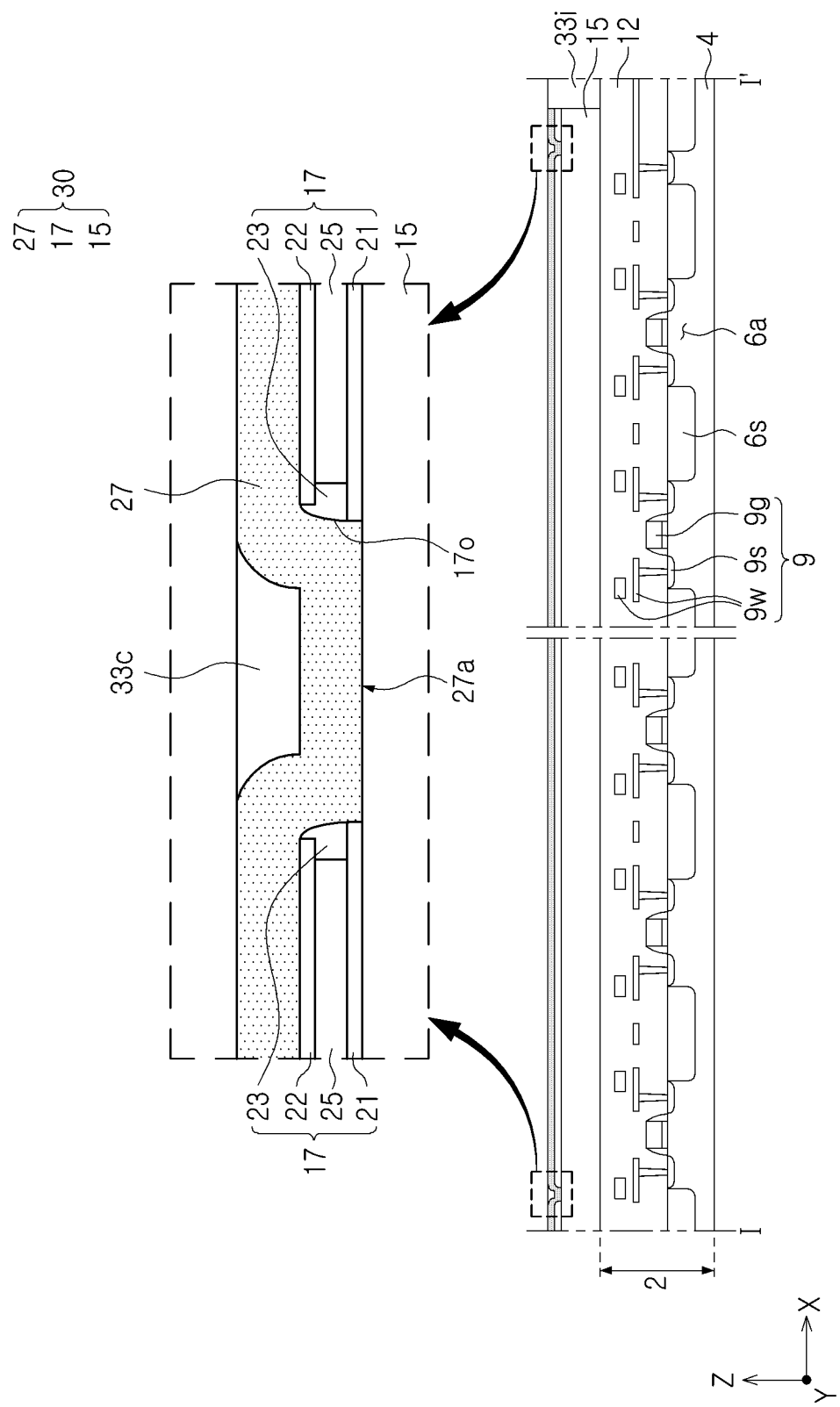
Figure 22B:
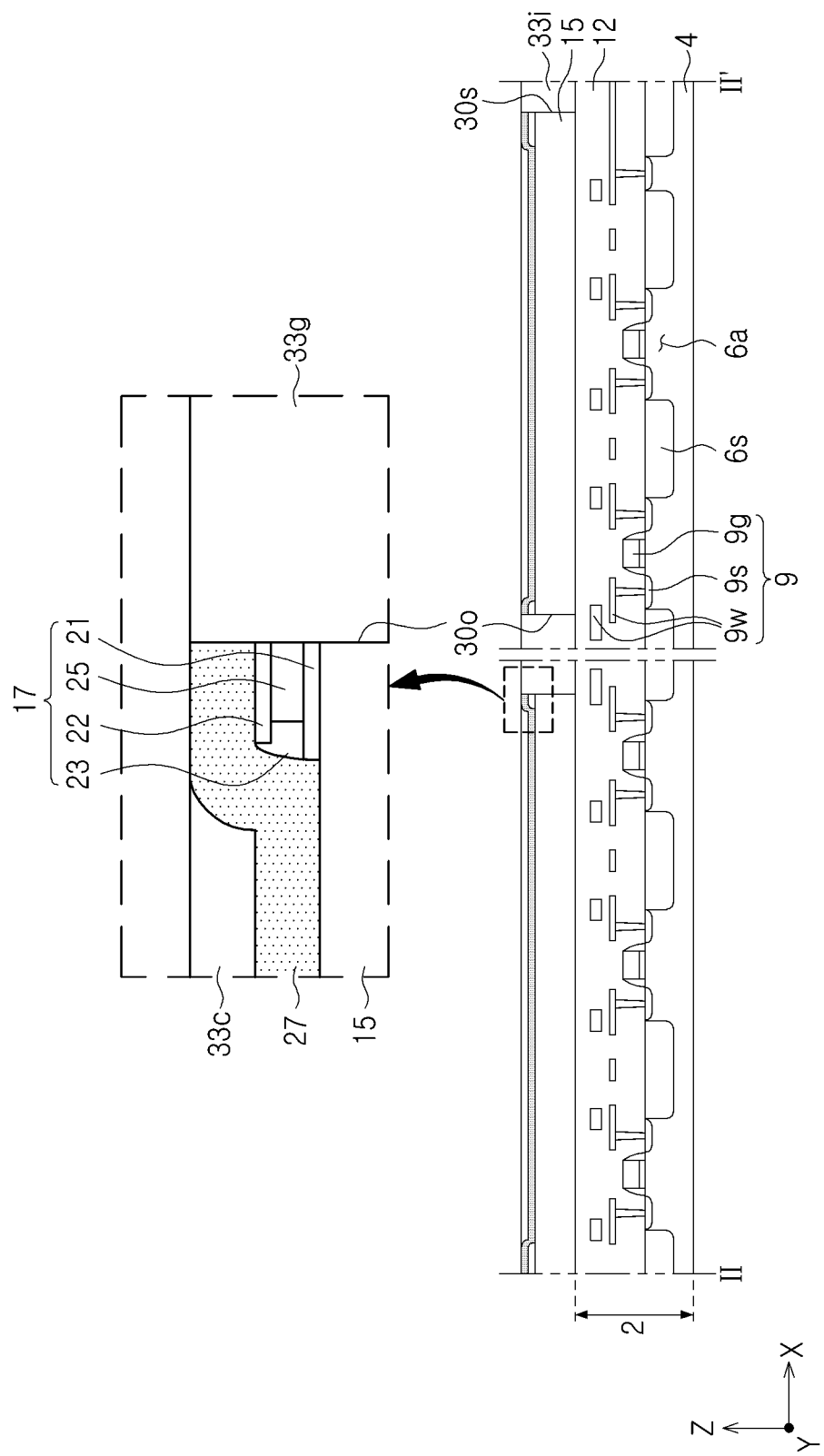

Referring to FIGS. 2A, 22A, and 22B, an upper pattern layer 27 may be formed on the preliminary intermediate pattern 17.

In the upper pattern layer 27, a portion formed in the intermediate opening 17o and contacting the lower pattern layer 15 may be referred to as a first upper pattern portion 27a. In the upper pattern layer 27, an upper surface of the first upper pattern portion 27a may be formed on a lower level than the upper surface of the remaining portion of the upper pattern layer 27.

The upper pattern layer 27 may be formed of silicon. For example, the upper pattern layer 27 may be formed of a doped silicon layer. For example, the upper pattern layer 27 may be formed of a poly silicon layer having N-type conductivity.

The pattern structure 30 may be formed by patterning the lower pattern layer 15, the preliminary intermediate pattern 17, and the upper pattern layer 27.

In an example, the pattern structure 30 may have an opening 30o penetrating through a portion of the pattern structure 30. The opening 30o may penetrate through the lower pattern layer 15, the preliminary intermediate pattern 17 and the upper pattern layer 27 sequentially stacked.

An insulating material covering the pattern structure 30 may be formed, and the insulating material may be planarized to form an intermediate insulating layer 33i, a gap-fill insulating layer 33g, and a capping insulating layer 33c. The intermediate insulating layer 33i may be formed on the outer side surface 30s of the pattern structure 30. The gap-fill insulating layer 33g may be formed in the opening 30o. The capping insulating layer 33c may be formed on the first upper pattern portion 27a of the upper pattern layer 27.

Referring to FIGS. 2A, 23A, and 23B, a preliminary stack structure 36a may be formed on the pattern structure 30. The preliminary stack structures 36a may include preliminary horizontal layers 43a and 50 that are stacked while being spaced apart from each other in the vertical direction Z.

Forming the preliminary stack structure 36a may include forming a preliminary lower stack structure 39a and forming a preliminary upper stack structure 46a on the preliminary lower stack structure 39a.

Forming the preliminary lower stack structure 39a may include forming first lower interlayer insulating layers 41a and preliminary lower horizontal layers 43a that are alternately and repeatedly stacked in the vertical direction Z, patterning the First lower interlayer insulating layers 41a and the preliminary lower horizontal layers 43a to form preliminary lower pads 43p having a staircase structure, and forming a second lower interlayer insulating layers 41b covering the patterned first lower inter layer insulating layers 41a and preliminary lower horizontal layers 43a. The second lower interlayer insulating layer 41b may have a substantially flat upper surface.

Forming the preliminary upper stack structure 46a may include forming first upper interlayer insulating layers 48a and preliminary upper horizontal layers 50 that are alternately and repeatedly stacked in the vertical direction Z, patterning the first upper interlayer insulating layers 48a and the preliminary upper horizontal layers 50 to form preliminary upper pads 50p having a staircase structure, and forming the second upper interlayer insulating layer 48b covering the patterned first upper interlayer insulating layers 48a and preliminary upper horizontal layers 50. The second upper interlayer insulating layer 48b may have a substantially flat upper surface.

In an example, the first and second lower interlayer insulating layers 41a and 41b and the first and second upper interlayer insulating layers 48a and 48b may be formed of the same material as each other, for example, silicon oxide.

In an example, the preliminary lower horizontal layers 43a and the preliminary upper horizontal layers 50 may be formed of the same material.

In an example, the preliminary lower horizontal layers 43a and the preliminary upper horizontal layers 50 may be formed of silicon nitride.

In another example, the preliminary lower horizontal layers 43a and the preliminary upper horizontal layers 50 may be formed of a conductive material. For example, the preliminary lower horizontal layers 43a and the preliminary upper horizontal layers 50 may include at least one of doped silicon, a metal, a metal nitride, and a metal-semiconductor compound.

In an example, on the pattern structure 30, an area of the preliminary stack structure 36a in which the preliminary lower and upper pads 43p and 50p formed of a staircase structure are formed may be defined as a step area SA.

In an example, on the pattern structure 30, an area of the preliminary stack structure 36a adjacent to the step area SA may be defined as a buffer area BA and a memory cell array area MA. The buffer area BA may be defined between the memory cell array area MA and the step area SA.

An insulating pattern 52 penetrating through a portion of the preliminary stack structure 36a may be formed. The insulating pattern 52 may be formed in a line shape. The insulating pattern 52 may be formed of silicon oxide.

A plurality of vertical structures 54 may be formed to penetrate through the preliminary stack structure 36a and contact the pattern structure 30.

The plurality of vertical structures 54 may include vertical memory structures 54m and vertical dummy structures 54d formed in the memory cell array area MA, first and second vertical buffer structures 54b1 and 54b2 formed in the buffer area BA, and vertical support structures 54s formed in the step area SA.

Among the vertical structures 54 formed in the memory cell array area MA, vertical structures spaced apart from the insulating pattern 52 may be defined as the vertical memory structures 54m, and vertical structures in contact with the insulating pattern 52 may be defined as the vertical dummy structures 54d.

Among the vertical structures 54 formed in the buffer area BA, vertical structures penetrating through the first upper pattern portion 27a of the upper pattern layer 27 and extending into the lower pattern layer 15 may be defined as first vertical buffer structures 54b1, and vertical structures penetrating through the upper pattern layer 27 and the preliminary intermediate pattern 17 in turn and extending into the lower pattern layer 15 may be defined as second vertical buffer structures 54b2.

The vertical structures 54 formed in the step area SA may be defined as the vertical support structures 54s.

In an example, the vertical memory structures 54m, the first and second vertical buffer structures 54b1 and 54b2, the vertical dummy structures 54d, and the vertical support structures 54s may be formed simultaneously.

Forming the vertical memory structures 54m, the first and second vertical buffer structures 54b1 and 54b2, the vertical dummy structures 54d, and the vertical support structures 54s may include forming holes 54h penetrating through the preliminary stack structure 36a and extending into the pattern structure 30, sequentially forming a data storage structure 57 and a channel layer 58 covering inner walls of the holes 54h, forming a core region 60 partially filling the respective holes 54h on the channel layer 58, and forming a pad pattern (see pad pattern 62 in FIG. 14) on the core region 60 in the respective holes 54h.

In another example, the vertical memory structures 54m, the first and second vertical buffer structures 54b1 and 54b2, and the vertical dummy structures 54d may be formed simultaneously, and the vertical support structures 54s may be formed before or after forming the vertical memory structures 54m, the first and second vertical buffer structures 54b1 and 54b2, and the vertical dummy structures 54d. When the vertical support structures 54s are formed in a different process from the vertical memory structures 54m, the vertical support structures 54s have a cross-sectional structure different from that of the vertical memory structures 54m.

Referring to FIGS. 2A, 24A, 24B, 24C, and 24D, a first upper insulating layer 66 covering the preliminary stack structure 36a and the plurality of vertical structures 54 may be formed.

A plurality of trenches 69 penetrating through the first upper insulating layer 66 and the preliminary stack structure 36a and extending into the pattern structure 30 may be formed.

Forming the plurality of trenches 69 may include forming preliminary trenches penetrating through the first upper insulating layer 66 and the preliminary stack structure 36a and penetrating through at least a portion of the upper pattern layer 27, forming sacrificial spacers 72 on sidewalls of the preliminary trenches, and etching lower portions of the preliminary trenches to expose at least the second layer 25 of the preliminary intermediate pattern 17.

Depending on the position of the plurality of trenches 69, the depth of the bottom surface may be changed. For example, among the plurality of trenches 69, first trench portions 69a overlapping the preliminary intermediate pattern 17 may have a bottom surface equal to or higher than an upper surface of the lower pattern layer 15. In addition, second trench portions 69b that overlap the first upper pattern portion 27a of the upper pattern layer 27 without overlapping the preliminary intermediate pattern 17 may penetrate through the upper pattern layer 27 to extend into the lower pattern layer 15, and may have the same bottom surface as the upper surface of the lower pattern layer 15 or may have a bottom surface lower than the upper surface of the lower pattern layer 15.

Among the second trench portions 69b, the bottom surface of a trench portion relatively close to the memory cell array area MA may be located on a higher level than the bottom surface of a trench portion remote from the memory cell array area MA.

Figure 25:
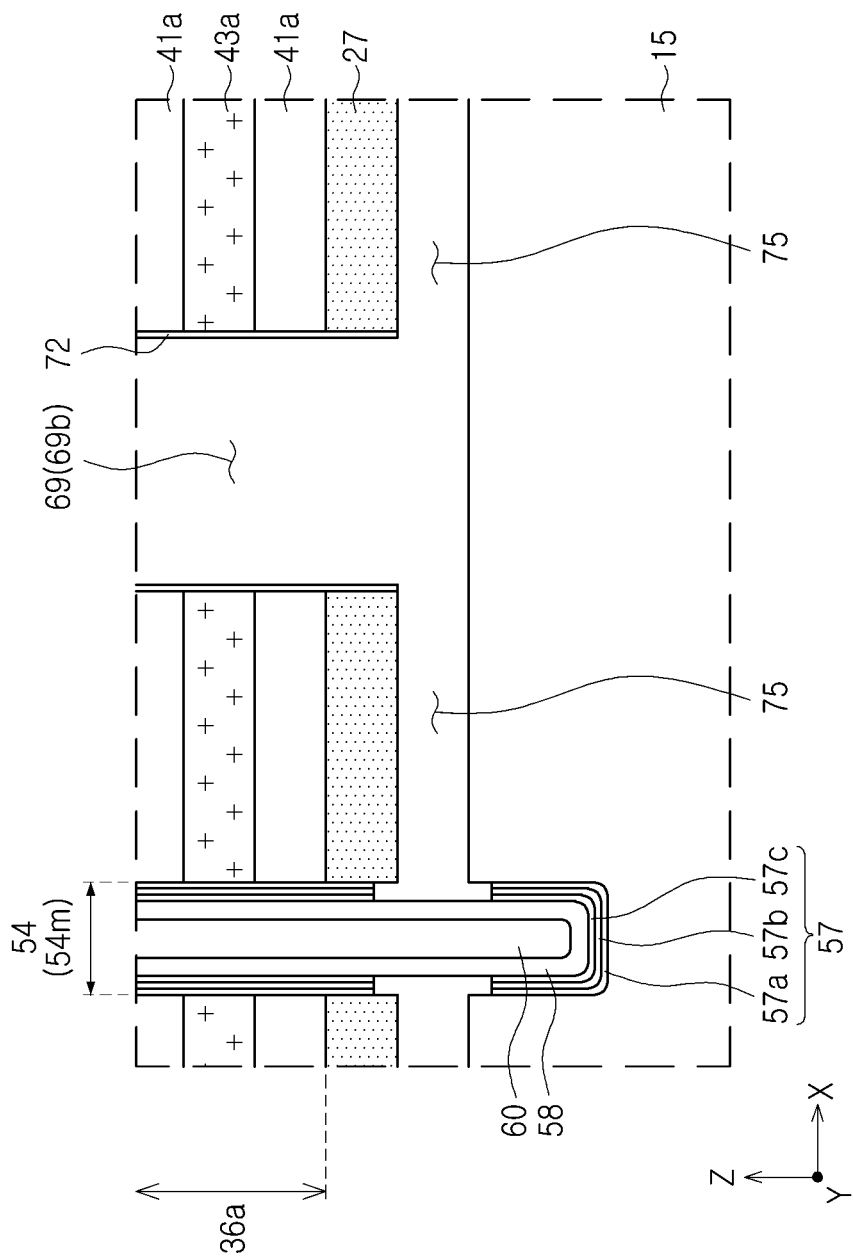

Referring to FIGS. 2A and 25, an opening 75 may be formed by removing the preliminary intermediate pattern 17 exposed by the first trench portions 69a overlapping the preliminary intermediate pattern 17. The channel layer 58 may be exposed by etching the vertical memory structures 54m, the vertical dummy structures 54d, and the data storage structure 57 of the second vertical buffer structures 54b2 while forming the opening 75.

The removal of the preliminary intermediate pattern 17 exposed by the first trench portions 69a, using an etching process, may be performed, when the second layer 25 is formed of silicon nitride, by etching the second layer 25 using an etching solution containing phosphoric acid to expose the data storage structure 57 of the second vertical buffer structures 54b2 and the vertical memory structures 54m, etching the exposed data storage structure 57 of the second vertical buffer structures 54b2 and the vertical memory structures 54m to expose the channel layer 58 of the vertical memory structures 54m and the second vertical buffer structures 54b2, and simultaneously therewith, etching and removing the first and third layers 21 and 22 and the spacer layer 23.

While the preliminary intermediate pattern 17 exposed by the first trench portions 69a is removed by an etching process, the sacrificial spacers 72 may prevent the preliminary stack structure 36a from being damaged due to the etching process.

In an example embodiment, among the preliminary intermediate patterns 17, the preliminary intermediate pattern not exposed by the first trench portions 69a may be defined as an intermediate structure 17a. In the preliminary intermediate pattern 17, the first layer 21 may be referred to as a lower layer, the second layer 25 may be referred to as a second intermediate layer, and the third layer 22 may be referred to as an upper layer.

The intermediate structure 17a may include the lower layer 21, the second intermediate layer 25, the upper layer 22, and the spacer layer 23. In the intermediate structure 17a, the lower layer 21, the upper layer 22, and the spacer layer 23 may constitute the first intermediate layer 20.

Figure 26:
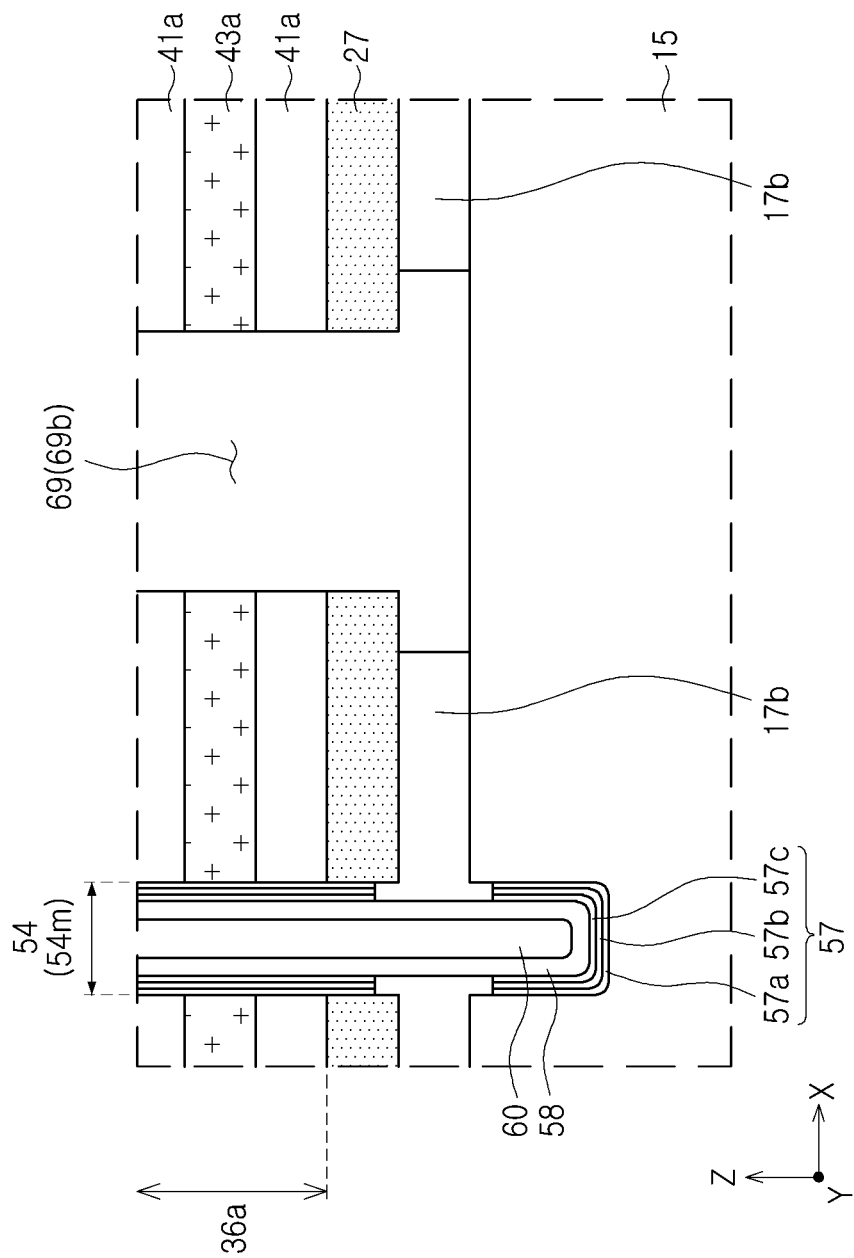

Referring to FIGS. 2A and 26, an intermediate pattern layer 17b may be formed in the opening 75. The intermediate pattern layer 17b may be formed of doped silicon, for example, polysilicon having N-type conductivity.

The sacrificial spacers 72 may be removed.

Figure 27:
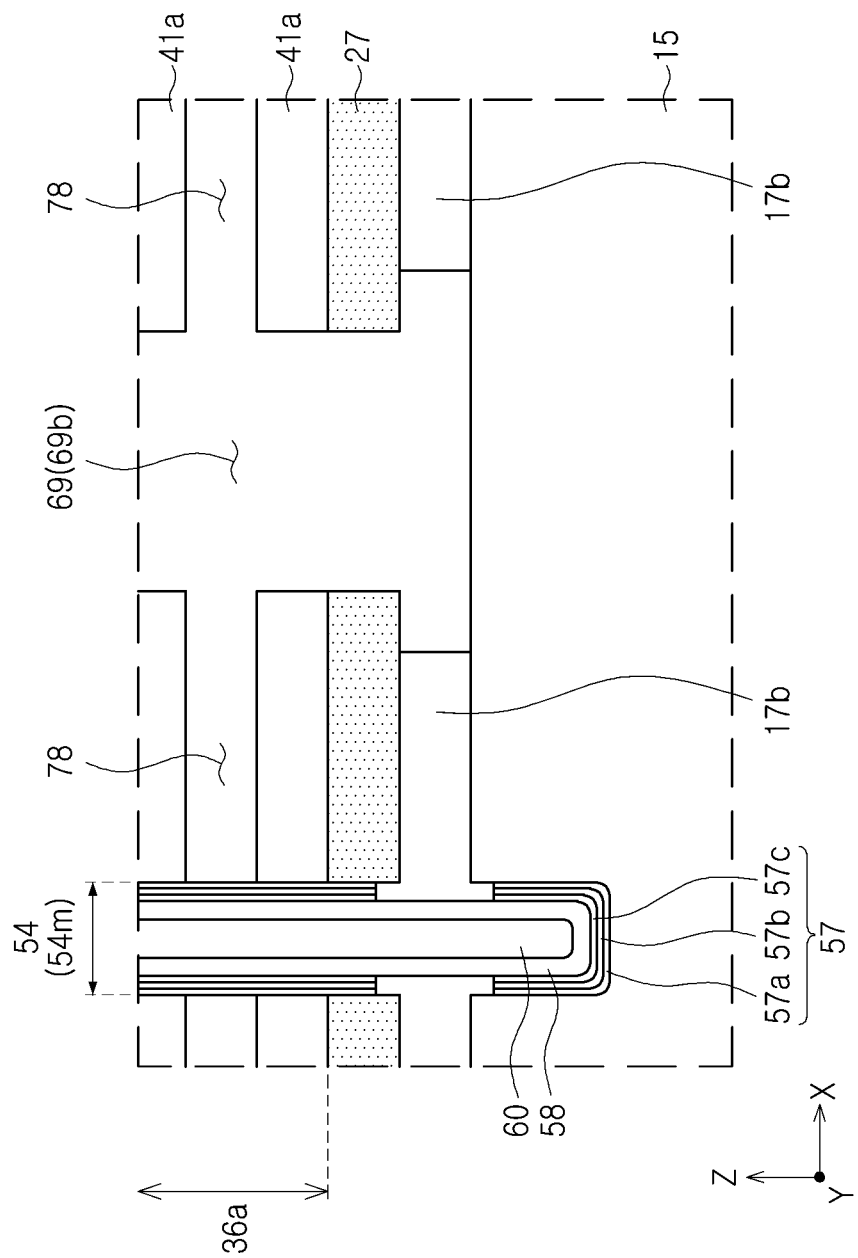

Referring to FIGS. 2A and 27, openings 78 may be formed by removing the preliminary lower and upper horizontal layers 43a and 50 exposed by the plurality of trenches 69. The openings 75 may expose side surfaces of the vertical structures 54.

Figure 28:
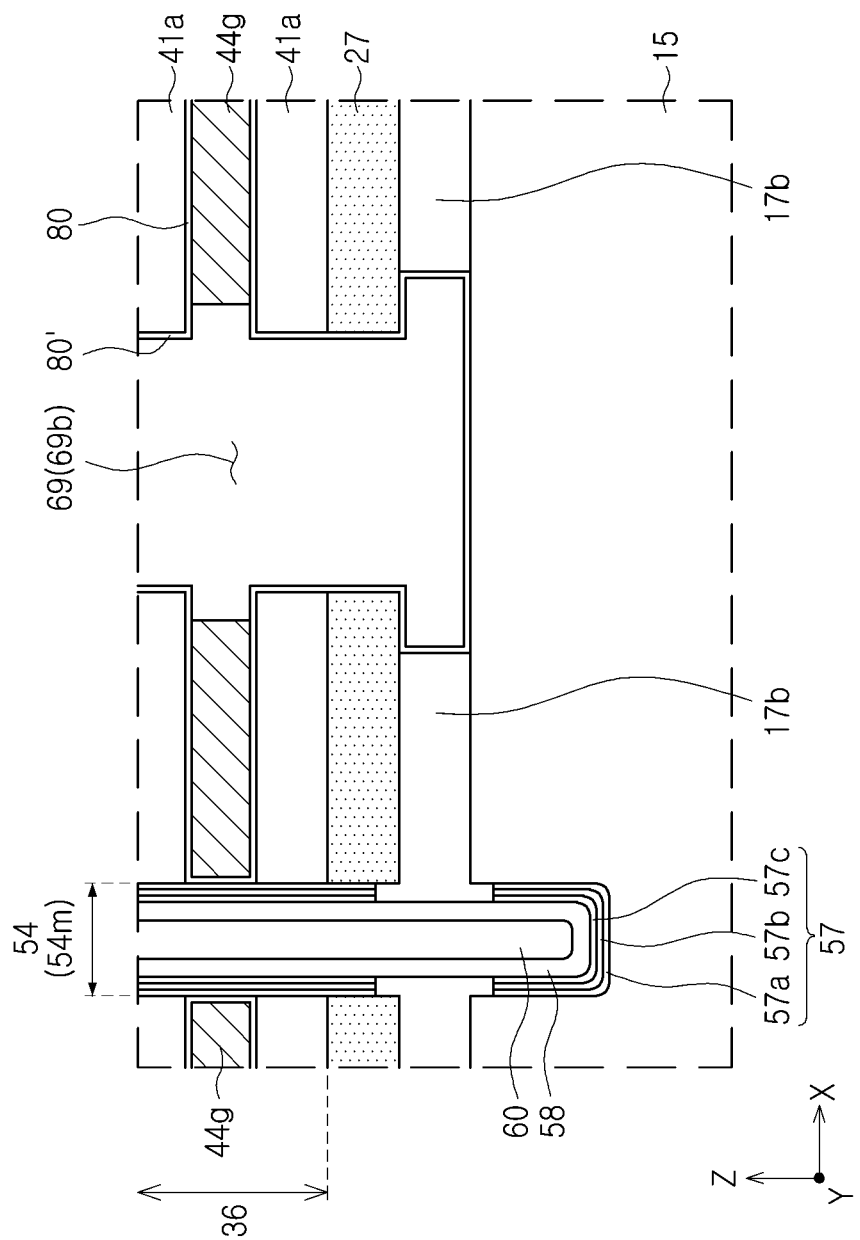

Referring to FIGS. 2A and 28, horizontal layers 44g and 51g may be formed in the openings 75. Among the horizontal layers 44g and 51g, horizontal layers formed in the openings in which the preliminary lower horizontal layers 43a have been removed may be referred to as lower horizontal layers 44g, and horizontal layers formed in the openings in which the preliminary upper horizontal layers 50 have been removed may be referred to as upper horizontal layers 51g. The lower horizontal layers 44g may have lower pads 44p corresponding to the preliminary lower pads 43p, and the upper horizontal layers 51g may have upper pads 51p corresponding to the preliminary upper pads 50p.

The preliminary lower stack structure 39a may be formed as a lower stack structure 39 including the lower horizontal layers 44g, and the preliminary upper stack structure 46a may be formed as an upper stack structure 46 including the upper horizontal layers 51g. Accordingly, the preliminary stack structure 36a may be formed as a stack structure 36 including the lower and upper stack structures 39 and 46.

The horizontal layers 44g and 51g may be formed of one or a plurality of conductive materials. For example, the horizontal layers 44g and 51g may include at least one of doped silicon, metal nitride (e.g., TiN), a metal (e.g., W), and a metal-semiconductor compound (e.g., TiSi or WSi).

In an example, before forming the horizontal layers 44g and 51g, a dielectric layer 80 may be formed to extend to sidewalls of the plurality of trenches 69 while covering the inner walls of the openings 75. The dielectric layer 80 may be a high-k dielectric.

Referring again to FIGS. 2A to 14, a plurality of separation structures 86 filling the plurality of trenches 69 may be formed, in an example, the plurality of separation structures 86 may be formed of an insulating material. For example, the plurality of separation structures 86 may be formed of silicon oxide. A second upper insulating layer 89 may be firmed on the first upper insulating layer 66. Subsequently, a plug and wiring process may be performed. For example, the gate contact plugs 92g as in FIG. 4, the bit line contact plugs 92b as in FIGS. 12 and 14, and the bit line BL as in FIG. 14 may be formed.

According to example embodiments, since the spacer layer 23 may be formed to ensure a constant thickness, the spacer layer 23 may prevent the upper pattern layer 27 from being etched and damaged by etching by an etching process (refer to FIG. 25) of etching the second layer 25. Accordingly, the spacer layer 23 may prevent an etching solution for etching the second layer 25 from penetrating to a lowest preliminary lower horizontal layer 43a among the preliminary lower horizontal layers 43a while etching and damaging the upper horizontal layer 27 and from etching and damaging the lowermost preliminary lower horizontal layer. Therefore, since etching damage of the lowest preliminary lower horizontal layer may be prevented, the lowest preliminary lower horizontal layer 44g formed by replacing the lowermost preliminary lower horizontal layer may be reliably formed without defects. Accordingly, the reliability of the semiconductor device may be improved.

In the above-described embodiments, the peripheral circuit 9 is described as being disposed below the pattern structure 30, but the technical spirit of the present inventive concept is not limited thereto. For example, in the semiconductor device according to example embodiments of the present inventive concept, rather than forming the lower structure 2 described above, the lower pattern layer 15 may be formed as a substrate silicon layer, and the peripheral circuit 9 may be formed on the lower pattern layer 15 not overlapping the stack structure 36.

As set forth above, according to example embodiments, since a stack structure including gate layers stacked in a vertical direction and vertical structures penetrating through the stack structure may be provided, the integration of the semiconductor device may be improved.

According to example embodiments, a pattern structure including a lower pattern layer, an upper pattern layer, and an intermediate pattern layer and an intermediate structure spaced apart from each other between the lower pattern layer and the upper pattern layer may be provided. Among the vertical structures, a vertical memory structure may contact the intermediate pattern layer, and may be spaced apart from the intermediate structure. Gate layers of the stack structure formed on the pattern structure may be formed more stably and reliably without defects. Therefore, the reliability of the semiconductor device may be improved.

While example embodiments have been illustrated and described above, it will be apparent to those skilled in the art that modifications and variations could be made without departing from the scope of the present inventive concept as defined by the appended claims.

What is claimed is:
1. A semiconductor device comprising:
   a pattern structure;
   a stack structure on the pattern structure, the stack structure including gate layers and interlayer insulating layers alternately stacked in a vertical direction; and a plurality of vertical structures penetrating through the stack structure in the vertical direction and in contact with the pattern structure, wherein the pattern structure includes a lower pattern layer, an intermediate pattern layer on the lower pattern layer, and an upper pattern layer on the intermediate pattern layer, wherein the plurality of vertical structures include a vertical memory structure penetrating through the upper pattern layer and the intermediate pattern layer and extending into the lower pattern layer, wherein the intermediate pattern layer includes a first portion, a second portion extending from the first portion and having a decreased thickness, and a third portion extending from the first portion, having an increased thickness, and contacting the vertical memory structure, and wherein the second portion of the intermediate pattern layer has a side surface that is curved convexly from an upper surface of the first portion of the intermediate pattern layer toward the lower pattern layer and that contacts the upper pattern layer.

2. The semiconductor device of claim 1,
wherein the vertical memory structure comprises:
 a core region;
 a channel layer on a side surface and a bottom surface of the core region; and
 a data storage structure on an outer surface and a bottom surface of the channel layer,
wherein the data storage structure includes a first dielectric layer, a second dielectric layer, and a data storage layer between the first dielectric layer and the second dielectric layer,
wherein the third portion of the intermediate pattern layer is in contact with the channel layer, and
wherein a maximum width of the second portion of the intermediate pattern layer in a horizontal direction is greater than a thickness of the data storage layer in the horizontal direction, facing the gate layers.

3. The semiconductor device of claim 1,
wherein the vertical memory structure comprises:
 a core region;
 a channel layer on a side surface and a bottom surface of the core region; and
 a data storage structure on an outer surface and a bottom surface of the channel layer,
wherein the data storage structure includes a first dielectric layer, a second dielectric layer, and a data storage layer between the first dielectric layer and the second dielectric layer,
wherein the third portion of the intermediate pattern layer is in contact with the channel layer, and
wherein a maximum width of the second portion of the intermediate pattern layer in a horizontal direction is greater than a thickness of the channel layer in the horizontal direction, facing the gate layers.

4. The semiconductor device of claim 1,
wherein the intermediate pattern layer further comprises a protruding portion extending between the lower pattern layer and the upper pattern layer from a lower region of the second portion, and
wherein the protruding portion comprises a surface extending at a gentler slope than the side surface of the second portion.

5. The semiconductor device of claim 4, wherein a bottom surface of the protruding portion is at a lower level than a bottom surface of the first portion.

6. The semiconductor device of claim 1, wherein in the intermediate pattern layer, the second portion comprises a lower side surface, an upper side surface, and a recessed portion recessed between the upper side surface and the lower side surface toward an interior of the intermediate pattern layer.

7. The semiconductor device of claim 1,
wherein the pattern structure further comprises an intermediate structure spaced apart from the intermediate pattern layer, on the lower pattern layer,
wherein the intermediate structure includes a material different from a material of the intermediate pattern layer,
wherein the upper pattern layer includes,
 a first upper pattern portion in contact with the lower pattern layer;
 a second upper pattern portion in contact with the intermediate structure; and
 a third upper pattern portion in contact with the intermediate pattern layer, and
wherein the vertical memory structure is spaced apart from the intermediate structure.

8. The semiconductor device of claim 7,
wherein the plurality of vertical structures further comprises:
 a vertical support structure penetrating through the upper pattern portion and the intermediate structure and extending into the lower pattern layer; and
 a vertical buffer structure penetrating through the first upper pattern portion and extending into the lower pattern layer, and
wherein the vertical buffer structure is spaced apart from the intermediate pattern layer and the intermediate structure.

9. The semiconductor device of claim 1,
wherein the intermediate pattern layer includes a first polysilicon layer,
wherein the upper pattern layer includes a second polysilicon layer, and
wherein the upper pattern layer contacts the upper surface of the first portion and the side surface of the second portion.

10. A semiconductor device comprising:
a pattern structure;
a stack structure on the pattern structure, the stack structure including gate layers and interlayer insulating layers alternately stacked in a vertical direction; and
a plurality of vertical structures penetrating through the stack structure in the vertical direction and in contact with the pattern structure,
wherein the pattern structure comprises,
 a lower pattern layer;
 an upper pattern layer on the lower pattern layer; and
 an intermediate structure and an intermediate pattern layer spaced apart from each other and including different materials, the intermediate structure and the intermediate pattern layer being between the lower pattern layer and the upper pattern layer,
wherein the intermediate structure comprises a first intermediate layer and a second intermediate layer,
wherein the first intermediate layer includes:
 a lower portion between a lower surface of the second intermediate layer and the lower pattern layer;
 an upper portion between an upper surface of the second intermediate layer and the upper pattern layer; and a side portion between a first side surface of the second intermediate layer and the upper pattern layer, wherein the second intermediate layer comprises a material different from a material of the first intermediate layer, and wherein a maximum width of the side portion of the first intermediate layer in a horizontal direction is greater than a thickness of the lower portion of the first intermediate layer in the vertical direction.

11. The semiconductor device of claim 10, wherein a thickness of the upper portion of the first intermediate layer in the vertical direction is greater than a thickness of the lower portion of the first intermediate layer in the vertical direction.

12. The semiconductor device of claim 10,
wherein the plurality of vertical structures comprises a vertical memory structure that is in contact with the intermediate pattern layer and is spaced apart from the intermediate structure,
wherein the vertical memory structure includes a core region, a channel layer on a side surface and a bottom surface of the core region, and a data storage structure on an outer surface and a bottom surface of the channel layer,
wherein the data storage structure comprises a first dielectric layer, a second dielectric layer, and a data storage layer between the first dielectric layer and the second dielectric layer, and
wherein the maximum width of the side portion of the first intermediate layer in the horizontal direction is greater than a thickness of the data storage layer facing the gate layers, in the horizontal direction.

13. The semiconductor device of claim 10,
wherein the plurality of vertical structures comprises:
a vertical memory structure penetrating through the upper pattern layer and the intermediate pattern layer and extending into the lower pattern layer; and
a vertical support structure penetrating through the upper pattern layer and the intermediate structure and extending into the lower pattern layer,
wherein the intermediate pattern layer comprises a first portion, a second portion extending from the first portion and decreasing in thickness, and a third portion extending from the first portion, increasing in thickness, and contacting the vertical memory structure, and
wherein a thickness of the first portion of the intermediate pattern layer is greater than a thickness of the intermediate structure.

14. A semiconductor device comprising:
a pattern structure;
an insulating layer on a side surface of the pattern structure;
a stack structure on the pattern structure, the stack structure including gate layers and interlayer insulating layers alternately stacked in a vertical direction;
separation structures penetrating through the stack structure; and
a plurality of vertical structures, penetrating through the stack structure in the vertical direction, and in contact with the pattern structure, between the separation structures,
wherein the pattern structure includes,
a lower pattern layer;
an upper pattern layer on the lower pattern layer; and
an intermediate structure and an intermediate pattern layer spaced apart from each other and including different materials, the intermediate structure and the intermediate pattern layer being between the lower pattern layer and the upper pattern layer,
wherein the intermediate structure has a first side surface contacting the upper pattern layer and a second side surface contacting the insulating layer, and
wherein in the intermediate structure, the first side surface and the second side surface have an asymmetrical structure.

15. The semiconductor device of claim 14, wherein in the intermediate structure, the first side surface is curved convexly from an upper surface of the intermediate structure, and the second side surface is curved steeper than the first side surface from the upper surface of the intermediate structure.

16. The semiconductor device of claim 14, further comprising:
a lower structure; and
a bit line,
wherein the lower structure includes a substrate, a peripheral circuit on the substrate, and a lower insulating layer disposed on the substrate and covering the peripheral circuit,
wherein the pattern structure is disposed on the lower structure,
wherein the separation structures comprise,
main separation structures penetrating through a memory cell array area and a step area; and
auxiliary separation structures disposed in the step area, between the main separation structures, and
wherein the upper pattern layer comprises a first upper pattern portion, a second upper pattern portion, and a third upper pattern portion,
wherein the first upper pattern portion does not overlap the intermediate structure and the intermediate pattern layer,
wherein the second upper pattern portion overlaps the intermediate structure,
wherein the third upper pattern portion overlaps the intermediate pattern layer,
wherein the stack structure comprises pads of the gate layers arranged in a staircase shape in the step area,
wherein of each of the main separation structures, a portion located in the memory cell array area has a bottom surface at a first height level, and
wherein of each of the main separation structures and the auxiliary separation structures, a portion located in the step area has a bottom surface at a second height level lower than the first height level.

17. The semiconductor device of claim 16,
wherein the separation structures extend in a first horizontal direction, and
wherein the first upper pattern portion comprises a first line portion extending in a second horizontal direction perpendicular to the first horizontal direction, and second line portions extending from the first line portion in the first horizontal direction.

18. The semiconductor device of claim 17, wherein in the step area, the main separation structures and the auxiliary separation structures penetrate through the second line portions of the first upper pattern portion and are spaced apart from the intermediate structure.

19. The semiconductor device of claim 17,
wherein the first line portion of the first upper pattern portion is disposed in a buffer region between the memory cell array area and the step area, and
wherein the plurality of vertical structures further comprises:

a vertical buffer structure penetrating through the first line portion of the first upper pattern portion in the buffer region; and a vertical support structure spaced apart from the second line portions of the first upper pattern portion, in the step area.

20. The semiconductor device of claim 19, wherein the third upper pattern portion further comprises a third line portion extending in the second horizontal direction, wherein the third line portion is connected to the second line portions, wherein the first line portion overlaps the stack structure, and wherein the third line portion does not overlap the stack structure.

* * * * *